US008729593B2

United States Patent
Nakamura et al.

(10) Patent No.: US 8,729,593 B2
(45) Date of Patent: May 20, 2014

(54) SUBSTRATE WITH WAVY SURFACE TO CONTROL SPECULAR VISIBILITY FOR ELECTRONIC DEVICE AND ELECTRONIC DEVICE USING SAME

(75) Inventors: Nobuhiro Nakamura, Tokyo (JP); Nao Ishibashi, Tokyo (JP)

(73) Assignee: Asahi Glass Company, Limited, Tokyo (JP)

( * ) Notice: Subject to any disclaimer, the term of this patent is extended or adjusted under 35 U.S.C. 154(b) by 0 days.

(21) Appl. No.: 13/137,159

(22) Filed: Jul. 25, 2011

(65) Prior Publication Data

US 2012/0025245 A1  Feb. 2, 2012

Related U.S. Application Data

(63) Continuation of application No. PCT/JP2010/050729, filed on Jan. 21, 2010.

(30) Foreign Application Priority Data

Jan. 26, 2009  (JP) ................................ P2009-014794

(51) Int. Cl.
*H01L 33/00* (2010.01)
*H01L 51/52* (2006.01)

(52) U.S. Cl.
CPC ..................................... *H01L 51/52* (2013.01)
USPC ..................................... 257/99; 257/E51.019

(58) Field of Classification Search
CPC ....................................................... H01L 51/52
USPC ............................................ 257/E51.019, 99
See application file for complete search history.

(56) References Cited

U.S. PATENT DOCUMENTS

| 2004/0227462 A1* | 11/2004 | Utsumi et al. ................ 313/506 |
| 2005/0007000 A1 | 1/2005 | Chou et al. |
| 2008/0039309 A1 | 2/2008 | Wolff et al. |

FOREIGN PATENT DOCUMENTS

| CN | 1575064 A | 2/2005 |
| CN | 1735970 A | 2/2006 |
| EP | 2 278 852 A1 | 1/2011 |

(Continued)

OTHER PUBLICATIONS

The Machine translation of the Applicant's IDS reference JP-2005-038681.*

(Continued)

*Primary Examiner* — Kimberly Rizkallah
*Assistant Examiner* — Alexander Belousov
(74) *Attorney, Agent, or Firm* — Foley & Lardner LLP

(57) ABSTRACT

Provided is an electronic device having a long life and a large effective area. Furthermore, provided is an optical device capable of controlling specular visibility. And provided is a substrate for the optical device, which includes a scattering layer having excellent scattering properties and having a desired refractive index while retaining surface smoothness. Further, there is provided a substrate for the electronic device, which includes a substrate having first and second main surfaces facing each other and an electrode pattern formed on the first main surface of the substrate, in which the first main surface of the first and second main surfaces is a surface which forms waviness made up of curved faces, the waviness of the surface has a wavelength R$\lambda$a of greater than 50 μm and a ratio Ra/R$\lambda$a of waviness roughness Ra of the surface which forms waviness to the wavelength R$\lambda$a of the waviness is from $1.0\times10^{-4}$ to $3.0\times10^{-2}$.

5 Claims, 32 Drawing Sheets

(56) References Cited

FOREIGN PATENT DOCUMENTS

| | | |
|---|---|---|
| JP | 09-115667 A | 5/1997 |
| JP | 2931211 B2 | 5/1999 |
| JP | 2004-513483 A | 4/2004 |
| JP | 2004-342521 A | 12/2004 |
| JP | 2004-342522 A | 12/2004 |
| JP | 2005-038681 A | 2/2005 |
| JP | 2005-063704 A | 3/2005 |
| JP | 2005-190838 A | 7/2005 |
| JP | 2006-222028 A | 8/2006 |
| JP | 2006-331694 A | 12/2006 |
| JP | A-2008-044837 | 2/2008 |
| WO | WO 02/37568 A1 | 5/2002 |
| WO | WO 2009/017035 A1 | 2/2009 |
| WO | WO 2009/060916 A1 | 5/2009 |
| WO | WO 2009/116531 A1 | 9/2009 |

OTHER PUBLICATIONS

International Search Report dated Apr. 27, 2010, in PCT/JP2010/050729.
Office Action for Chinese Application No. 2010-547515 dated Oct. 15, 2013 (first page only).
Office Action for Japanese Application No. 2010-547515 dated Oct. 15, 2013 (first page only).
Extended European Search Report issued on Dec. 11, 2013 in the corresponding European Patent Application.

* cited by examiner

SUBSTRATE WITH WAVY SURFACE TO CONTROL SPECULAR VISIBILITY FOR ELECTRONIC DEVICE AND ELECTRONIC DEVICE USING SAME

TECHNICAL FIELD

The present invention relates to a substrate for an electronic device and an electronic device using the same, and particularly relates to a substrate for an electronic device such as an organic LED (Organic Light Emitting Diode).

BACKGROUND ART

An organic LED element is one in which an organic layer is put between electrodes, and a voltage is applied between the electrodes to inject holes and electrons, which are allowed to be recombined in the organic layer, thereby extracting light that a light-emitting molecule emits in the course of transition from an excited state to a ground state, and has been used for display, backlight and lighting applications.

The refractive index of the organic layer is from about 1.8 to about 2.1 at 430 nm. On the other hand, the refractive index, for example, at the time when ITO (indium tin oxide) is used as a translucent electrode layer is generally from about 1.9 to about 2.1, although it varies depending on the ITO film-forming conditions or composition (Sn—In ratio). Like this, the organic layer and the translucent electrode layer are close to each other in refractive index, so that emitted light reaches an interface between the translucent electrode layer and a translucent substrate without totally reflecting between the organic layer and the translucent electrode layer. A glass or resin substrate is usually used as the translucent substrate, and the refractive index thereof is from about 1.5 to about 1.6, which is lower in the refractive index than the organic layer or the translucent electrode layer. Considering Snell's law, light which tries to enter the glass substrate at a shallow angle is reflected by total reflection in an organic layer direction, and reflected again at a reflective electrode to reach the interface of the glass substrate again. At this time, the incident angle to the glass substrate does not vary, so that reflection is repeated in the organic layer and the translucent electrode layer to fail to extract the light from the glass substrate to the outside. According to an approximate estimate, it is known that about 60% of the emitted light cannot be extracted by this mode (organic layer-translucent electrode layer propagation mode). The same also occurs at an interface between the substrate and the air, whereby about 20% of the emitted light propagates in the glass and fails to be extracted (substrate propagation mode). Accordingly, the amount of the light which can be extracted to the outside of the organic LED element is less than 20% of the emitted light in the present circumstances.

On the other hand, Patent Document 1 has proposed a structure having on one side of a substrate a light-scattering layer as a semi-translucent material layer (in paragraphs 0039 to 0040). Further (in paragraph 0070), the document has proposed e.g. a structure having a light-scattering region provided between a substrate and an organic LED element by placing glass particles in an aggregate pattern on the substrate surface and sticking them to the substrate surface by the use of an acrylic adhesive.

By providing such a light-scattering region, the reflective electrode surface is not visually recognized as a mirror-like surface, and the outward appearance thereof is improved.

On the other hand, when the scattering ability is lowered or the light-scattering region is not provided, the reflective electrode is visually recognized as a mirror surface, and probably has undesirable outward appearance.

Alternatively, there is a case where a glass substrate formed by the float process is used in an organic LED element. In this case, the substrate tends to suffer waviness resulting from waves caused in a fused metal bath, contact with rolls for conveyance of a glass ribbon, variation of temperature in a cooling process and so on. Therefore, it has been known to mechanically polishing the substrate surface for the purpose of achieving flatness. However, the polished glass substrate suffers fine polishing scratches formed on the surface, and these scratches become a cause of a short-circuit occurring between an anode and a cathode.

Therefore the organic LED element designed to form an electrode on an surface having waviness has been proposed (Patent Document 2).

BACKGROUND ART DOCUMENT

Patent Documents

Patent Document 1: Japanese Patent No. 2931211
Patent Document 2: JP-A-2005-190838

SUMMARY OF THE INVENTION

Problems that the Invention is to Solve

However, both the patent documents are silent on pitches of waviness and flatness (arithmetic average roughness) of the substrate surface. Therefore they have a problem of being incapable of sufficiently controlling specular visibility and giving undesirable outward appearance.

The invention focuses attention on waviness of a substrate surface and aims to provide an optical device capable of controlling the specular visibility.

Means for Solving the Problems

Therefore the invention includes a substrate for an electronic device comprising: a substrate having first and second main surfaces facing each other; and an electrode pattern formed on the first main surface of the substrate, wherein the first main surface is a surface which forms waviness made up of curved faces, the waviness of the surface has a wavelength R$\lambda$a of greater than 50 μm, and a ratio Ra/R$\lambda$a of waviness roughness Ra of the surface which forms waviness to the wavelength R$\lambda$a of the waviness is from $1.0 \times 10^{-4}$ to $3.0 \times 10^{-2}$.

According to this constitution, the waviness of the surface makes it possible to control specular visibility. In addition, by defining the waviness wavelength and roughness so as to fall within the foregoing ranges, a short circuit between electrodes of the electronic device formed on the surface is suppressed, and it becomes possible to provide an electronic device having a long life and a large effective area.

Further, the invention includes the substrate for an electronic device as described above, wherein the substrate has a glass substrate and a glass layer formed on a first main surface of the glass substrate, the glass layer has a second surface abutting on the first main surface side of the glass substrate and a first surface opposite to the second surface, and the first surface is a surface which forms waviness made up of curved faces.

According to this constitution, a scattering layer can be made from glass, and thereby stability and high strength can be achieved and, without increasing the substrate thickness, it becomes possible to provide a translucent substrate superior in scattering property to primary translucent substrates made with glass.

Furthermore, the invention includes the substrate for an electronic device as described above, wherein an organic LED element is formed on the first main surface.

The organic LED element is an element which can emit light when a voltage is applied to an organic layer sandwiched between electrodes, and therefore local variations in distance between electrodes tend to cause deterioration of the organic layer through the electric field concentration. According to the foregoing constitution, however, it becomes possible to reduce the local variations in distance between electrodes.

The invention also includes the substrate for an electronic device as described above, wherein the second main surface is flatter than the first main surface.

According to this constitution, it is possible to prevent reflected images from appearing deformed when viewed from the second main surface side during no emission of light. By designing the first main surface of the substrate to be a surface which forms waviness made up of curved faces and the second main surface to be made flatter than the first main surface, in an element-packaging process including e.g. steps of mounting the substrate on which the element has been formed on a basic board, coating the periphery with a sealant, thereon overlaying a sealing substrate and subjecting the sealant to curing, it becomes possible to attain sufficient adhesion because the surface to which the sealant on the basic board should adhere is flat.

In another case where the substrate has a glass substrate and a glass layer formed on the first main surface of the glass substrate, and besides, the second surface abutting on the first main surface of the glass substrate is flatter than the first surface opposite to the second surface, when the periphery of the glass substrate on which no glass layer (scattering layer) has been formed is coated with a sealant and thereon a sealing substrate is overlaid and subjected to curing, sufficient adhesion can also be attained because the portion of the glass substrate surface to which the sealant should adhere is flat. More specifically, in the case where the substrate has a glass substrate and a glass layer having waviness, by not providing the glass layer having waviness on the portion of the glass substrate surface on which a sealing substrate is overlaid and a seal is formed, it is possible to secure a flat surface for the portion of the glass substrate surface to which a sealant should adhere, whereby sufficient adhesion can be attained.

The invention also includes the substrate for an electronic device as described above, wherein the surface which forms waviness has a surface roughness Ra of 30 nm or below.

The present electronic device comprises a substrate having first and second main surfaces facing each other in which at least the first main surface is a surface which forms waviness made up of curved faces, a first electrode formed on the surface of the substrate, a functional layer formed as an upper layer of the first electrode, and a second electrode formed as an upper layer of the functional layer, wherein a ratio Ra/Rλa of the waviness roughness Ra of the surface which forms waviness to the waviness wavelength Rλa of the waviness is from $1.0 \times 10^{-4}$ to $3.0 \times 10^{-2}$.

The invention also includes the electronic device as described above, wherein the substrate comprises a glass substrate, a second surface abutting on the first main surface side of the glass substrate and a first surface opposite to the second surface, and the first surface is a surface which forms waviness made up of curved faces.

The invention also includes the electronic device as described above, wherein the surface which forms waviness has a surface roughness Ra of 30 nm or below.

The invention also includes an electronic device using the substrate for electronic device as described above, wherein the glass substrate is a translucent glass substrate; the electronic device further comprises a scattering layer formed on the glass substrate and made from a glass comprising a base material which has a first refractive index for at least one of wavelengths of transmitted light and a plurality of scattering materials being dispersed in the base material and having a second refractive index different from the first refractive index of the base material; and distribution of the scattering materials in the scattering layer diminishes from the inside of the scattering layer toward a translucent electrode as the first electrode.

The invention also includes the electronic device as described above, wherein the first electrode is formed on the scattering layer and is a translucent electrode having a third refractive index equal to or lower than the first refractive index.

The invention also includes the electronic device as described above, wherein a density $\rho_3$ of the scattering materials at a distance x ($x \leq 0.2$ μm) from a surface of the scattering layer on a translucent electrode side and a density $\rho_4$ of the scattering materials at a distance x of 2 μm satisfy $\rho_4 > \rho_3$.

The invention also includes the electronic device as described above, wherein the scattering layer contains, in terms of mol %, from 15 to 30% of $P_2O_5$, from 0 to 15% of $SiO_2$, from 0 to 18% of $B_2O_3$, from 5 to 40% of $Nb_2O_5$, from 0 to 15% of $TiO_2$, from 0 to 50% of $WO_3$, from 0 to 30% of $Bi_2O_3$, provided that $Nb_2O_5+TiO_2+WO_3+Bi_2O_3$ is from 20 to 60%, from 0 to 20% of $Li_2O$, from 0 to 20% of $Na_2O$, from 0 to 20% of $K_2O$, provided that $Li_2O+Na_2O+K_2O$ is from 5 to 40%, from 0 to 10% of MgO, from 0 to 10% of CaO, from 0 to 10% of SrO, from 0 to 20% of BaO, from 0 to 20% of ZnO and from 0 to 10% of $Ta_2O_5$.

The invention also includes the electronic device as described above, wherein the scattering layer is formed on the translucent substrate and comprises a base material having a first refractive index for at least one wavelength of wavelengths of emitted light of an LED element and a plurality of scattering materials being positioned inside of the base material and having a second refractive index different from the first refractive index of the base material, and wherein the electronic device further comprises: a translucent electrode as the first electrode which is formed on the scattering layer and has a third refractive index equal to or lower than the first refractive index for the wavelength specified above; a layer which is formed on the translucent electrode and has a photoelectric conversion function; and a reflective electrode as the second electrode formed on the layer having a photoelectric conversion function.

The invention also includes the electronic device as described above, wherein the layer having a photoelectric conversion function is a layer having a light emission function.

The invention also includes the electronic device as described above, wherein the layer having a photoelectric conversion function is a layer having a light detection function.

The invention also includes the electronic device as described above, wherein the layer having a photoelectric conversion function is a layer having an electric-power generation function.

The invention also includes the electronic device as described above, wherein the layer having a photoelectric conversion function is a dielectric layer.

The terms "waviness roughness Ra" and "average waviness wavelength Rλa" used herein are values calculated under the JIS B0601 standard (2001) (a translation of the ISO97 standard), with a short-wavelength cutoff value being taken as 25.0 µm and a long-wavelength cutoff value being taken as 2.5 mm.

On the other hand, the term "surface roughness Ra" refers to microscopic surface roughness, and denotes a value calculated in conformance with JIS B0601 (1994), with a long-wavelength cutoff value being taken as 10 µm.

Additionally, it goes without saying that the foregoing characteristics can be combined as appropriate without arising contradiction. And as to each characteristic, even when it can be expected to produce two or more effects, it doesn't mean that all the effects must be in full play.

Advantage of the Invention

According to the invention, when an optical device is formed as the electronic device by providing a reflecting film on the side of the translucent substrate, the presence of waviness allows control on visibility of the reflecting film.

According to the invention, a short circuit is prevented from occurring between electrodes of the electronic device formed on the surface, and the electronic device having a long life and a large effective area can also be provided.

Moreover, making of the scattering layer from glass can ensure stability and high strength, whereby it becomes possible to provide a translucent substrate superior in scattering property to a translucent substrate primarily made of glass without increasing the substrate thickness.

MODE FOR CARRYING OUT THE INVENTION

Embodiment 1

Figure 1A:
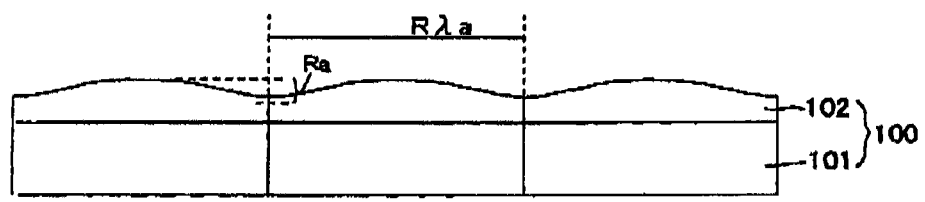
FIG. 1 are views showing an embodiment 1 of the invention, in which (a) is a cross-sectional view showing the structure of a translucent substrate (substrate for an electronic device) and (b) is a cross-sectional view showing the structure of an organic LED element.
Figure 1B:
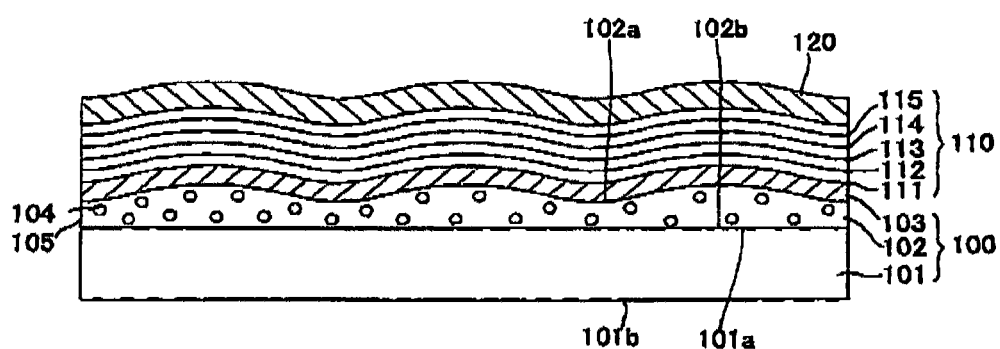

A substrate for an electronic device (translucent substrate with an electrode) and an organic LED element according to an embodiment 1 of the invention are illustrated below by use of drawings. FIG. 1(a) is a diagram of a substrate for electronic device according to an embodiment 1 of the invention, and FIG. 1(b) is a cross-sectional diagram showing a structure of an organic LED element having this substrate for electronic device.

The present substrate for an electronic device, notably for use in fabricating an organic LED element, is characterized, as shown in FIG. 1(a), in that the substrate is provided with a glass substrate 101 and a scattering layer 102 as a glass layer formed on the surface 101a on a first main surface side of the glass substrate 101, the scattering layer 102 has a second surface 102b adjoining the surface 101a on the first main surface side and a first surface 102a opposite to the second surface 102b, and the first surface 102a forms waviness made up of curved faces and acts as the first main surface. Although a translucent electrode 103 is formed on the first surface 102a, FIG. 1(a) shows a state before forming the electrode. In addition, it is desirable for this surface to satisfy conditions that the waviness has a wavelength Rλ of a greater than 50 μm and the ratio Ra/Rλa of surface roughness Ra of the surface which forms waviness to the wavelength Rλa of the surface waviness is from $1.0 \times 10^{-4}$ to $3.0 \times 10^{-2}$. The symbol 101b refers to the second main surface.

When Rλa is great or waviness roughness Ra is small to such an extent that Ra/Rλa is below $1.0 \times 10^{-4}$, it is impossible to significantly reduce a specular reflection property. On the other hand, when waviness roughness is great to such an extent that this ratio (Ra/Rλa) is beyond $3.0 \times 10^{-2}$, an organic layer cannot have the form of uniform film, and it becomes difficult to make a device.

In addition, it is preferable that the surface roughness Ra of the surface which forms waviness is 30 nm or below.

An organic LED element according to the invention is made up of an electrode-attached translucent substrate 100 which has waviness, an organic layer 110 and a reflective electrode 120. The electrode-attached translucent substrate 100 includes a substrate 101 made of a translucent glass substrate, a scattering layer 102 and a translucent electrode 103.

The electrode-attached translucent substrate 100 for use in the invention is equipped with a translucent glass substrate 101, a scattering layer 102 which includes glass and is formed on the glass substrate, and a translucent electrode 103. And the scattering layer contains a base material having a first refractive index for one of wavelengths of transmitted light and a plurality of scattering materials 104 being dispersed in the base material and having a second refractive index different from the refractive index of the base material, and distribution of the scattering materials in the scattering layer diminishes from the inside of the scattering layer toward the translucent electrode. This translucent electrode 103 has a third refractive index equal to or lower than the first refractive index.

Further, the density $\rho_1$ of the scattering materials at the position of half the thickness ($\delta/2$) of the scattering layer 102 made from glass and the density $\rho_2$ of the scattering materials at a distance x ($\delta/2<x\leq\delta$) from the scattering layer surface on the side opposite to the translucent electrode (namely the surface on the substrate side) satisfy $\rho_1 \geq \rho_2$.

Figure 55:
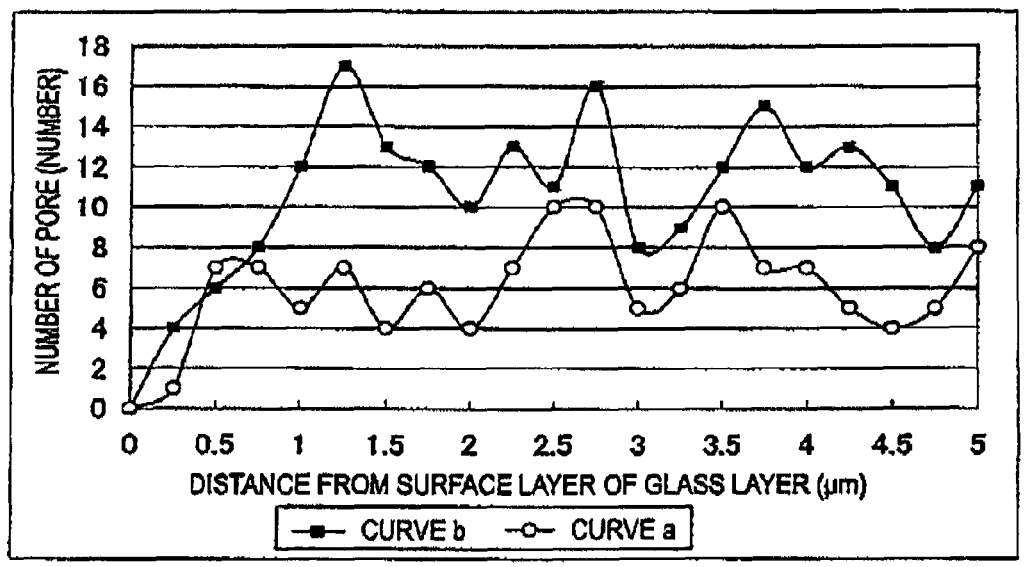
FIG. 55 is a diagram showing the relationship of the number of pores to the depth in the scattering layer of each of the two organic LED elements in Example 3 of the invention.

Furthermore, the density $\rho_3$ of the scattering materials at a distance x (x≤0.2 μm) from a surface of the translucent electrode side of the scattering layer made from glass and the density $\rho_4$ of the scattering materials at the distance x=2 μm satisfy $\rho_4 > \rho_3$. This relation, though described below, is evident from FIG. 55. Additionally, FIG. 55 shows the cases of adopting firing temperatures of 570° C. and 580° C., and even when the firing temperature is changed a little, similar results can be obtained.

In addition, the density $\rho_3$ of the scattering materials at a distance x (x≤0.2 μm) from the surface of the translucent electrode side of the scattering layer made from glass and the density $\rho_5$ of the scattering materials at the distance x=5 μm satisfy $\rho_5 > \rho_3$. This relation also, though described below, is evident from FIG. 55.

According to this constitution, the probability that pores, crystals made to separate out or/and the scattering materials made of materials differing from the base material in composition will be present on or directly underneath the surface of the scattering layer including the glass layer is adjusted to become lower than the probability that they will be present in the interior of the scattering layer, and thereby a smooth surface can be obtained. Because of this adjustment, in the case of forming e.g. an organic LED element, the surface of the translucent substrate, or the scattering layer surface, is smooth, whereby the surface of a translucent electrode (first electrode) formed on the scattering layer can be made smooth and, when a layer having e.g. a function of emitting light is formed on the translucent electrode by a coating method, formation of a uniform layer having a function of emitting light becomes possible too, and further the inter-electrode distance between the translucent electrode and the surface of a reflective electrode (second electrode) formed on the layer having a function of emitting light can be made uniform too. As a result, localized application of a large voltage to the layer having a function of emitting light can be avoided and a long life can be ensured. Additionally, in the case of forming a display device made up of fine picture elements, such as a high-resolution display, it is required to form a pattern of fine picture elements, and therefore surface roughness not only becomes causes of variations in positions and sizes of the picture elements but also produces a problem of developing a short circuit in the organic LED element. However, the present constitution allows fine patterns to be formed with high precision.

The scattering layer, though formed directly on the glass substrate, may also be formed over the glass substrate via a barrier layer e.g. by forming a silica thin film on the glass substrate by use of a sputtering method and then forming the scattering layer. However, by forming the scattering layer made from glass on the glass substrate without interposing an adhesive or an organic layer, a very stable and flat surface can be obtained, and besides, by constructing an optical device only from inorganic substances, it becomes possible to ensure thermal stability and a long life for the device.

Characteristics of such a translucent substrate are illustrated in detail.

Figure 2:
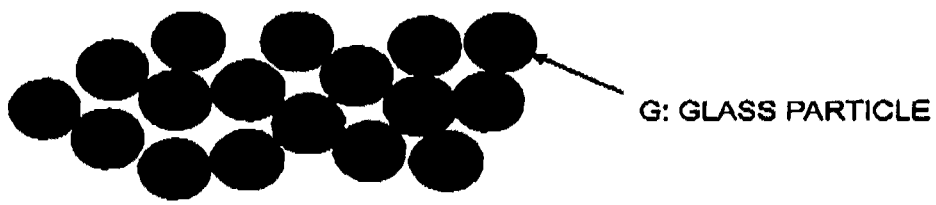
FIG. 2 is a schematic view showing a coated state of glass particles which constitute a scattering layer of the translucent substrate according to the embodiment 1 of the invention.

A schematic diagram of a state which glass powder coated by an appropriate method is in when the glass powder undergoes firing is shown in FIG. 2. This diagram illustrates a cross-section of the topmost part of a glass layer as the scattering layer included in the present translucent substrate. Such a state is brought about by dispersing glass particles G into a solvent or a solvent-resin mixture and coating the dispersion in a desired thickness. As to the particle size, for instance, glass particles measuring about 0.1 μm to about 10 μm in the maximum length are used. When the resin-solvent mixture is used, the resin film into which the glass particles G are dispersed is heated to decompose the resin, and thereby the state shown in FIG. 2 is developed. While FIG. 2 is a diagram drawn with brevity, gaps among glass particles are left therein.

Figure 3:
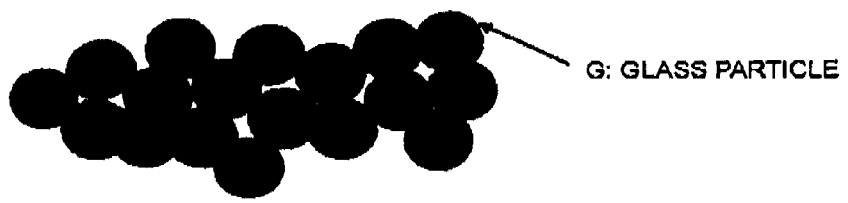
FIG. 3 is a schematic view showing a fired state of glass particles which constitute a scattering layer of the translucent substrate according to the embodiment 1 of the invention.

If the glass particles G have a particle size distribution, they are supposed to have a structure that small particles enter into gaps among large particles. In the course of further raising the temperature, glass particles begin to fuse together at a temperature lower than the softening temperature of the glass by 10° C. to 20° C. The state of such fusion is shown in FIG. 3. When glass particles fuse together, the gaps created among glass particles as shown in FIG. 2 are deformed by softening of the glass and closed spaces are formed in the glass. The glass particles fused together at the uppermost layers thereof and form the outermost surface of the scattering layer 102 (glass layer). In the outermost surface 200, gaps forming no closed spaces are present in the form of concaves.

Figure 4:
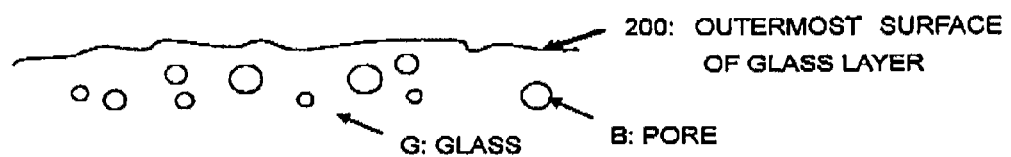
FIG. 4 is a schematic view showing a state of the scattering layer fired at a temperature lower than the softening temperature of glass as an example for comparison with the invention.
Figure 5:
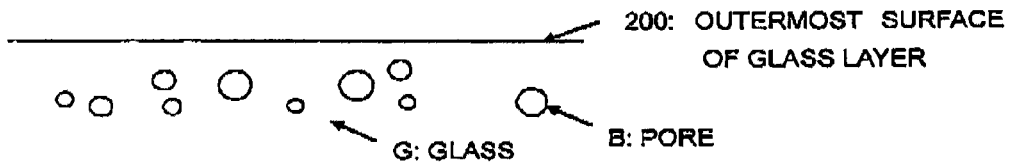
FIG. 5 is a schematic view showing a state of the scattering layer (when fired at a temperature sufficiently higher than the softening point of the glass) according to the embodiment 1 of the invention.

With a still further rise in temperature, softening and fluidization of glass progress, and the gaps inside the glass comes to form spherical pores. In the outermost surface 200 of the glass, the concaves traceable to gaps among glass particles G come to be smoothed. This state is drawn in FIG. 4. Not only pores are formed from gaps among glass particles G, but also there is a case where gas is produced during the glass softening and forms pores. For instance, there may also be a case where organic matter stuck to the glass layer surface evolves $CO_2$ by undergoing decomposition and forms pores. Likewise, a substance decomposable by heat is introduced, and thereby evolution of pores may be positively aimed at. The state like this can be generally attained in the vicinity of the softening temperature. Because glass has a high viscosity of $10^{7.6}$ poise at the softening temperature, pores having a size of several micrometers or below cannot float up. Thus it is possible to further smooth the surface while inhibiting pores from floating up by not only adjusting the composition of substances to evolve small pores but also further raising the temperature or prolong a retention time. By cooling the surface in a state of being smoothed in such a manner, it becomes possible to provide the glass scattering layer as shown in FIG. 5 which has a smooth surface and contains scattering materials at a lower density in the surface area than in the interior of the glass layer.

By controlling the composition of substances and the firing temperature for forming the glass layer in such a manner, it is possible to prevent pores and concaves from being made in the outermost surface of the glass layer while leaving pores inside the glass layer. In other words, it becomes possible to provide an electrode-attached translucent substrate having excellent scattering characteristics and high surface smoothness by adjusting both a firing temperature profile and a firing time so that the scattering materials are prevent from moving upward and remain inside the glass layer without going up to the surface.

Figure 6:
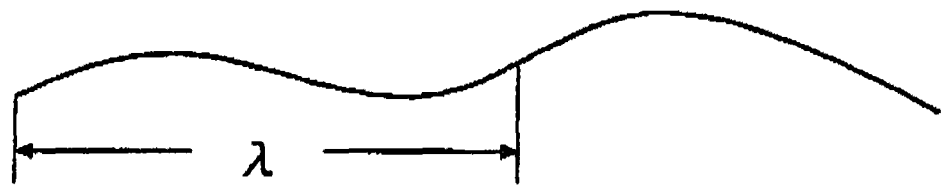
FIG. 6 is a schematic view showing a state of surface waviness of the scattering layer according to embodiment 1 of the invention.

At this time, the outermost surface of the glass layer forms curves with waviness. A schematic diagram thereof is shown in FIG. 6. The term "waviness" used herein refers to the waviness having a period $R\lambda a$ of 10 μm or longer. The magnitude of the waviness (roughness) is of the order of 0.01 μm to 5 μm. Even when such waviness is present, microscopic smoothness is retained. As far as the conditions of $R\lambda a > 10$ μm and $Ra/R\lambda a = 1.0 \times 10^{-5}$ to $1.0 \times 10^{-1}$ are satisfied, reflections in the reflective electrode can be practically reduced, and therefore it is appropriate that $R\lambda a$ be greater than 10 μm and $Ra/R\lambda a$ be from $1.0 \times 10^{-5}$ to $1.0 \times 10^{-1}$. If further desired, it is still better that $R\lambda a$ is greater than 50 μm and $Ra/R\lambda a$ be from $1.0 \times 10^{-4}$ to $3.0 \times 10^{-2}$.

Figure 7:
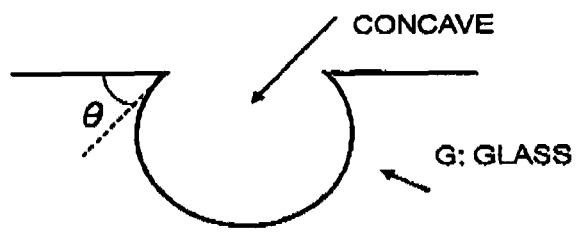
FIG. 7 is a schematic view showing a microscopic concave portion of the scattering layer surface.
Figure 8:
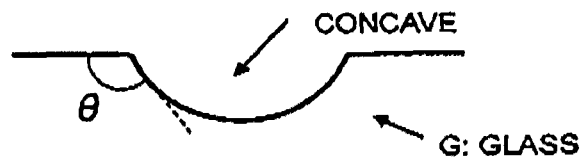
FIG. 8 is a schematic view showing another microscopic concave portion of the scattering layer surface.

For formation of such waviness, it is required to select a processing temperature, a glass material for the glass layer, size of glass particles, a substrate material and so on. In the case where the processing temperature is low, though there is a case where microscopic concaves in the outermost surface remain, the shape of concaves can be changed from an overhanging shape as shown in FIG. 7 to a gentle shape as shown in FIG. 8 by prolonging the firing time. The term "overhanging" used here means that, as shown in FIG. 7, θ takes on an acute angle, while the term gentle means that, as shown in FIG. 8, θ takes on an obtuse angle or a right angle. When the shape of concaves is gentle, it can be said that the concaves have a low possibility of causing an inter-electrode short cut in an organic LED element. It is preferable that the firing temperature is higher than the glass transition temperature by about 40° C. to about 100° C. In a case of amorphous glass in particular, it is preferable that such a temperature different is on the order of 40° C. to 60° C. When the firing temperature is too low, firing becomes insufficient and smoothing of the surface is not attained. Therefore it is more preferable that the firing temperature is higher than the glass transition temperature by about 50° C. to about 60° C.

Further, in a case where an organic LED element formed as the upper layer of a scattering layer has a reflective electrode, formation of waviness made up of curved faces on the surface of the scattering layer allows prevention of degradation in appearance of the element by a reflection in the reflective electrode. When a reflective electrode was used, reflections in the reflective electrode used to appear under no emission of light, there used to be a problem of marring the appearance of the element. However, the waviness formed on the scattering layer surface allows elimination of such a reflection and maintenance of the beauty of the element under no emission of light.

In addition, by optimizing conditions of formation of the scattering layer, the invention causes neither reduction in accuracy of patterns formed as an upper layer of the substrate nor variations in the inter-electrode distance, and besides, because the invention makes it possible to enlarge an area of contact between the electrode and a layer having a function of emitting light, an effective element area can be enlarged and an organic LED element having a long life and a high luminance can be formed.

Furthermore, the surface roughness Ra of the scattering layer surface is preferably 30 nm or below. And it is more preferred that the surface roughness of the scattering layer be 10 nm or below.

In the case of forming e.g. an organic LED element on the translucent substrate as described above, it is required for e.g. a translucent electrode to be formed into a thin layer. In order to form such a translucent electrode without being influenced by the background, the surface roughness is required to be 30 nm or below, preferably 10 nm or below. When the surface roughness is increased beyond 30 nm, there is a case where covering properties of an organic layer formed on the scattering layer becomes worse, and there is also a case where a short circuit occurs between a translucent electrode formed on the scattering layer made from glass and the other electrode. Although the element comes to emit no light by occurrence of the inter-electrode short circuit, there is a case where the element can be restored to the state of light emission by application of an overcurrent. From the viewpoint of making the restoration possible, the roughness of the scattering layer made from glass is preferably 10 nm or below, more preferably 3 nm or below.

Additionally, it is found (see Table 1) that, when the firing temperature is adjusted to 570° C. or higher in a certain material system, the surface roughness of 10 nm or below can be attained. While the optimum firing conditions vary with material systems, control of the varieties and sizes of scattering materials allows prevention of the presence of scattering materials on the outermost surface and formation of the scattering layer superior in surface smoothness.

As to the sizes of scattering materials, when pores are present in the scattering layer and increased in size, they come to have great buoyancy in the process of forming the scattering layer, including a firing step and so on, and tend to float upward. When the pores reach to the outermost surface and rupture, there is a possibility that the surface smoothness is significantly degraded. In addition, the number of scattering material particles in a rupture portion is relatively reduced, whereby it also occurs that the scattering power is lowered only in that portion. When aggregation of large pores occurs, there may be a case where the aggregate is visually recognized as unevenness. Therefore the proportion of pores measuring 5 μm or above in diameter is preferably 15 vol % or below, more preferably 10 vol % or below, further preferably 7 vol % or below. Even when the scattering materials are other than pores, the number of scattering material particles in that portion is lowered to result in reduction of scattering power in that portion. Thus, the proportion of scattering materials measuring 5 μm or above in maximum length is preferably 15 vol % or below, more preferably 10 vol % or below, further preferably 7 vol % or below.

Although it also used to be a problem that, when a reflective electrode was used, a reflection appears therein by specular reflection from the reflective electrode under no emission of light and spoil its good look, a waviness shape is formed on the surface of a scattering layer by optimization of conditions in the formation of the scattering layer, whereby it becomes possible to control a reflection in a reflective electrode. For the purpose of clarify a relationship between waviness and reflection, 8 varieties of samples differing in waviness are prepared, and thereon are made waviness and reflection evaluations. For the waviness evaluation, glass substrates provided with scattering layers are used and measurements thereon are made by means of SURFCOM1400D made by TOKYO SEIMITSU Co., Ltd. The long-wavelength cut-off value taken here is 2.5 mm. For subsequent reflection evaluations, samples are prepared by evaporating aluminum onto these scattering layer-provided glass substrates, and evaluations are made thereon by visual observation.

Results obtained are shown in Table 1.

The evaluation method of reflection consists in that a 0.5-mm-dia lead for a mechanical pencil is placed at a location about 5 mm above from each sample to be evaluated and whether or not the reflection of the lead on the Al surface looks deformed is assessed. This assessment is made by 6 persons from a to f. As to the result of assessments, a case where the lead for a mechanical pencil looks deformed is indicated as a circle (O), a case where the lead for a mechani-

TABLE 1

| No | Scattering layer glass | Firing temperature | Waviness Evaluation | | | Reflection (specular reflectivity) Evaluation | | | | | |
|----|------------------------|---------------------|---------------------|-----|---------|---|---|---|---|---|---|
| | | | Ra [μm] | Rλa [μm] | Ra/Rλa | a | b | c | d | e | f |
| 1 | A | 550° C. | 3.438 | 152 | 0.0226 | o | o | o | o | o | o |
| 2 | A | 560° C. | 2.571 | 215 | 0.0120 | o | o | o | o | o | o |
| 3 | A | 570° C. | 2.441 | 236 | 0.0103 | o | o | o | o | o | o |
| 4 | B | 550° C. | 4.361 | 457 | 0.0095 | o | o | o | o | o | o |
| 5 | A | 580° C. | 1.663 | 298 | 0.0056 | o | o | o | o | o | o |
| 6 | D | 530° C. | 0.331 | 335 | 0.0010 | o | o | o | o | o | o |
| 7 | C | 550° C. | 0.028 | 140 | 0.0002 | o | o | o | o | Δ | o |
| 8 | glass substrate | | 0.001 | 6 | 0.0001 | x | x | x | x | x | x |

While it is preferable as mentioned above that the waviness wavelength Rλa of the surface is longer than 50 μm and the ratio (Ra/Rλa) between the waviness roughness Ra and waviness wavelength Rλa of the surface is adjusted to a range of $1.0 \times 10^{-4}$ to $3.0 \times 10^{-2}$, these preference conditions can also be verified from Table 1.

A and B are two varieties of glass whose compositions are shown in Table 11, and C and D are two varieties of glass whose compositions are shown in Table 12 and Table 13, respectively. The glass transition temperature Tg of A is 499° C., Tg of B is 481° C., Tg of C is 465° C., and Tg of D is 445° C.

These varieties of glass were used, and they each were reduced to powder, mixed with a resin to prepare paste, printed on a glass substrate, and then fired at varying temperatures as shown in Table 1. By controlling the firing condition in such a way, 7 varieties of glass substrates provided with scattering layers differing in waviness roughness Ra and waviness wavelength Rλa were prepared. For the purpose of further comparison, a flat glass substrate having no scattering layer was also prepared.

By the firing condition control as mentioned the above, it becomes possible to control the waviness of the surface, and reduction in reflection, or specular reflectivity, can be brought about. Therefore, the reflection that comes from the specular property of a reflective electrode can be reduced even when scattering capability of the scattering layer is low.

Additionally, samples prepared by evaporating Al in 80 nm-thick layers onto the foregoing scattering layer-provided glass substrates, respectively, were used for reflection evaluations. An organic LED element has a primary structure that a transparent electrode is laminated on a scattering layer, organic layers including a hole transport layer, a light-emitting layer, an electron transport layer and so on are laminated on the transparent electrode, and further an Al layer as an electrode is laminated on the organic layer. However, the transparent electrode and the organic layers were omitted here because the samples were prepared for evaluation by visual observation. The total thickness of the organic layers is of the order of several hundred nm, and the organic layers can follow unevenness of the scattering layer, and therefore the presence or absence of the organic layers has no influence on waviness of the surface. Thus, omission of these layers presents no problem.

cal pencil looks straight without deformation is indicated with a cross (x), and a case where it is difficult to make the assessment of deformation is indicated with a triangle (Δ).

As shown in Table 1, when Rλa is so great that the ratio of the waviness roughness Ra to the waviness wavelength Rλa of the surface, namely the Ra/Rλa ratio, is below than $1.0 \times 10^{-4}$, or when the waviness roughness Ra is small, the reflection cannot be reduced. At the same time, it is desirable for Rλa to be greater than about 50 μm in view of the resolution of human eyes. In fact, though the ratio Ra/Rλa of the glass substrate as Sample No. 8 is $1.0 \times 10^{-4}$ and falls within the range specified above, Rλa is as small as 6 μm and such waviness is invisible to human eyes. Therefore, Sample No. 8 is unsuccessful at reducing reflection.

On the other hand, when the waviness roughness Ra is so great that the ratio. Ra/Rλa exceeds $3.0 \times 10^{-2}$, neither the electrode nor the organic layers can be formed into uniform film, and the fabrication of the device becomes difficult.

It is therefore desirable to satisfy the conditions of Rλa>50 μm and Ra/Rλa=$1.0 \times 10^{-4}$ to $3.0 \times 10^{-2}$. Additionally, it is possible to largely reduce reflection, i.e., specular reflectivity, even under conditions of Rλa>10 μm and Ra/Rλa=$1.0 \times 10^{-5}$ to $1.0 \times 10^{-1}$.

On the samples listed in Table 1, diffuse reflection ratio measurements were made. For the measurements, LANBDA 959 made by PERKIN ELMER Inc. was used. Results obtained are almost the same as the evaluation results on the specular reflectivity measurements.

In addition, it is preferable that the content of the scattering materials in the scattering layer is at least 1 vol %.

This is because experimental results reveal that, when scattering materials are incorporated in a proportion of 1 vol % or higher, sufficient light-scattering ability can be obtained.

Figure 9:
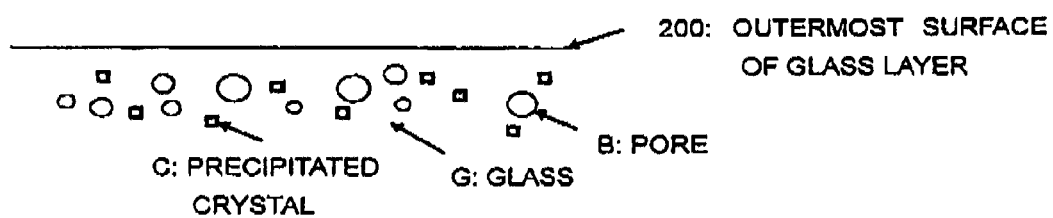
FIG. 9 is a schematic view showing a surface state of the scattering layer according to embodiment 1 of the present invention.

Further, it is possible to make crystals separate out in the interior of the glass layer by the use of glass susceptible to crystallization. The crystals made to separate out can function as light-scattering materials, provided that their sizes are 0.1 μm or above. The internal state at this time is shown in FIG. 9. The appropriate selection of the firing temperature makes it possible to induce crystallization inside the glass layer while inhibiting crystals from separating out at the outermost surface of the glass layer. More specifically, it is appropriate that the firing temperature be higher than the glass transition temperature by about 60° C. to 100° C. Under the temperature rise of such a degree, the viscosity of glass is still high, and there occurs no upward floatation of pores.

Figure 10:
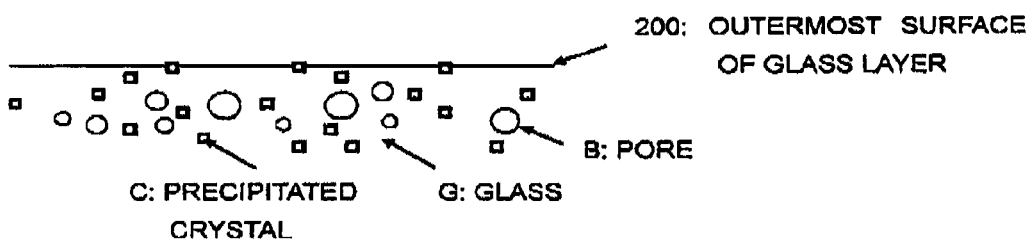
FIG. 10 is a schematic view showing a surface state of the scattering layer in Comparative Example (when the firing temperature is too high).

Too high a firing temperature is undesirable because, under such a temperature, crystals separate out also at the outermost surface of the glass layer and smoothness of the outermost surface is lost. This state is schematically shown in FIG. 10. Therefore the firing temperature is preferably adjusted to a temperature higher than the glass transition temperature by 60° C. to 80° C., especially by 60° C. to 70° C. The use of such a technique makes it possible to allow pores and crystals to be present in the interior of the glass layer and to inhibit them from developing at the outermost surface of glass. These possibilities are attributed to glass's properties that, in a certain temperature range, glass becomes flattened in itself and can ensure a high viscosity as to inhibit upward floatation of pores, or the glass can crystallize out. In the case of resin, it is difficult to control the process under such high viscosity and it is impossible to make crystals separate out.

As mentioned above, adjustments to the material composition and the firing condition make it possible to obtain a translucent substrate which is provided with the scattering layer having a scattering material density lower at the outermost surface than in the interior.

In addition, by using such a translucent substrate that a thickness δ satisfying $\rho_1 \geq \rho_2$ is present when $\rho_1$ is defined as a density of scattering materials at the position of one-half (δ/2) the thickness of the scattering layer and $\rho_2$ is defined as a density of scattering materials at a distance x from the outermost surface of the scattering layer, provided that $0 \leq x \leq \delta/2$ is satisfied, it becomes possible to acquire a translucent substrate having satisfactory scattering properties and a smooth surface.

There is a case where the scattering materials are made up of pores, there is another case where the scattering materials are made up of particles of a material differing from the material of the base layer in composition, and there is the other case where the scattering materials are made up of crystals having separated out in the base layer. These scattering materials may be utilized alone or in the form of a mixture.

When the scattering materials are made up of pores, it is possible to make adjustments to the size, distribution and density of pores by controlling the firing conditions including a firing temperature.

When the scattering materials are made up of particles of a material differing from the material of the base layer in composition, it is possible to make adjustments to the size, distribution and density of the scattering materials by controlling the material composition and the firing conditions including the firing temperature.

When the scattering materials are made up of crystals having separated out in glass constituting the base layer, it is possible to make adjustments to the size, distribution and density of pores by controlling the firing compositions including a firing temperature.

Furthermore, it is preferable that the first refractive index of the base layer is 1.8 or above at a wavelength λ as at least one of wavelengths within a specified range (430 nm<λ<650 nm). Although it is difficult to form a layer of a material with a high refractive index, an adjustment to the refractive index becomes easy by controlling the material composition of the base material.

Each of the members is illustrated below in detail.
(Substrate)

As a translucent plate 101 used for forming the translucent substrate, a material high in visible-light transmittance, notably a glass substrate, is used. As a material with a high transmittance, other than a glass substrate, a plastic plate is used in the concrete. Examples of a material for the glass substrate include various types of inorganic glass, such as alkali glass, non-alkali glass and quartz glass. And examples of a material for the plastic plate include polyester, polycarbonate, polyether, polysulfone, polyether sulfone, polyvinyl alcohol and fluoropolymers such as polyvinylidene fluoride and polyvinyl fluoride. For the purpose of preventing water from penetrating into the substrate, the substrate may be designed to impart barrier properties to a plastic plate. In the case of glass, the thickness of the translucent plate 101 is preferably from 0.1 mm to 2.0 mm. Since the translucent plate too thin in thickness suffers reduction in strength, it is particularly preferable that the thickness is from 0.5 mm to 1.0 mm.

Additionally, since a strain problem or the like occurs in forming the scattering layer from glass frit, it is appropriate that the thermal expansion coefficient be $50 \times 10^{-7}/°$ C. or above, preferably $70 \times 10^{-7}/°$ C. or above, more preferably $80 \times 10^{-7}/°$ C. or above.

Further, it is preferable that the average thermal expansion coefficient of the scattering layer at temperatures from 100° C. to 400° C. is from $70 \times 10^{-7}/°$ C. to $95 \times 10^{-7}/°$ C., and besides, the glass transition temperature is from 450° C. to 550° C.
(Scattering Layer)

The waviness of the scattering layer surface is already illustrated above. Then a constitution, a formation method and characteristics of the scattering layer and a method for refractive index measurement are described in detail. Although the detailed description is made hereafter, for the purpose of achieving enhancement of the light-extraction efficiency, which is the prime purpose of organic LED elements, it is preferable that the refractive index of the scattering layer is equivalent to or higher than the refractive index of a translucent electrode material. However, there may be cases where it does not matter that the scattering layer has a refractive index lower than the translucent electrode material, so long as the refractive index difference is of the order of 0.2.
(Calculation Method)

For the purpose of achieving characteristics of the scattering layer as described later, the inventors performed optical simulations and made a study of influences of individual parameters on the extraction efficiency. The computational software used therein is software "SPEOS" manufactured by OPTIS Corporation. This software is software for tracing light rays, and at the same time, it is possible to apply a theoretical formula of Mie scattering to the scattering layer. Although thicknesses of organic layers used as a charge injection-and-transport layer and a layer having a light emission function such as a light-emitting layer are actually of the order of 0.1 μm to 0.3 μm in total, the angle of light rays remains unchanged in the tracing of light rays even when the thickness is changed. Therefore the minimum thickness allowed in the software was taken as 1 μm. For a reason similar to the above, the total thickness of the glass substrate and the scattering layer was taken as 100 μm. For the sake of simplicity of calculation, the organic layers and the translucent electrode were separated into three sections, namely a section composed of an electron injection layer and a light-emitting layer, a hole injection-and-transport layer section and a translucent electrode section. In the calculation, the refractive indexes of these sections were assumed to be the same. As a matter of fact, organic layers and a translucent electrode are almost the same in refractive index. Therefore such assumption does not bring about a big change in calculation results. Strictly thinking, a waveguide mode caused by interference is created because the organic layers are thin. However, even such geometrical optic treatment does not cause a big change in results obtained. Therefore effects of the invention are sufficiently estimated in this manner. As to the organic layer, emission light is assumed to exit from a total of 6 faces without having directivity. And the calculation was made by taking the total light-flux amount as 1,000 lm and the number of light rays as 100,000 or 1,000,000. The light exiting from the translucent substrate was captured by a light receiving surface placed 10 μm above the translucent substrate, and the extraction efficiency was calculated from the illumination on the light receiving surface.

(Constitution)

In this embodiment of the invention, as described above, the scattering layer 102 is formed by putting a glass powder on a glass substrate by a method, such as coating, and firing the glass powder at a desired temperature. The scattering layer thus formed has a base material 105 having a first refractive index and a plurality of scattering materials 104 which have a second refractive index different from that of the base material and are in a state of being dispersed in the base material 105. In the interior of the scattering layer, within-layer distribution of the scattering materials diminishes from the inside to the outermost surface of the scattering layer. By the use of such a glass layer, as mentioned above, the scattering layer can keep surface smoothness while having excellent scattering characteristics, and can ensure light extraction with extremely high efficiency when used on the light-exiting face side of a light-emitting device.

And moreover, as the scattering layer, a coating of a material (base material) having a main surface and a high light transmittance is used. Examples of such a base material include glass, crystallized glass, translucent resins and translucent ceramics. As to a material of glass, various types of inorganic glass can be used, with examples including soda lime glass, borosilicate glass, non-alkali glass and quartz glass. In the interior of the base material, a plurality of scattering materials 104 (e.g. pores, crystals having separated out, particles of a material different from the base material, phase-separated glass) have been formed. The term "particles" used herein refers to minute pieces of a solid substance such as filler or ceramic. And the term "pores" refers to minute bodies of air or gas. In addition, the term "phase-separated glass" refers to glass made up of two or more different glass phases. By the way, when the scattering materials are pores, the diameter of the scattering material refers to the length of an air gap.

Furthermore, for achieving enhancement of light-extraction efficiency which is a principal object of the invention, it is favorable that the refractive index of the base material is made equivalent to or not higher than the refractive index of a translucent electrode material. This is because, when the refractive index is low, a loss due to total reflection occurs at the interface between the base material and the translucent electrode material. However, even when the refractive index of the base material is small, distribution of the scattering materials makes it possible to compensate for the extraction efficiency, and allows the refractive index of the scattering layer in its entirety to be equivalent to or higher than the refractive index of the translucent electrode, and thereby it also becomes possible to enhance the extraction efficiency. It is good here that the refractive index of the scattering layer exceeds in at least one portion (for example, red, blue, green or the like) of the emission spectrum range of the light-emitting layer. However, it is preferable that the refractive index of the scattering layer exceeds over the whole region (430 nm to 650 nm) of the emission spectrum range, and it is more preferable that the refractive index of the scattering layer exceeds over the whole region (360 nm to 830 nm) of the wavelength range of visible light.

In addition, in order to prevent the inter-electrode short circuit in the organic LED element, it is required for the main surface of the scattering layer to be smooth. Hence it is undesirable that the scattering materials protrude from the main surface of the scattering layer. For the purpose of preventing the scattering materials protruding from the main surface of the scattering layer, it is favorable that the scattering materials are not present within 0.2 μm from the main surface of the scattering layer. As to the average roughness (Ra) defined in JIS B0601-1994, it is appropriate that Ra of the main surface of the scattering layer is 30 nm or less, preferably 10 nm or less (see Table 1), particularly preferably 1 nm or less. While it doesn't matter that both the refractive index of the scattering materials and that of the base material are high, the refractive-index difference (Δn) is preferably 0.2 or more in at least one portion of the emission spectrum range of the light-emitting layer. In order to obtain sufficient scattering characteristics, it is preferred that the refractive-index difference (Δn) be 0.2 or more over the whole region (430 nm to 650 nm) of the emission spectrum range or the whole region (360 nm to 830 nm) of the wavelength range of visible light.

For achievement of the maximum refractive-index difference, it is appropriate to adopt such a composition that the high light-transmittance material is high refractive-index glass and the scattering materials are bodies of gas, or pores. In the invention, the refractive index of the base material may also be smaller than the refractive index of a translucent electrode. Thus the flexibility in choosing usable materials becomes high. However, it is preferable in this case also that the refractive index of the base material is as high as possible, and therefore it is advantageous to use high refractive-index glass as the base material. Where components of the high refractive index glass are concerned, it is possible to use high refractive-index glass which includes one or more than one component selected from $P_2O_5$, $SiO_2$, $B_2O_3$, $Ge_2O$ and $TeO_2$ as a network former and one or more than one oxide selected from $TiO_2$, $Nb_2O_5$, $WO_3$, $Bi_2O_3$, $La_2O_3$, $Gd_2O_3$, $Y_2O_3$, $ZrO_2$, ZnO, BaO, PbO and $Sb_2O_3$ as a high refractive index component. In addition, in a sense of adjustment to characteristics of the glass, an alkali oxide, an alkaline earth oxide, an alkaline earth fluoride or the like may be used within a range not impairing characteristics required for the refractive index. Specific examples of a system of glass include a $B_2O_3$—ZnO—$La_2O_3$ system, a $P_2O_5$—$B_2O_3$—$R'_2O$—R"O—$TiO_2$—$Nb_2O_5$—$WO_3$—$Bi_2O_3$ system, a $TeO_2$—ZnO system, a $B_2O_3$—$Bi_2O_3$ system, a $SiO_2$—$Bi_2O_3$ system, a $SiO_2$—ZnO system, a $B_2O_3$—ZnO system and a $P_2O_5$—ZnO system, wherein R' represents an alkali metal element and R" represents an alkaline earth metal element. Additionally, the above systems are examples, and usable systems of glass are not limited to those examples so long as they have such compositions as to satisfy the conditions specified above.

It is also possible to change a color of emission light by imparting a specific transmittance spectrum to the base material. For this purpose, known colorants, such as a transition metal oxide, a rare-earth metal oxide and a metal colloid, can be used alone or in combination.

In uses for backlight and illumination, emission of white light is generally required. As methods for whitening emission light, a method of putting coats of red, blue and green colors in a spatially separated state (separation coating method), a method of laminating light-emitting layers having different emission color (lamination method) and a method of converting a blue color of emission light into the other colors by use of color-converting materials placed in a spatially separated state (color conversion method) are known. Because it is enough for uses as backlight and illumination to obtain uniform white color, the multilayer method is generally used. At the occasion of laminating light-emitting layers, a combination capable of assuming white color in additive color process is used. For instance, there is a case where a greenish-blue layer and an orange layer are laminated or a case where a red layer, a blue layer and a green layer are laminated. In the use for illumination in particular, color reproducibility at the irradiated areas is important, and therefore it is preferable that the combination of light-emitting layers has an emission spectrum necessary for the visible light region. When a green-rich object is illuminated with light from a laminate of a greenish-blue layer and an orange layer, color reproducibility becomes poor because emission intensity of green light is low. While the lamination method has a merit of requiring no change in spatial color arrangement, it bears the following two problems. The first problem consists in that the emission light extracted suffers an influence of interference because the organic layer thickness is small as mentioned above. Consequently, the color varies with the viewing angle. In the white color's case, human eyes has high sensitivity to a tinge of the color, such a phenomenon may cause a problem. The second problem consists in that carrier balance has shifted during emission of light, and thereby the luminance of emission light in each color has varied and changes in colors have occurred.

As to organic LED elements currently in use, there is no thought of dispersing fluorescent substances into their scattering layers or diffusion layers, and therefore the problem of color changes has not been solved yet. Hence the organic LED elements currently in use are still inadequate for using them as backlight or for illumination. On the other hand, the present substrate for use in an organic LED element and the present organic LED element makes it possible to use scattering materials or to incorporate fluorescent substances into base materials. Thereby, wavelength conversions are performed by light emissions from the organic layers and make it possible to produce effects of changing colors. In this case, it is possible to reduce emission colors of the organic LED, and besides, the emission light exits in a scattered state, and thereby the dependence of colors on viewing angles and changes of colors with passage of time can be prevented.

(Method of Making Scattering Layer)

The method of producing the scattering layer includes coating and firing processes, and it is preferably a method of producing the scattering layer from frit-pasted glass from the viewpoint of uniformly and speedily forming a thick scattering layer, particularly so as to have a thickness of 10 to 100 µm and have waviness in large areas. With a frit paste method utilized, it is required to prevent thermal deformation of the substrate glass. It is therefore preferable that the softening point (Ts) of scattering-layer glass is lower than the strain point (SP) of the substrate glass, and that the difference in thermal expansion coefficient α between those glass materials is small. The difference between the softening point and the strain point is preferably 30° C. or more, more preferably 50° C. or more. Further, the difference in expansion coefficient between the scattering layer and the substrate glass is preferably $\pm 10 \times 10^{-7}$ (1/K) or less, more preferably $\pm 5 \times 10^{-7}$ (1/K) or less. The term "frit paste" used herein refers to the glass powder dispersed in a resin, a solvent, a filler or/and the like. Coating with a glass layer becomes possible by patterning frit paste through the use of a pattern forming technique, such as screen printing, and firing the pattern. Technical outlines are described below.

(Frit Paste Material)

1. Glass Powder

The particle size of glass powder used is from 1 µm to 10 µm. For the purpose of controlling thermal expansion of the fired film, a filler may be incorporated. As the filler, zircon, silica, alumina or the like can be used practically, and the particle size thereof is from 0.1 µm to 20 µm.

Glass materials are described below.

In the invention, the scattering layer is made using a glass material e.g. containing from 20 to 30 mol % of $P_2O_5$, from 3 to 14 mol % of $B_2O_3$, from 10 to 20 mol % of $Li_2O/Na_2O/K_2O$ combination, from 10 to 20 mol % of $Bi_2O_3$, from 3 to 15 mol % of $TiO_2$, from 10 to 20 mol % of $Nb_2O_5$ and from 5 to 15 mol % of $WO_3$, provided that the total contents of these oxides is 90 mol % or more.

The glass composition for formation of the scattering layer has no particular limitations so long as it can deliver desired scattering properties and can be frit-pasted and fired. However, viewing from the capability of maximizing the extraction efficiency, examples of a glass composition having such capability include a system containing $P_2O_5$ as an essential component and one or more additional components chosen from among the oxides $Nb_2O_5$, $Bi_2O_3$, $TiO_2$ and $WO_3$; a system containing $B_2O_3$, ZnO and $La_2O_3$ as essential components and one or more additional components chosen from among the oxides $Nb_2O_5$, $ZrO_2$, $Ta_2O_5$ and $WO_3$; a system containing $SiO_2$ as an essential component and either $Nb_2O_5$ or $TiO_2$, or both as additional components; and a system containing $Bi_2O_3$ as a main component and $SiO_2$, $B_2O_3$ or the like as a network-forming component.

Additionally, all systems of glass usable as the scattering layer in the invention are free of $As_2O_3$, PbO, CdO, $ThO_2$ and HgO which are components having adverse effects on the environment, except cases where they are inevitably contaminated with those oxides as impurities originated from raw materials.

The scattering layer containing $P_2O_5$ and one or more additional components chosen from among the oxides $Nb_2O_5$, $Bi_2O_3$, $TiO_2$ and $WO_3$ is preferably a layer of glass having a composition range that, in terms of mol %, $P_2O_5$ is from 15 to 30%, $SiO_2$ is from 0 to 15%, $B_2O_3$ is from 0 to 18%, $Nb_2O_5$ is from 5 to 40%, $TiO_2$ is from 0 to 15%, $WO_3$ is from 0 to 50%, $Bi_2O_3$ is from 0 to 30%, provided that $Nb_2O_5+TiO_2+WO_3+Bi_2O_3$ is from 20 to 60%, $Li_2O$ is from 0 to 20%, $Na_2O$ is from 0 to 20%, $K_2O$ is from 0 to 20%, provided that $Li_2O+Na_2O+K_2O$ is from 5 to 40%, MgO is from 0 to 10%, CaO is from 0 to 10%, SrO is from 0 to 10%, BaO is from 0 to 20%, ZnO is from 0 to 20% and $Ta_2O_5$ is from 0 to 10%.

Effects of each component, whose content is expressed in mol %, are as follows.

$P_2O_5$ is an essential component which can form a framework in this system of glass, and induces vitrification. However, too low a $P_2O_5$ content causes devitrification to a great extent, and the intended glass cannot be obtained. Thus the $P_2O_5$ content is preferably 15% or more, more preferably 18% or more. On the other hand, too high a $P_2O_5$ content causes a fall in refractive index, and the object of the invention cannot be attained. Thus the content is preferably 30% or less, more preferably 28% or less.

$B_2O_3$ is an optional component and a component which can enhance resistance to devitrification and lowers a thermal expansion coefficient when added into the glass. Too high a $B_2O_3$ content lowers the refractive index. Therefore the content is preferably 18% or less, more preferably 15% or less.

$SiO_2$ is an optional component and a component which can stabilize the glass and enhance resistance to devitrification when added in a slight amount. Too high a $SiO_2$ content causes a rise in refractive index. Therefore the content is preferably 15% or less, more preferably 10% or less, particularly preferably 8% or less.

$Nb_2O_5$ is an essential component which not only brings about a rise in refractive index but also has an effect of enhancing weather resistance. Therefore the $Nb_2O_5$ content is preferably 5% or more, more preferably 8% or more. However, too high an $Nb_2O_5$ content causes serious devitrification and makes it impossible to obtain the glass. Thus the content is preferably 40% or less, more preferably 35% or less.

$TiO_2$ is an optional component which can bring about a rise in refractive index. However, too high a $TiO_2$ content causes strong coloring of the glass, increases a loss in the scattering layer, and makes it impossible to achieve the object of improving the light-extraction efficiency. Therefore the content is preferably 15% or less, more preferably 13% or less.

$WO_3$ is an optional component which can bring about a rise in refractive index and can lower firing temperature through a drop in glass transition temperature. However, excessive introduction of $WO_3$ invites coloring of the glass, and causes a reduction in the light-extraction efficiency. Therefore the $WO_3$ content is preferably 50% or less, more preferably 45% or less.

$Bi_2O_3$ is a component which can bring about a rise in refractive index, and it can be introduced into glass in a relatively large amount without influence on stability of the glass. However, excessive introduction of $Bi_2O_3$ causes a problem that the glass is colored and the transmittance thereof is lowered. Therefore the $Bi_2O_3$ content is preferably 30% or less, more preferably 25% or less.

In order to raise the refractive index to a value higher than the desired value, incorporation of one or more of the components $Nb_2O_5$, $TiO_2$, $WO_3$ and $Bi_2O_3$ is required. To be concrete, the total content of the oxides $Nb_2O_5$, $TiO_2$, $WO_3$ and $Bi_2O_3$ is preferably 20% or more, more preferably 25% or more. On the other hand, when the total content of these components is too high, coloring occurs and devitrification becomes too serious. Therefore the total content of these oxides is preferably 60% or less, more preferably 55% or less.

$Ta_2O_5$ is an optional component which can bring about a rise in refractive index. However, too large an amount of $Ta_2O_5$ added lowers resistance to devitrification. In addition, $Ta_2O_5$ is expensive. Therefore the $Ta_2O_5$ content is preferably 10% or less, more preferably 5% or less.

The alkali metal oxides ($R_2O$) such as $Li_2O$, $Na_2O$ and $K_2O$ have both the effect of improving glass fusibility and lowering glass transition temperature and the effect of enhancing affinity for a glass substrate and heightening adhesion. Therefore it is preferable that one or more than one alkali metal oxide is incorporated. The total content of the oxides $Li_2O$, $Na_2O$ and $K_2O$ is preferably 5% or more, more preferably 10% or more. However, incorporation of alkali metal oxides in excessive amounts causes lowering of refractive index and makes it hopeless to achieve the intended enhancement of light-extraction efficiency because every alkali metal oxide is a component which impairs the stability of glass and lowers the refractive index of glass when incorporated in an excessive amount. Therefore the total content of alkali metal oxides is preferably 40% or less, more preferably 35% or less.

$Li_2O$ is a component for lowering of glass transition temperature and enhancement of melting ability. However, too high a $Li_2O$ content induces devitrification to an excessive extent and makes it impossible to obtain homogeneous glass. Further, incorporation of $Li_2O$ in too high a content causes an excessive rise in thermal expansion coefficient, and thereby the difference in expansion coefficient between the glass obtained and a substrate becomes large, and besides, it causes a rise in refractive index, and thereby attainment of the intended enhancement of light-extraction coefficient becomes impossible. Therefore the $Li_2O$ content is preferably 20% or less, more preferably 15% or less.

Both of $Na_2O$ and $K_2O$ are optional components which can enhance glass fusibility. However, excessive incorporation of these oxides causes a rise in refractive index and makes it impossible to achieve the intended light-extraction efficiency. Therefore the content of each oxide is preferably 20% or less, more preferably 15% or less.

ZnO is a component which can bring about a rise in refractive index and lowering of glass transition temperature. However, addition of ZnO in an excessive amount promotes devitrification of glass and makes it impossible to obtain homogeneous glass. Therefore its content is preferably 20% or less, more preferably 18% or less.

BaO is a component which can bring about both rises in refractive index and melting ability. However, when added in an excessive amount, BaO impairs stability of the glass obtained. Therefore the BaO content is preferably 20% or less, more preferably 18% or less.

MgO, CaO and SrO are optional components. While they each can enhance fusibility, they each cause a rise in refractive index. Therefore the content of each oxide is preferably 10% or less, more preferably 8% or less.

For the purpose of obtaining glass having a high refractive index and stability, the total content of the foregoing components is preferably 90% or more, more preferably 93% or more, further preferably 95% or more.

In addition to the components described above, a fining agent, a vitrification promoting component, a refractive index adjusting component, a wavelength converting component and so on may be added in small amounts within ranges not impairing the required glass characteristics. Examples of the fining agent include $Sb_2O_3$ and $SnO_2$, those of the vitrification promoting component include $GeO_2$, $Ga_2O_3$ and $In_2O_3$, those of the refractive index adjusting component include $ZrO_2$, $Y_2O_3$, $La_2O_3$, $Gd_2O_3$ and $Yb_2O_3$, and those of the wavelength converting component include rare-earth components such as $CeO_2$, $Eu_2O_3$ and $Er_2O_3$.

The scattering layer containing $B_2O_3$ and $La_2O_3$ as essential components and one or more than one additional component chosen from among the oxides $Nb_2O_5$, $ZrO_2$, $Ta_2O_5$ and $WO_3$ is preferably a layer of glass having a composition range that, in terms of mol %, $B_2O_3$ is from 20 to 60%, $SiO_2$ is from 0 to 20%, $Li_2O$ is from 0 to 20%, $Na_2O$ is from 0 to 10%, $K_2O$ is from 0 to 10%, ZnO is from 5 to 50%, $La_2O_3$ is from 5 to 25%, $Gd_2O_3$ is from 0 to 25%, $Y_2O_3$ is from 0 to 20%, $Yb_2O_3$ is from 0 to 20%, provided that $La_2O_3+Gd_2O_3+Y_2O_3+Yb_2O_3$ is from 5 to 30%, $ZrO_2$ is from 0 to 15%, $Ta_2O_5$ is from 0 to 20%, $Nb_2O_5$ is from 0 to 20%, $WO_3$ is from 0 to 20%, $Bi_2O_3$ is from 0 to 20% and BaO is from 0 to 20%.

Effects of each component, whose content is expressed in mol %, are as follows.

$B_2O_3$ is a network-forming oxide, and is an essential component in this system of glass.

Too low a content makes it impossible to form glass or causes a rise in devitrification resistance. Therefore it is preferable that $B_2O_3$ is incorporated in an amount of 20% or more, preferably 25% or more. On the other hand, too high a content causes a rise in refractive index, and further invites lowering of heat resistance. Therefore the content is limited to 60% or less, preferably 55% or less.

$SiO_2$ is a component which can enhance glass stability when added to this system of glass. However, too large an amount of $SiO_2$ introduced causes a rise in refractive index and a rise in glass transition temperature. Therefore the $SiO_2$ content is preferably 20% or less, more preferably 18% or less.

$Li_2O$ is a component which can lower glass transition temperature. However, too large an amount of $Li_2O$ introduced causes a reduction in devitrification resistance of the glass. Therefore the $Li_2O$ content is preferably 20% or less, more preferably 18% or less.

$Na_2O$ and $K_2O$ can promote melting ability, but introduction thereof causes a reduction in devitrification resistance and a fall in refractive index. Therefore each of their contents is preferably 10% or less, more preferably 8% or less.

ZnO is an essential component, and can bring about a rise in refractive index of glass and a drop in glass transition temperature. Therefore the amount of ZnO introduced is preferably 5% or more, more preferably 7% or more. On the other hand, too large an amount of ZnO added causes a reduction in devitrification resistance, and thereby it becomes impossible to obtain homogeneous glass. Therefore the ZnO content is preferably 50% or less, more preferably 45% or less.

$La_2O_3$ is an essential component and can attain a high refractive index and improve weather resistance when introduced into the glass of $B_2O_3$ system. Therefore the amount of $La_2O_3$ introduced is preferably 5% or more, more preferably 7% or more. On the other hand, too large an amount of $La_2O_3$ introduced causes a rise in glass transition temperature or a reduction in devitrification resistance, resulting in failure to obtain homogeneous glass. Therefore its content is preferably 25% or less, more preferably 22% or less.

$Gd_2O_3$ is a component which makes it possible to attain a high refractive index, can improve weather resistance when introduced into the $B_2O_3$ system glass and can enhance stability of the glass in the presence of $La_2O_3$. However, too large an amount of $Gd_2O_3$ introduced lowers stability of the glass. Therefore the $Gd_2O_3$ content is preferably 25% or less, more preferably 22% or less.

$Y_2O_3$ and $Yb_2O_3$ are components which each allow attainment of a high refractive index, improvement in weather resistance when introduced into the $B_2O_3$ system glass and enhancement of glass stability in the presence of $La_2O_3$. However, too large an amount of each component introduced causes a reduction in glass stability. Therefore the content of each component is preferably 20% or less, more preferably 18% or less.

The rare-earth oxides such as $La_2O_3$, $Gd_2O_3$, $Y_2O_3$ and $Yb_2O_3$ are components essential to achieving a high refractive index and enhancing weather resistance of the glass. Therefore the total content of these components $La_2O_3$, $Gd_2O_3$, $Y_2O_3$ and $Yb_2O_3$, is preferably 5% or more, more preferably 8% or more. However, too large an amount of these oxides introduced causes a reduction in devitrification resistance of the glass, and makes it impossible to obtain homogeneous glass. Therefore the amount introduced is preferably 30% or less, more preferably 25% or less.

$ZrO_2$ is a component which can bring about a rise in refractive index, but too high a content thereof causes a reduction in devitrification resistance or an excessive rise in liquidus temperature. Therefore the content is preferably 15% or less, more preferably 10% or less.

$Ta_2O_5$ is a component which can bring about a rise in refractive index, but too high a content thereof causes a reduction in devitrification resistance or an excessive rise in liquidus temperature. Therefore the content is preferably 20% or less, more preferably 15% or less.

$Nb_2O_5$ is a component which can about a rise in refractive index, but too high a content thereof causes a reduction in devitrification resistance or an excessive rise in liquidus temperature. Therefore the content is preferably 20% or less, more preferably 15% or less.

$WO_3$ is a component which can bring about a rise in refractive index, but too high a content thereof causes a reduction in devitrification resistance or an excessive rise in liquidus temperature. Therefore the content is preferably 20% or less, more preferably 15% or less.

$Bi_2O_3$ is a component which can bring about a rise in refractive index, but too high a content thereof causes a reduction in devitrification resistance and coloring of the glass to result in a rise in refractive index and a consequent reduction in extraction efficiency. Therefore the content is preferably 20% or less, more preferably 15% or less.

BaO is a component which can bring about a rise in refractive index, but too high a content thereof causes a reduction in devitrification resistance. Therefore the content is preferably 20% or less, more preferably 15% or less.

For the purpose of matching the glass to the object of the invention, the total content of the foregoing components is preferably 90% or more, more preferably 95% or more. Even components other than those mentioned above may be added for the purposes of firing, improving melting ability and so on within ranges not impairing the effects of the invention. Examples of such components include $Sb_2O_3$, $SnO_2$, MgO, CaO, SrO, $GeO_2$, $Ga_2O_3$, $In_2O_3$ and fluorine.

The scattering layer containing $SiO_2$ as an essential component and one or more additional components chosen from among the oxides $Nb_2O_5$, $TiO_2$ and $Bi_2O_3$ is preferably a layer of glass having a composition range that, in terms of mol %, $SiO_2$ is from 20 to 50%, $B_2O_3$ is from 0 to 20, $Nb_2O_5$ is from 1 to 20%, $TiO_2$ is from 1 to 20%, $Bi_2O_3$ is from 0 to 15%, $ZrO_2$ is from 0 to 15%, provided that $Nb_2O_5+TiO_2+Bi_2O_3+ZrO_2$ is from 5 to 40%, $Li_2O$ is from 0 to 40%, $Na_2O$ is from 0 to 30%, $K_2O$ is from 0 to 30%, provided that $Li_2O+Na_2O+K_2O$ is from 1 to 40%, MgO is from 0 to 20%, CaO is from 0 to 20%, SrO is from 0 to 20%, BaO is from 0 to 20% and ZnO is from 0 to 20%.

$SiO_2$ is an essential component acting as a network former for formation of the glass. Too low a $SiO_2$ content makes it impossible to form glass. Therefore the content is preferably 20% or more, more preferably 22% or more.

$B_2O_3$ is added in a relatively small amount, together with $SiO_2$, and assists in forming glass and depresses devitrification. However, too high a $B_2O_3$ content causes a rise in refractive index. Therefore the content is preferably 20% or less, more preferably 18% or less.

$Nb_2O_5$ is an essential component for improvement in refractive index, and the content thereof is preferably 1% or more, more preferably 3% or more. However, excessive addition of $Nb_2O_5$ causes a reduction in devitrification resistance and makes it impossible to obtain homogeneous glass. Therefore the $Nb_2O_5$ content is preferably 20% or less, more preferably 18% or less.

$TiO_2$ is an essential component for improvement in refractive index, and the content thereof is preferably 1% or more, more preferably 3% or more. However, excessive addition of $TiO_2$ causes a reduction in devitrification resistance and makes it impossible to obtain homogeneous glass, and further causes coloring and increases a loss due to absorption during the propagation of light in the scattering layer. Therefore the $TiO_2$ content is preferably 20% or less, more preferably 18% or less.

$Bi_2O_3$ is a component for improvement in refractive index, but excessive addition thereof causes a reduction in devitrification resistance and makes it impossible to obtain homogeneous glass, and further causes coloring and increases a loss due to absorption during the propagation of light in the scattering layer. Therefore the $Bi_2O_3$ content is desirably 15% or less, and more desirably 12% or less.

$ZrO_2$ is a component which can bring about a rise in refractive index without worsening a degree of coloring. However, too high a $ZrO_2$ content causes a reduction in devitrification resistance and makes it impossible to obtain homogeneous glass. Therefore the content is preferably 15% or less, more preferably 10% or less.

For the purpose of obtaining glass with a high refractive index, the total content of $Nb_2O_5$, $TiO_2$, $Bi_2O_3$ and $ZrO_2$ is preferably 5% or more, more preferably 8% or more. On the other hand, when the total content is too high, a reduction in devitrification resistance is caused and the glass obtained has coloring. Therefore the total content is preferably 40% or less, more preferably 38% or less.

$Li_2O$, $Na_2O$ and $K_2O$ are components for not only improvement in melting ability but also lowering of glass transition temperature and enhancement of affinity for a glass substrate. Therefore the total content of these components $Li_2O$, $Na_2O$ and $K_2O$ is preferably 1% or more, more preferably 3% or more. On the other hand, when the total content of the alkali oxide components is too high, a reduction in devitrification resistance occurs and makes it impossible to obtain homogeneous glass. Therefore the total content is preferably 40% or less, more preferably 35% or less.

BaO is a component which can bring about both rises in refractive index and melting ability, but incorporation thereof in an excessive amount causes a rise in glass stability and makes it impossible to obtain homogeneous glass. Therefore the BaO content is preferably 20% or less, more preferably 15% or less.

MgO, CaO, SrO and ZnO are components which each can bring about enhancement of the melting ability of glass, and moderate addition thereof can lower devitrification resistance of the glass. However, when the content of each component is too high, devitrification is promoted and homogeneous glass cannot be obtained. Therefore the content of each component is preferably 20% or less, more preferably 15% or less.

For the purpose of matching the glass to the object of the invention, the total content of the foregoing components is preferably 90% or more. Further, even components other than those mentioned above may be added for the purposes of fining, improving melting ability and so on within ranges not impairing the effects of the invention. Examples of such components include $Sb_2O_3$, $SnO_2$, $GeO_2$, $Ga_2O_3$, $In_2O_3$, $WO_3$, $Ta_2O_5$, $La_2O_3$, $Gd_2O_3$, $Y_2O_3$ and $Yb_2O_3$.

The scattering layer containing $Bi_2O_3$ as a main component and $SiO_2$, $B_2O_3$ and the like as glass forming assistants is preferably a layer of glass having a composition range that, in terms of mol %, $Bi_2O_3$ is from 10 to 50%, $B_2O_3$ is from 1 to 40, $SiO_2$ is from 0 to 30%, provided that $B_2O_3+SiO_2$ is from 10 to 40%, $P_2O_5$ is from 0 to 20%, $Li_2O$ is from 0 to 15%, $Na_2O$ is from 0 to 15%, $K_2O$ is from 0 to 15%, $TiO_2$ is from 0 to 20%, $Nb_2O_5$ is from 0 to 20%, $TeO_2$ is from 0 to 20%, MgO is from 0 to 10%, CaO is from 0 to 10%, SrO is from 0 to 10%, BaO is from 0 to 10%, $GeO_2$ is from 0 to 10% and $Ga_2O_3$ is from 0 to 10%.

Effects of each component, whose content is expressed in mol %, are as follows.

$Bi_2O_3$ is an essential component for achievement of a high refractive index and stable formation of the glass even when introduced in a large amount. Therefore the $Bi_2O_3$ content is preferably 10% or more, more preferably 15% or more. On the other hand, excessive addition of $Bi_2O_3$ causes coloring in the glass, and thereby absorption of light which is essentially transmitted occurs to result in lowering of extraction efficiency. In addition, devitrification develops to a serious extent and makes it impossible to obtain homogeneous glass. Therefore the $Bi_2O_3$ content is desirably 50% or less, and more desirably 45% or less.

$B_2O_3$ is an essential component acting as a network former and assisting glass formation in the glass composition containing a large amount of $Bi_2O_3$, and the content thereof is preferably 1% or more, more preferably 3% or more. However, the addition of $B_2O_3$ in an excessive amount causes a rise in refractive index of the glass. Therefore the $B_2O_3$ content is preferably 40% or less, more preferably 38% or less.

$SiO_2$ is a component acting to assist $Bi_2O_3$ in forming glass as a network former. However, too high a $SiO_2$ content causes a rise in refractive index. Therefore the content is preferably 30% or less, more preferably 25% or less.

$B_2O_3$ and $SiO_2$ can improve glass formation when incorporated in combination, and therefore the total content thereof is preferably 5% or more, more preferably 10% or more. On the other hand, when the amounts of these oxides introduced is too large, a rise in refractive index occurs. Therefore the total content is preferably 40% or less, more preferably 38% or less.

$P_2O_5$ is a component which can assist glass formation and control aggravation of the degree of coloring. However, too high a $P_2O_5$ content causes a rise in refractive index. Therefore the content is preferably 20% or less, more preferably 18% or less.

$Li_2O$, $Na_2O$ and $K_2O$ are components for enhancement of melting ability of glass and moreover lowering of glass transition temperature, but too high a content of each oxide causes a reduction in devitrification resistance and makes it impossible to obtain homogeneous glass. Therefore the content of each oxide is preferably 15% or less, more preferably 13% or less. In addition, when the total content of these alkali oxide components $Li_2O$, $Na_2O$ and $K_2O$ is too great, the refractive index is lowered and devitrification resistance of the glass is further reduced. Therefore the total content is preferably 30% or less, more preferably 25% or less.

$TiO_2$ is a component which can bring about a rise in refractive index. However, too high a $TiO_2$ content causes coloring and reduces devitrification resistance to result in failure to obtain homogeneous glass. Therefore the content is preferably 20% or less, more preferably 18% or less.

$Nb_2O_5$ is a component which can bring about a rise in refractive index, but too large an amount of $Nb_2O_5$ introduced causes a reduction in devitrification resistance and makes it impossible to obtain stable glass. Therefore the content is preferably 20% or less, more preferably 18% or less.

$TeO_2$ is a component which can bring about a rise in refractive index without aggravating the degree of coloring. However, excessive introduction of $TeO_2$ causes a reduction in devitrification resistance, and becomes a cause of coloring at the time of firing subsequent to fritting. Therefore the content is preferably 20% or less, more preferably 15% or less.

$GeO_2$ is a component which can enhance glass stability while keeping the refractive index relatively high. However, because $GeO_2$ is very expensive, the content is preferably 10% or less, more preferably 8% or less, further preferably 0%.

$Ga_2O_3$ is a component which can enhance glass stability while keeping the refractive index relatively high. However, because $Ga_2O_3$ is very expensive, the content is preferably 10% or less, more preferably 8% or less, further preferably 0%.

In order to obtain sufficient scattering characteristics, it is preferred that the total content of the foregoing components be 90% or more, preferably 95% or more. Even components other than the foregoing ones may be added for the purposes of refining, improving melting ability, making refractive index adjustment and so on within the range not impairing the effects of the invention. Examples of such components include $Sb_2O_3$, $SnO_2$, $In_2O_3$, $ZrO_2$, $Ta_2O_5$, $WO_3$, $La_2O_3$, $Gd_2O_3$, $Y_2O_3$, $Yb_2O_3$ and $Al_2O_3$.

The glass composition for formation of the scattering layer has no particular limitations so long as it can deliver desired scattering properties and can be frit-pasted and fired. However, viewing from the capability of maximizing the extraction efficiency, examples of a glass composition having such capability include a system containing $P_2O_5$ as an essential, component and at least one additional component chosen from among the oxides $Nb_2O_5$, $Bi_2O_3$, $TiO_2$ and $WO_3$; a system containing $B_2O_3$, and $La_2O_3$ as essential components and at least one additional component chosen from among the oxides $Nb_2O_5$, $ZrO_2$, $Ta_2O_5$ and $WO_3$; a system containing $SiO_2$ as an essential component and either $Nb_2O_5$ or $TiO_2$, or both as additional components; and a system containing $Bi_2O_3$ as a main component and $SiO_2$, $B_2O_3$ or the like as a glass-forming assistant. Additionally, all systems of glass usable as the scattering layer in the invention are required to be free of $As_2O_3$, PbO, CdO, $ThO_2$ and HgO which are components having adverse effects on the environment, except cases where they are inevitably contaminated with those oxides as impurities originated from raw materials.

Further, in cases with which low refractive indexes are OK, it is possible to use $R_2O$—RO—BaO—$B_2O_3$—$SiO_2$, RO—$Al_2O_3$—$P_2O_5$, $R_2O$—$B_2O_3$—$SiO_2$ and the like (wherein $R_2O$ is any of $Li_2O$, $Na_2O$ and $K_2O$, and RO is any of MgO, CaO and SrO).

2. Resin

A resin supports the glass powder and the filler in a coating after screen printing. Examples of the resin used for such a purpose include ethyl cellulose, nitrocellulose, an acrylic resin, vinyl acetate, a butyral resin, a melamine resin, an alkyd resin and a rosin resin. Of these resins, ethyl cellulose or nitrocellulose is used as a main resin. And a butyral resin, a melamine resin, an alkyd resin and a rosin resin are each used as additives for enhancement of coating strength. The debinderization temperature during the firing is from 350° C. to 400° C. in the case of using ethyl cellulose, and it is from 200° C. to 300° C. in the case of using nitrocellulose.

3. Solvent

The resin is dissolved in a solvent, and the solvent gives adjustment to viscosity necessary for printing. Further, the solvent does not dry during printing, and dries quickly during a drying process. It is advantageous for the solvent to have a boiling point of 200° C. to 230° C. For the purpose of making adjustments to the viscosity, the solid content ratio and the drying speed, a blend of solvents is used. In view of drying suitability of paste at the time of screen printing, examples of a usable solvent include ether solvents (butyl carbitol (BC), butyl carbitol acetate (BCA), diethylene glycol di-n-butyl ether, dipropylene glycol dibutyl ether, tripropylene glycol butyl ether and cellosolve butyl acetate), alcohol solvents (α-terpineol, pine oil and Dowanol), ester type solvents (2,2, 4-trimethyl-1,3-pentanediol monoisobutyrate) and phthalate solvents (DBP (dibutyl phthalate), DMP (dimethyl phthalate) and DOP (dioctyl phthalate)). Solvents mainly used are α-terpineol and 2,2,4-trimethyl-1,3-pentanediol monoisobutyrate. Additionally, DBP (dibutyl phthalate), DMP (dimethyl phthalate) and DOP (dioctyl phthalate) also function as plasticizers.

4. Others

For viscosity adjustment and acceleration of dispersion in a frit, a surfactant may be used. A Wane coupling agent may also be used for reforming of frit surface.

(Method for Forming Frit Paste Coating)

(1) Frit Paste

A glass powder and a vehicle are prepared. The term "vehicle" used here refers to the mixture of a resin, a solvent and a surfactant. To be concrete, the vehicle is obtained by charging a resin, a surfactant and so on into a solvent heated at 50° C. to 80° C., and then allowing the resulting mixture to stand for about 4 hours to about 12 hours, followed by filtering.

Then, the glass powder and the vehicle are mixed with a planetary mixer, and then, uniformly dispersed by a three-roll mill. Thereafter, the resulting mixture is kneaded with a kneader for viscosity adjustment. In general the proportion of the vehicle is set at 20 to 30 wt % with respect to 70 to 80 wt % of the glass material.

(2) Printing

The frit paste prepared in (1) is printed by use of a screen printer. The thickness of a frit paste coating to be formed can be controlled using the mesh roughness of a screen plate, the thickness of an emulsion, the pressing force in printing, the squeegee pressing amount and so on. After printing, drying is performed in a firing furnace.

(3) Firing

A substrate having the printed coating dried in the firing furnace is subjected to firing. The firing includes debinderizing treatment for allowing the resin in the frit paste to decompose and disappear and firing treatment for sintering and softening the glass powder. The debinderizing temperature for ethyl cellulose is from 350° C. to 400° C. and that for nitrocellulose is from 200° C. to 300° C. Heating is carried out for 30 minute to 1 hour in the atmosphere. Then the glass is sintered and softened by raising the temperature. The firing temperature is from the softening temperature to the temperature 20° C. higher than the softening temperature, and the shape and size of pores remaining in the inside vary depending on the firing temperature. Then, cooling is carried out, and a glass layer is formed on the substrate. The thickness of the layer formed is from 5 μm to 30 μm. However, it is possible to form a thicker glass layer by carrying out lamination at the time of printing.

When a doctor blade printing method or a die coat printing method is adopted in the printing process, it becomes possible to form a thicker layer (green sheet printing). A green sheet is obtained by forming a layer on PET film or the like and drying the layer. Then the green sheet is bonded to a substrate by thermocompression with a roller or the like, and further subjected to the same firing process as the frit paste is subjected to. The thickness of the glass layer obtained in this method is from 50 μm to 400 μm. Further, it is possible to form a still thicker glass layer by using a laminate of green sheets.

(Density and Size of Scattering Materials in Scattering Layer)

Figure 11:
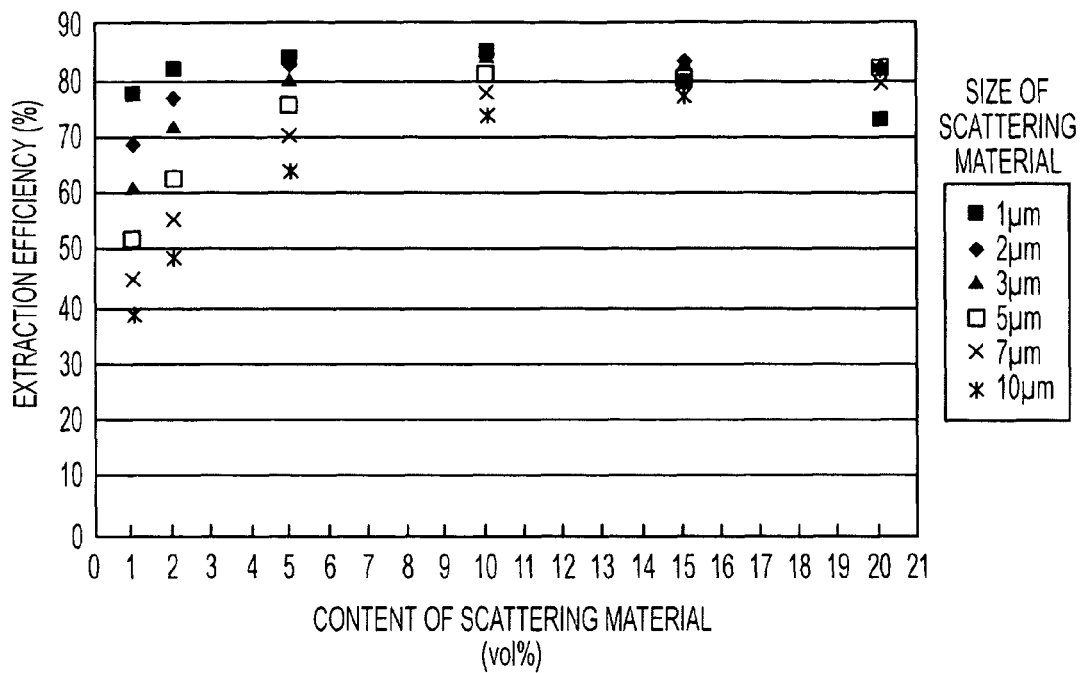
FIG. 11 is a graph showing a relationship between light-extraction efficiency (%) and scattering material content (vol %).

FIG. 11 is a graph showing a relationship between light-extraction efficiency (%) and scattering material content (vol %). Hereafter, for simplification, calculations are carried out in a condition setting of dividing the composite of organic layers and a translucent electrode into three sections, namely a section formed of an electron injection-and-transport layer and a light emitting layer, a section of a hole injection-and-transport layer and a section of a translucent electrode. On the graph are plotted the results obtained in calculations, wherein the electron injection-and-transport layer (thickness: 1 μm, refractive index: 1.9), the light-emitting layer (thickness: 1 μm, refractive index: 1.9), the hole injection-and-transport layer (thickness: 1 μm, refractive index: 1.9), the scattering layer (thickness: 30 μm, refractive index of a base material: 1.9, refractive index of scattering materials: 1.0) and the translucent substrate (thickness: 100 μm, refractive index: 1.54) are used and the light flux of 1,000 lm is divided into 100,000 rays (wavelength: 550 nm). As shown on the graph, the suitable scattering material content of the scattering layer is 1 vol % or higher. Although the behavior of scattering materials varies depending on their sizes, attainment of at least 40% light-extraction efficiency becomes possible as long as the scattering layer has a scattering material content of 1 vol %. It is more suitable that the scattering material content of the scattering layer is 5 vol % or higher, because at least 65% light-extraction efficiency comes to be attained. And it is still more suitable that the scattering material content of the scattering layer is 10 vol % or higher, because the light-extraction efficiency can be elevated to at least 70%. Further, it is especially suitable that the scattering material content of the scattering layer is close to 15 vol %, because the light-extraction efficiency can be elevated to at least 80%. Additionally, if consideration is given to mass production of the scattering layer, it will be appropriate that the scattering material content be from 10 vol % to 15 vol %, because this content range makes it possible for the scattering layer to resist being influenced by production-to-production variation. It is preferred here that the in-plane distribution of scattering materials inside the scattering layer be uniform.

Moreover, the relationship between scattering material size and light-extraction efficiency can be seen from the graph. To be concrete, in a case where the scattering material size is 1 μm, the light-extraction efficiency of 70% or greater can be attained as long as the scattering material content is within the 1 vol %-to-20 vol % range, and the light-extraction efficiency of 80% or greater in particular can be attained when the scattering material content is within the 2 vol %-to-15 vol % range. In another case where the scattering material size is 2 μm, the light-extraction efficiency of 65% or greater can be attained even when the scattering material content is within the 1 vol %-to-20 vol % range, and the light-extraction efficiency of 80% or greater in particular can be attained when the scattering material content is 5 vol % or higher. In still another case where the scattering material size is 3 μm, the light-extraction efficiency of 60% or greater can be attained even when the scattering material content is within the 1 vol %-to-20 vol % range, and the light-extraction efficiency of 80% or greater in particular can be attained when the scattering material content is 5 vol % or higher. In a further case where the scattering material size is 5 μm, the light-extraction efficiency of 50% or greater can be attained even when the scattering material content is within the 1 vol %-to-20 vol % range, and the light-extraction efficiency of 80% or greater in particular can be attained when the scattering material content is 10 vol % or higher. In a still further case where the scattering material size is 7 μm, the light-extraction efficiency of 45% or greater can be attained even when the scattering material content is within the 1 vol %-to-20 vol % range, and the light-extraction efficiency of 80% or greater in particular can be attained when the scattering material content is 10 vol % or higher. In another case where the scattering material size is 10 μm, the light-extraction efficiency of 40% or greater can be attained even when the scattering material content is within the 1 vol %-to-20 vol % range, and the light-extraction efficiency of 80% or greater in particular can be attained when the scattering material content is 15 vol % or higher. It can be seen from the results mentioned above that, when the scattering material size is large, the higher the scattering material content, the greater the light-extraction efficiency becomes.

On the other hand, when the scattering material size is small, it can be seen that, even when the scattering material content is low, the light-extraction efficiency is enhanced.

(Refractive Index of Scattering Material)

Figure 12:
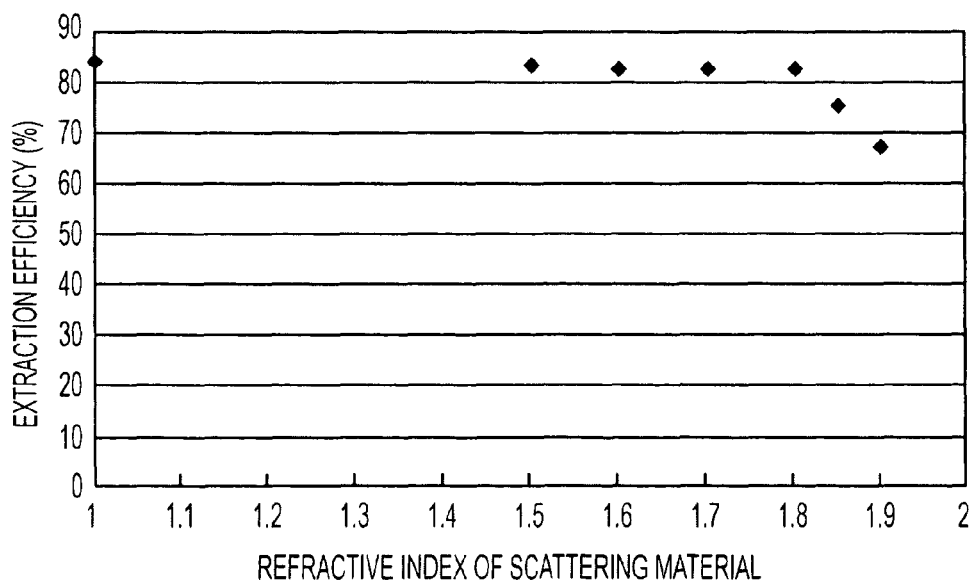
FIG. 12 is a graph showing a relationship between light-extraction efficiency (%) and refractive index of scattering materials.

FIG. 12 is a graph showing a relationship between light-extraction efficiency (%) and refractive index of scattering materials. Hereafter, for simplification, calculations are carried out in a condition setting of dividing the composite of organic layers and a translucent electrode into three sections, namely a section formed of an electron injection-and-transport layer and a light emitting layer, a section of a hole injection-and-transport layer and a section of a translucent electrode. On the graph are plotted the results obtained in calculations, wherein the electron injection-and-transport layer (thickness: 1 μm, refractive index: 1.9), the light-emitting layer (thickness: 1 μm, refractive index: 1.9), the hole injection-and-transport layer (thickness: 1 μm, refractive index: 1.9), the scattering layer (thickness: 30 μm, refractive index of a base material: 2.0, scattering material size: 2 μm, number of scattering material particles: about 36 million, scattering material content: 15 vol %) and the translucent substrate (thickness: 100 μm, refractive index: 1.54) are used and the light flux of 1,000 lm is divided into 100,000 rays (wavelength: 550 nm). As shown on the graph, it is particularly preferable that there is a difference of at least 0.2 between the refractive index of the base material (2.0) and the refractive index of a scattering material (1.8 or lower), because the light-extraction efficiency can be elevated to 80% or greater under such a condition. Additionally, even when the different in refractive index between the base material and scattering materials is 0.1 (the refractive index of the scattering materials is 1.9), it is possible to ensure a light-extraction efficiency of 65% or greater.

(Thickness of Scattering Layer)

Figure 13:
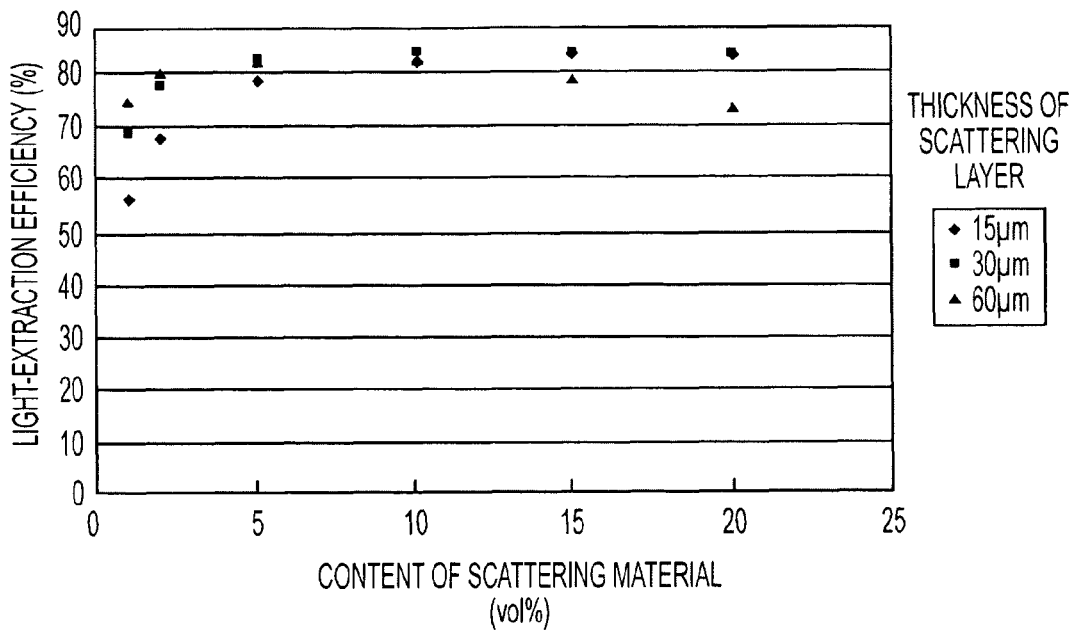
FIG. 13 is a graph showing a relationship between light-extraction efficiency (%) and scattering material content (vol %).

FIG. 13 is a graph showing a relationship between light-extraction efficiency (%) and scattering material content (vol %). Hereafter, for simplification, calculations are carried out in a condition setting of dividing the composite of organic layers and a translucent electrode into three sections, namely a section formed of an electron injection-and-transport layer and a light emitting layer, a section of a hole injection-and-transport layer and a section of a translucent electrode. On the graph are plotted the results obtained in calculations, wherein the electron injection-and-transport layer (thickness: 1 μm, refractive index: 1.9), the light-emitting layer (thickness: 1 μm, refractive index: 1.9), the hole injection-and-transport layer (thickness: 1 μm, refractive index: 1.9), the scattering layer (refractive index of a base material: 1.9, size of scattering materials: 2 μm, refractive index of scattering materials: 1.0) and the translucent substrate (thickness: 100 μm, refractive index: 1.54) are used and the light flux of 1,000 lm is divided into 100,000 rays (wavelength: 550 nm). As shown on the graph, it is preferable that the scattering material content of the scattering layer is 1 vol % or higher, because such a content allows attainment of light-extraction efficiency of 55% or greater even when the thickness of the scattering layer is 15 μm or below. It is also preferable that the scattering material content of the scattering layer is 20 vol % or higher, because such a content allows attainment of light-extraction efficiency of 70% or greater even when the thickness of the scattering layer is 60 μm or above. And it is particularly preferable that the scattering material content of the scattering layer is from 5 vol % to 15 vol %, because such a content range allows attainment of light-extraction efficiency of 80% or greater even when the thickness of the scattering layer is 15 μm or below or 60 μm or above.

(Number of Scattering Materials)

Figure 14:
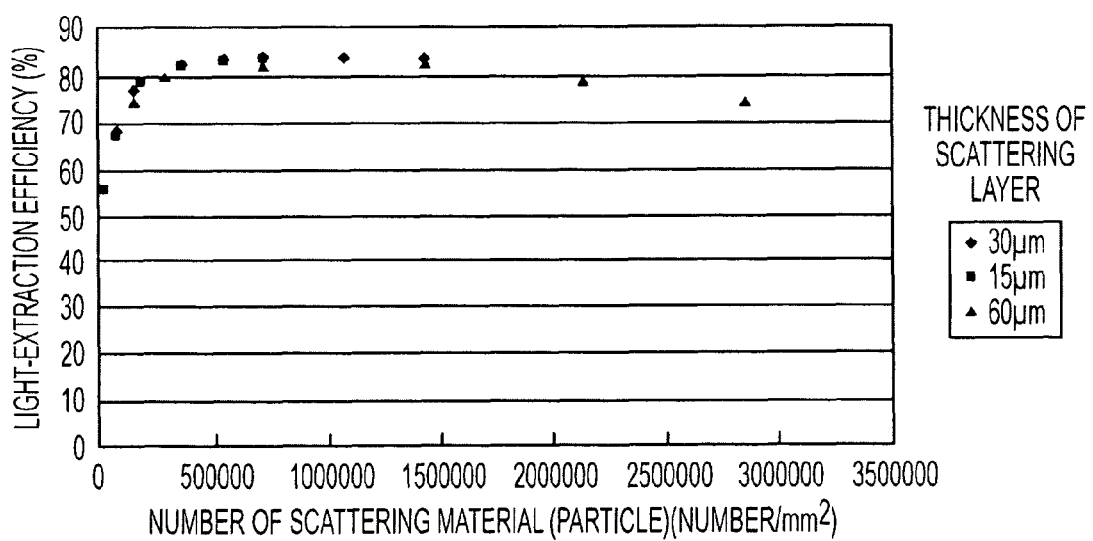
FIG. 14 is a graph showing a relationship between light-extraction efficiency (%) and number of scattering material particles (particles/mm$^2$).

FIG. 14 is a graph showing a relationship between light-extraction efficiency (%) and number of scattering materials (particles) (per mm$^2$). Hereafter, for simplification, calculations are carried out in a condition setting of dividing the composite of organic layers and a translucent electrode into three sections, namely a section formed of an electron injection-and-transport layer and a light emitting layer, a section of a hole injection-and-transport layer and a section of a translucent electrode. On the graph are plotted the results obtained in calculations, wherein the electron injection-and-transport layer (thickness: 1 μm, refractive index: 1.9), the light-emitting layer (thickness: 1 μm, refractive index: 1.9), the hole injection-and-transport layer (thickness: 1 μm, refractive index: 1.9), the scattering layer (refractive index of a base material: 2.0, size of scattering material particles: 2 μm, refractive index of scattering materials: 1.0) and the translucent substrate (thickness: 100 μm, refractive index: 1.54) are used and the light flux of 1,000 lm is divided into 100,000 rays (wavelength: 550 nm). As shown on the graph, it is evident that the light-extraction efficiency varies depending on the number of scattering material particles regardless of the scattering layer thickness. As shown on the graph, it is preferable that the number of scattering material particles per mm$^2$ of the scattering layer is $1\times10^4$ or above, because it allows attainment of light-extraction efficiency of 55% or greater. And it is more preferable that the number of scattering material particles per mm$^2$ of the scattering layer is $2.5\times10^5$ or above, because it allows attainment of light-extraction efficiency of 75% or greater.

Moreover, the presence of scattering material particles ranging in number from $5\times10^5$ to $2\times10^6$ is particularly preferable because it allows attainment of light-extraction efficiency of 80% or greater. Additionally, even when the number of scattering materials measuring 60 μm or above in size is $3\times10^6$, it is possible to raise the light-extraction efficiency to 70% or greater.

(Transmittance of Base Material of Scattering Layer)

Figure 15:
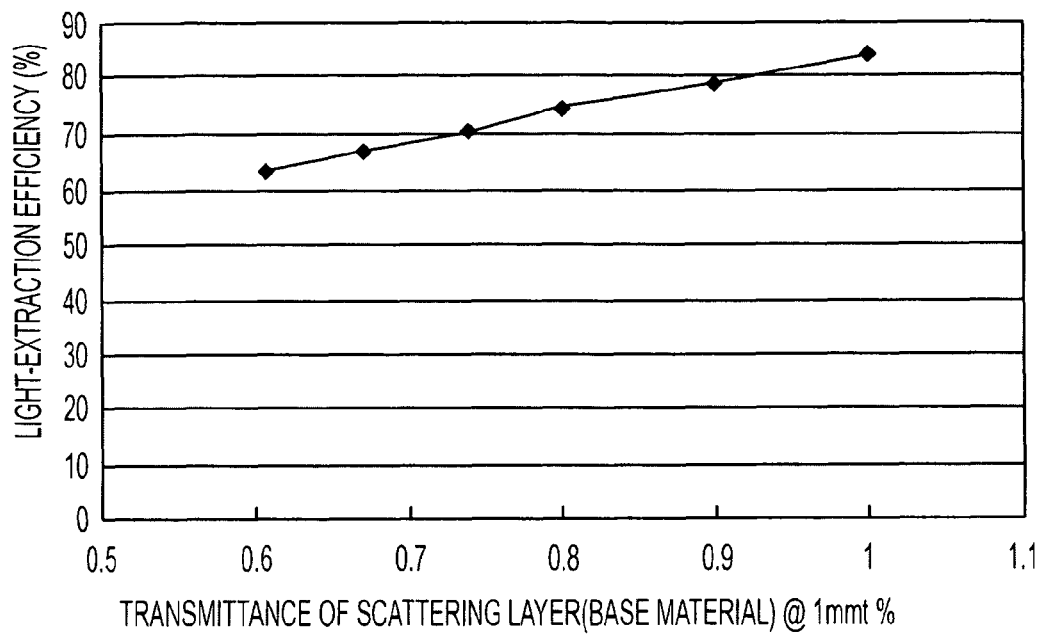
FIG. 15 is a graph showing a relationship between light-extraction efficiency (%) and transmittance of a base material of the scattering layer (@ 1 mmt %).

FIG. 15 is a graph showing a relationship between light-extraction efficiency (%) and transmittance of a base material of the scattering layer at 1 mmt %. Hereafter, for simplification, calculations are carried out in a condition setting of dividing the composite of organic layers and a translucent electrode into three sections, namely a section formed of an electron injection-and-transport layer and a light emitting layer, a section of a hole injection-and-transport layer and a section of a translucent electrode. On the graph are plotted the results obtained in calculations, wherein the electron injection-and-transport layer (thickness: 1 μm, refractive index: 1.9), the light-emitting layer (thickness: 1 μm, refractive index: 1.9), the hole injection-and-transport layer (thickness: 1 μm, refractive index: 1.9), the scattering layer (thickness: 30 μm, refractive index of a base material: 2.0, scattering material size: 2 μm, refractive index of scattering materials: 1.0, number of scattering material particles: about 36 million, scattering material content: 15 vol %) and the translucent substrate (thickness: 100 μm, refractive index: 1.54) are used and the light flux of 1,000 μm is divided into 100,000 rays (wavelength: 550 nm). As shown on the graph, even when the transmittance of a base material of the scattering layer is 50%, the light-extraction efficiency can be made 55% or greater. On the other hand, when the transmittance of a base material of the scattering layer is 90%, it is possible to attain at least 80% light-extraction efficiency. In the case of using glass as the base material, the light-extraction efficiency attained can be beyond 80% because the transmittance of glass is on the order of 98%.

(Reflectivity of Cathode)

Figure 16:
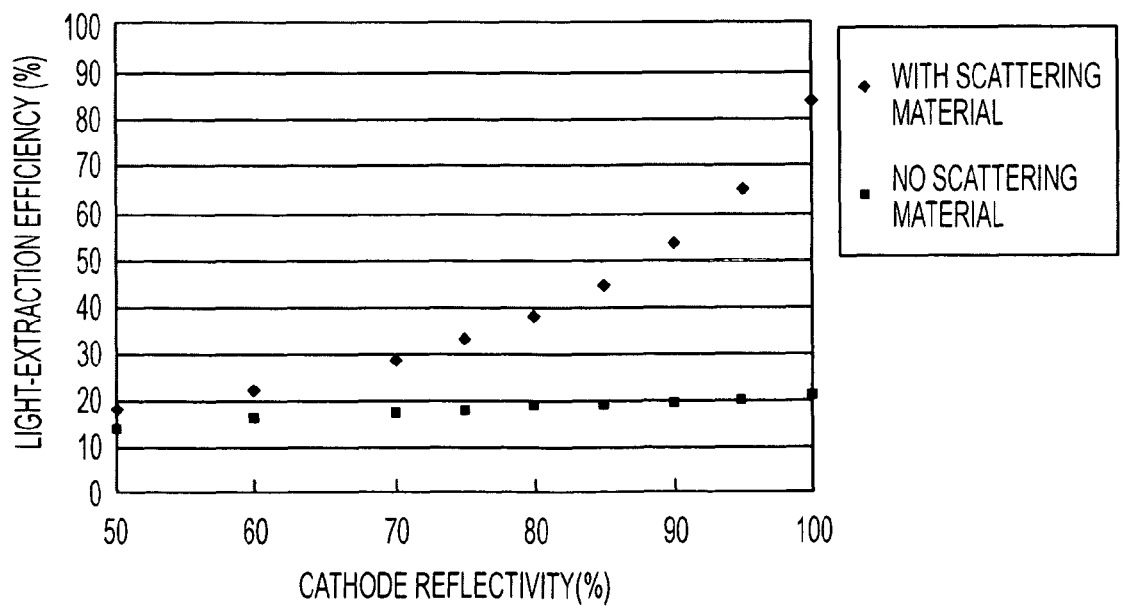
FIG. 16 is a graph showing a relationship between light-extraction efficiency (%) and reflectivity (%) of a cathode.

FIG. 16 is a graph showing a relationship between light-extraction efficiency (%) and reflectivity (%) of a cathode. Hereafter, for simplification, calculations are carried out in a condition setting of dividing the composite of organic layers and a translucent electrode into three sections, namely a section formed of an electron injection-and-transport layer and a light emitting layer, a section of a hole injection-and-transport layer and a section of a translucent electrode. On the graph are plotted the results obtained in calculations, wherein the electron injection-and-transport layer (thickness: 1 μm, refractive index: 1.9), the light-emitting layer (thickness: 1 μm, refractive index: 1.9), the hole injection-and-transport layer (thickness: 1 μm, refractive index: 1.9), the scattering layer (thickness: 30 μm, refractive index of a base material: 2.0, scattering material size: 2 μm, refractive index of scattering materials: 1.0, number of scattering material particles: about 36 million, scattering material content: 15 vol %) and the translucent substrate (thickness: 100 μm, refractive index: 1.54) are used and the light flux of 1,000 lm is divided into 100,000 rays (wavelength: 550 nm). As shown on the graph, when the reflectivity of a cathode is low, the light-extraction efficiency also becomes low. It becomes evident here that, because blue LED reflectivity of a cathode is from 80% to 90%, the light-extraction efficiency of 40% to 50% can be attained. Now, assuming that the organic LED element of Patent Document 1 has a reflectivity of 100%, the light-extraction efficiency thereof is about 50%. On the other hand, when the reflectivity of the present organic LED element is made 100%, or the same value as the reflectivity of the organic LED element of Patent Document 1, the light-extraction efficiency attained is beyond 80% as can be seen from the graph. In other words, it is found that the present organic LED element offers a 1.6-fold improvement in light-extraction efficiency as compared to the organic LED element of Patent Document 1. Therefore the present organic LED can be used in place of a fluorescent lamp as a light source for illumination use.

(Refractive Indexes of Scattering Layer and Anode)

Figure 17:
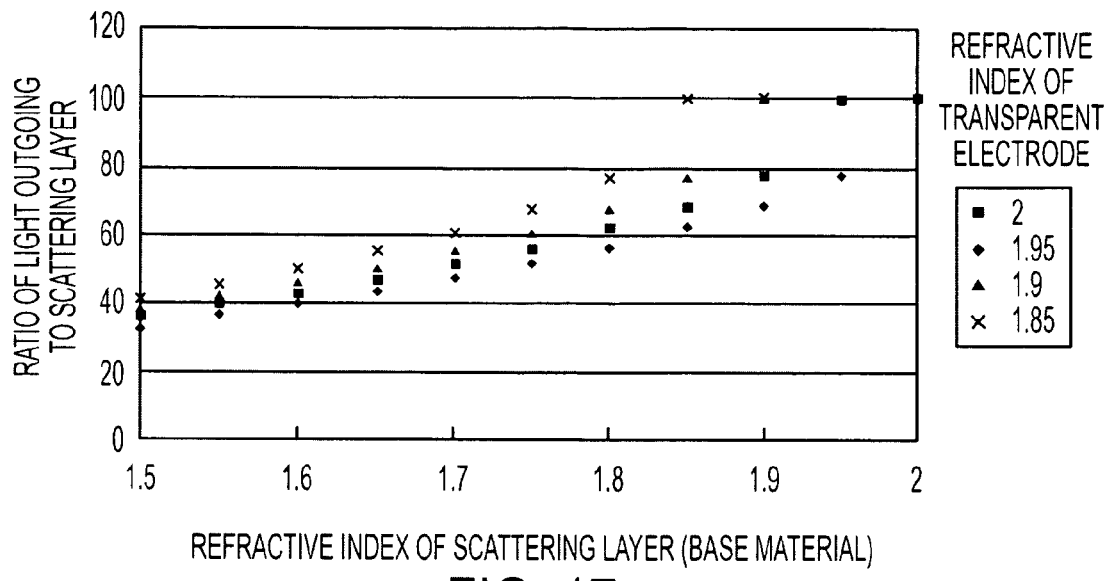
FIG. 17 is a graph showing a relationship between proportion of light exiting to the scattering layer and refractive index of a base material of the scattering layer.

FIG. 17 is a graph showing a relationship between proportion of light exiting to the scattering layer and refractive index of a base material of the scattering layer. Hereafter, for simplification, calculations are carried out in a condition setting of dividing the composite of organic layers and a translucent electrode into three sections, namely a section formed of an electron injection-and-transport layer and a light emitting layer, a section of a hole injection-and-transport layer and a section of a translucent electrode. On the graph are plotted the results obtained in calculations, wherein the electron injection-and-transport layer (thickness: 1 μm, refractive index: 1.9), the light-emitting layer (thickness: 1 μm, refractive index: 1.9), the hole injection-and-transport layer (thickness: 1 μm, refractive index: 1.9), the scattering layer (thickness: 30 μm, scattering material size: 2 μm, refractive index of scattering materials: 1.0, number of scattering material particles: about 36 million, scattering material content 15 vol %) and the translucent substrate (thickness: 100 μm, refractive index: 1.54) are used and the light flux of 1,000 lm is divided into 100,000 rays (wavelength: 550 nm). As shown on the graph, when the refractive index of an anode is greater than that of the scattering layer, total internal reflection occurs at the surface of the scattering layer, whereby the quantity of light entering the scattering layer is reduced. Thus it is evident that there occurs a rise in light-extraction efficiency. Therefore the refractive index of the present scattering layer is preferably equal to or greater than the refractive index of an anode used. Even when the refractive index of the anode is greater than that of the scattering layer, 40% of light can be extracted. When the difference in refractive index between the anode and the scattering layer is 0.2 or below in particular, 50% of light can be extracted. Therefore, cases may also be effective where the refractive index of the present scattering layer is not equal to or smaller than that of an anode used.

(Relationship between Refractive Index of Base Material of Scattering Layer and Color Tinge of White Emission Light)

Figure 18:
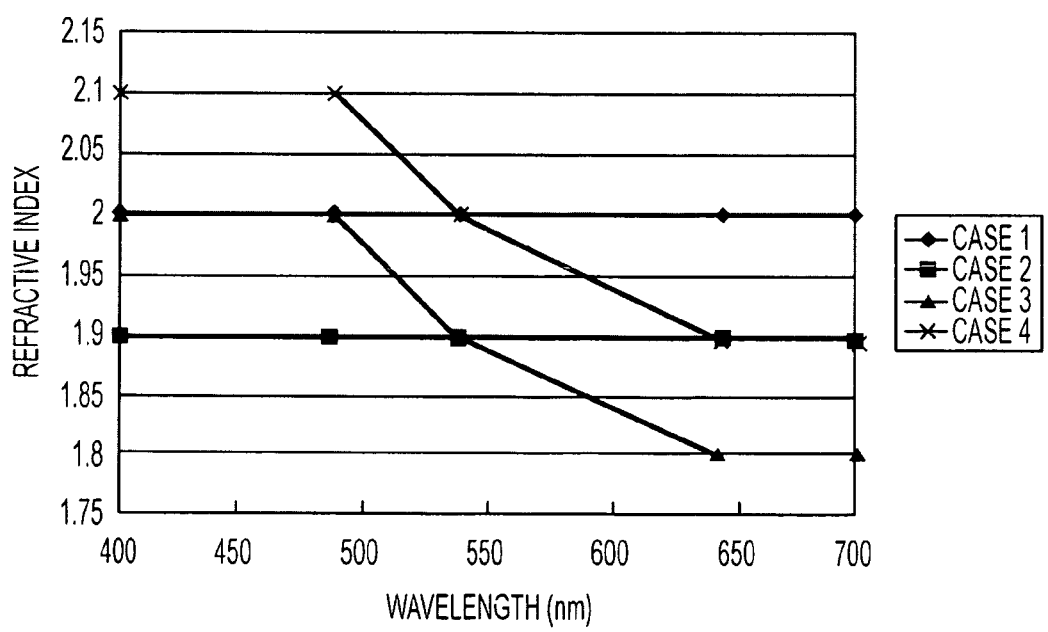
FIG. 18 is a graph showing a relationship between wavelength and refractive index of a base material of the scattering layer.
Figure 19:
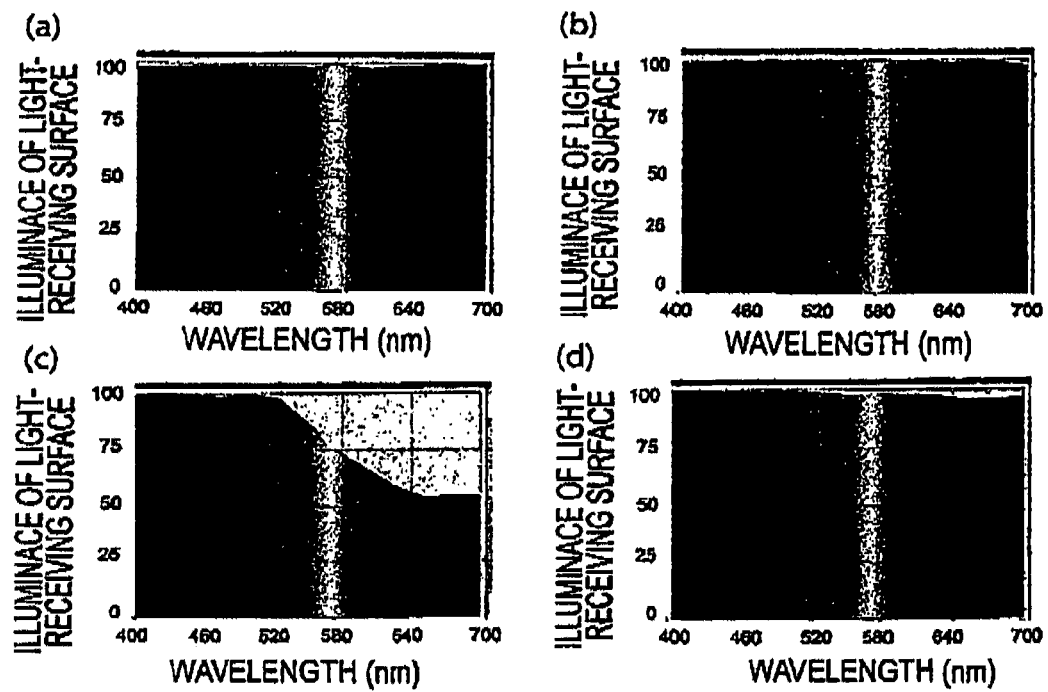
FIG. 19 is a simulation results of a relationship between wavelength and luminance on a light-receiving surface.

FIG. 18 is a graph showing a relationship between wavelength and refractive index of a base material of the scattering layer. FIG. 19 are results showing a relationship between wavelength and luminance on a light-receiving surface. Additionally, FIG. 19(a), FIG. 19(b), FIG. 19(c) and FIG. 19(d) are spectral views corresponding to Case 1 of FIG. 18, Case 2 of FIG. 18, Case 3 of FIG. 18 and Case 4 of FIG. 18, respectively. Hereafter, for simplification, calculations are carried out in a condition setting of dividing the composite of organic layers and a translucent electrode into three sections, namely a section formed of an electron injection-and-transport layer and a light emitting layer, a section of a hole injection-and-transport layer and a section of a translucent electrode. On the graph are plotted the results obtained in calculations, wherein the electron injection-and-transport layer (thickness: 1 µm, refractive index: 1.9), the light-emitting layer (thickness: 1 µm, refractive index: 1.9), the hole injection-and-transport layer (thickness: 1 µm, refractive index: 1.9), the scattering layer (thickness: 30 µm, refractive index of a base material: 2.0, scattering material size: 2 µm, refractive index of scattering materials: 1.0, number of scattering material particles: about 36 million, scattering material content: 15 vol %) and the translucent substrate (thickness: 100 µm, refractive index: 1.54) are used and the light flux of 1,000 lm is divided into 100,000 rays (wavelength: 550 nm). In addition, the refractive index of the translucent electrode is taken as 1.9. As shown in FIG. 19, it is found that, in a wavelength region where the refractive index of a base material of the scattering layer is lower than the refractive indexes of the organic layers and the translucent electrode, the light-extraction efficiency declines and there occurs a change in color tinge. To be concrete, as can be seen from FIG. 19(c), the light emission efficiency is lowered when the refractive index becomes 1.9 or below in a wavelength region not shorter than 550 nm, the refractive index becomes below 1.9. In other words, the organic LED element declines in properties with respect to a red tinge. In this case, it is required to design the element to have an intensified red tinge.

(Methods for Measuring Refractive Index of Scattering Layer)

For refractive index measurement on a scattering layer, there are the following two methods. One is a method of analyzing the composition of a scattering layer, then preparing glass having the same composition, and further making a refractive index evaluation by a prism method. The other is a method of polishing a scattering layer until the layer becomes 1 to 2 µm in thickness and performing ellipsometric measurement in a region of about 10 µmφ without pores, thereby evaluating the refractive index. Additionally, in the invention, the refractive index evaluation is made on the premise that the prism method is used.

(Surface Roughness of Scattering Layer)

The scattering layer has a main surface on which a translucent electrode is provided. As described above, the present scattering layer contains scattering materials. As further described above, the larger the size of the scattering materials, the more improvement in light-extraction efficiency can be aimed at even when the scattering material content is low. According to experiments of the inventors, however, there is a tendency that the larger the size becomes, the larger increase is brought about in surface roughness, or arithmetic average roughness (Ra), of the main surface of the scattering layer when the scattering materials protrude through the main surface of the scattering layer. As also described above, the translucent electrode is provided on the main surface of the scattering layer. Thus there is a problem that the larger the arithmetic average roughness (Ra) of the main surface of the scattering, the more likely a short circuit occurs between the translucent electrode and the scattering layer, and thereby the organic LED element comes to give off no light emission. While Patent Document 1 cited above discloses in the paragraph 0010 that problems come up even when unevenness formed on the substrate surface are on the order of several µm in magnitude, experiments of the inventors has revealed that unevenness of a single-digit figure by µm makes it difficult to obtain light emission from organic LED elements.

(Translucent Electrode)

A translucent electrode (anode) 103 is required to have translucency of 80% or above in order to extract light generated in the organic layer 110 to the outside. Further, for injection of many holes, the translucent electrode is also required to have a high work function. Examples of a material used for such an electrode include ITO, $SnO_2$, ZnO, IZO (indium zinc oxide), AZO ($ZnO—Al_2O_3$: aluminum-doped zinc oxide), GZO ($ZnO—Ga_2O_3$: gallium-doped zinc oxide), Nb-doped $TiO_2$ and Ta-doped $TiO_2$. The thickness of the translucent electrode 103 is preferably 100 nm or above. And the refractive index of the translucent electrode 103 is on the order of 1.9 to 2.2. As for the refractive index of ITO, it can be lowered by raising a carrier density. Although the current standard of $SnO_2$ content of commercially available ITO is 10 wt %, the refractive index of ITO can be lowered by increasing the Sn density beyond the standard value. However, while the carrier density is increased with increase in Sn density, decreases in mobility and transmittance are caused. Therefore it is required to determine the amount of Sn so as to adjust a balance between those factors.

It is appropriate here that the refractive index of ITO be determined with consideration given also to the refractive index of a base material 105 for forming the scattering layer and the refractive index of a reflective electrode 120. The refractive index of ITO is preferably lower than or equal to the refractive index of a base material 105 forming the scattering layer 102, but it may be a little higher than that of the base material. Considering waveguide calculation, the reflectivity of a reflective electrode and so on, it is preferable that the difference in refractive index between ITO and a base material 105 is 0.2 or smaller.

Additionally, it is needless to say that the translucent electrode may be used as the cathode.

(Organic Layer (Layer Having Light-Emitting Function))

An organic layer 110 is a layer having a light-emitting function and includes a hole injection layer 111, a hole transport layer 112, a light-emitting layer 113, an electron transport layer 114 and an electron injection layer 115. The refractive index of the organic layer 110 is of the order of 1.7 to 1.8.

(Hole Injection Layer)

A hole injection layer 111 is required to be small in ionization potential difference in order to lower a barrier of hole injection from the anode 103. Improvement in efficiency of charge injection from the electrode interface with the hole injection layer 111 not only lowers the drive voltage of a device but also enhances charge injection efficiency. In the hole injection layer, a high-molecular compound such as polystyrene sulfonic acid (PSS)-doped polyethylene dioxythiophene (PEDOT:PSS) or a low-molecular compound such as a phthalocyanine compound like copper phthalocyanine (CuPc) is widely used.

(Hole Transport Layer)

A hole transport layer 112 carries out a function of transporting holes from the hole injection layer 111 to the light-emitting layer 133. Therefore this layer is required to have appropriate ionization potential and mobility of holes. Examples of a compound usable in the hole transport layer include triphenylamine derivatives, N,N'-bis(1-naphthyl)-N, N'-diphenyl-1,1'-biphenyl-4,4'-diamine (NPD), N,N'-diphenyl-N,N'-bis[N-phenyl-N-(2-naphthyl)-4'-aminobiphenyl-4-yl]-1,1'-biphenyl-4,4'-diamine (NPTE), 1,1-bis[(di-4-tolylamino)phenyl]cyclohexane (HTM2) and N,N'-diphenyl-N,N'-bis(3-methylphenyl)-1,1'-diphenyl-4,4'-diamine (TPD). The thickness of the hole transport layer 112 is preferably from 10 nm to 150 nm. The thinner the hole transport layer, though the greater reduction in voltage becomes possible, the more likely an inter-electrode short circuit problem is to arise. Therefore it is particularly advantageous for the thickness to be from 10 nm to 150 nm.

(Light-Emitting Layer)

A light-emitting layer 113 provides a place for recombination of injected electrons and holes, and moreover a material high in light emission efficiency is used therein. More specifically, a host material for light emission and the doping material of a luminous pigment used in the light-emitting layer 113 function as recombination centers between holes and electrons injected from the anode and the cathode. And the doping of the host material with the luminous pigment in the light-emitting layer not only delivers high luminous efficiency but also allows conversion of emission wavelengths. These materials are required to have energy levels appropriate for charge injection and to form a uniform amorphous thin film having high chemical stability and heat resistance. In addition, they are required to be superior in variety of emission colors and color purity of emission light and to have high luminous efficiency. Light-emitting organic materials include those having high molecular weights and those having low molecular weights. Further, they are classified under two groups, a group of fluorescent materials and a group of phosphorescent materials, according to light emission mechanism. Examples of a light-emitting material usable in the light-emitting layer 113 include fluorescent materials such as tris(8-quinolinato)aluminum complexes ($Alq_3$), bis(8-hydroxy)quinaldinealuminum phenoxide ($Alq'_2OPh$), bis(8-hydroxy)quinaldinealuminum 2,5-dimethylphenoxide (BAlq), mono(2,2,6,6-tetramethyl-3,5-heptanedionato)lithium complexes (Liq), mono(8-quinolinolato)sodium complexes (Nag), mono(2,2,6,6-tetramethyl-3,5-heptanedionato) lithium complexes, mono(2,2,6,6-tetramethyl-3,5-heptanedionato)sodium complexes, metal complexes of quinoline derivatives including bis(8-quinolinolato)calcium complexes ($Caq_2$), tetraphenyldibutadiene, phenylquinacridone (QD), anthracene, perylene and coronene. As to the host material, quinolinolate complexes, especially aluminum complexes having 8-quinolinol or derivatives thereof as ligands, can be used to advantage.

(Electron Transport Layer)

An electron transport layer 114 performs a function of transporting electrons injected from an electrode. Examples of a material usable in the electron transport layer 114 include quinolinol-aluminum complexes (Alq3), oxadiazole derivatives (such as 2,5-bis(1-naphthyl)-1,3,4-oxadiazole (BND) and 2-(4-t-butylphenyl)-5-(4-biphenyl)-1,3,4-oxadiazole (PBD)), triazole derivatives, vasophenanthroline derivatives and silole derivatives.

(Electron Injection Layer)

An electron injection layer 115 is required to be a layer capable of enhancing injection efficiency of electrons. To be concrete, a layer doped with an alkali metal, such as lithium (Li) or cesium (Cs), is provided at the cathode interface.

(Reflective Electrode)

In a reflective electrode (cathode) 120, a metal with small work function or an alloy thereof is used. Examples of such a metal for use in the cathode 120 include an alkali metal, an alkaline earth metal and a metal of the group III in the periodic table. Among them, aluminum (Al), magnesium (Mg) and alloys thereof can be preferably used because of their low prices and high chemical stability. Further, a co-vapor-deposition film of Al and MgAg, a double-layer electrode formed by Al vapor deposition on a thin vapor-deposition film of LiF or $Li_2O$, or the like can be used as the cathode. In addition, as a polymeric system, a laminate of calcium (Ca) or barium (Ba) and aluminum (Al), or the like may be used.

Additionally, needless to say, the reflective electrode may be used as the anode. Further, both the cathode and the anode can be used as the translucent electrode.

(Method of Making Substrate for Electronic Device)

Figure 20:
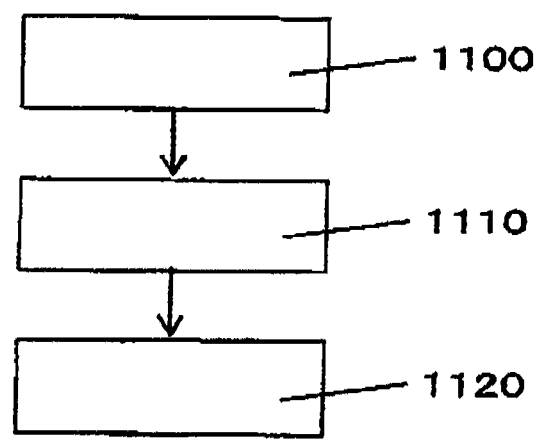
FIG. 20 is a flow chart illustrating a process of making a substrate according to the invention which is intended for use in an organic LED element.

A method of making the present substrate for electronic device is illustrated below by use of a drawing. FIG. 20 is a flowchart showing a method of making the present substrate for electronic device. The method of making the present substrate for electronic device has a step (Step 1100) of preparing a translucent substrate, a step (Step 1110) of forming a scattering layer which includes a base material having a first refractive index at a wavelength of light emitted from an organic LED element and a plurality of scattering materials provided inside the base material and having refractive indexes different from the refractive index of the base material, and a step (1120) of forming a translucent electrode on the scattering layer.

Firstly, a translucent substrate is prepared (Step 1100). A glass substrate or a plastic plate is used here as the translucent substrate in the concrete.

Secondly, a material for forming the scattering layer is prepared which includes a base material having a first refractive index at a wavelength of light emitted from an organic LED element and two or more scattering materials to be provided inside the base material and having refractive indexes different from the refractive index of the base material. And the material prepared for forming the scattering layer is coated and fired, and thereby the scattering layer in which the scattering materials are distributed in an in-plane uniform state is formed on the translucent substrate (Step 1110).

Thirdly, on the scattering layer is formed a translucent electrode, preferably a translucent electrode having a second refractive index equal to or lower than the first refractive index (Step 1120). To be concrete, ITO is formed into film on a substrate, and etching is given to the ITO film formed. ITO can be formed into film with high uniformity over the whole surface of a glass substrate by sputtering or vapor deposition. Then an ITO pattern is formed by photolithography and etching. This ITO pattern becomes the translucent electrode (anode). Phenol novolac resin is used here as resist, and subjected to exposure and development. The etching may be either wet etching or dry etching. For instance, patterning of ITO can be performed by the use of an aqueous solution of hydrochloric acid-nitric acid mixture. As a resist remover, it is possible to use e.g. triethanolamine.

(Method for Fabricating Organic LED Element)

Figure 21:
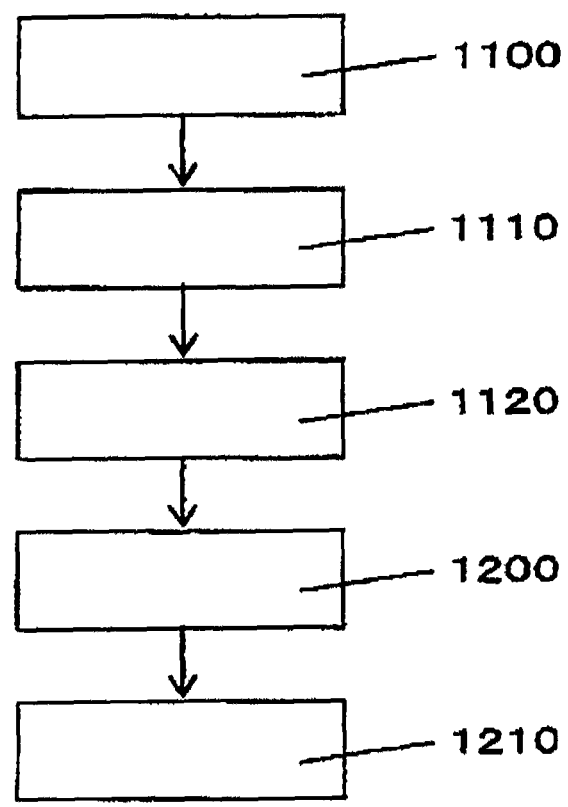
FIG. 21 is a flow chart illustrating a process of fabricating an organic LED element according to the invention.

A method of fabricating the present organic LED element is illustrated below by the use of a drawing. FIG. 21 is a flowchart showing a method of fabricating the present organic LED element. The method of fabricating the present organic LED element has a step (Step 1100) of preparing a translucent substrate, a step (Step 1110) of forming a scattering layer which includes a base material having a first refractive index at a wavelength of light emitted from the organic LED element and a plurality of scattering materials provided inside the base material and having refractive indexes different from the refractive index of the base material, a step (1120) of forming a translucent electrode on the scattering layer, a step (1200) of forming a combination of organic layers on the translucent electrode, and a step (1210) of forming a reflective electrode on the combination of organic layers.

After performing from Step 1100 to Step 1120, a combination of organic layers is formed on the translucent electrode (Step 1200). The organic layers are formed here by the combined use of coating and vapor-deposition methods. For instance, when some one or more of the organic layers are formed by a coating method, the other layers are formed by a vapor deposition method. In the case of forming some layers by a coating method first, and then forming layers to lie upward by a vapor deposition method, the layers formed by coating are concentrated and cured by drying before forming thereon the other organic layers by a vapor deposition method. Alternatively, organic layers may be formed by only a coating method or only a vapor deposition method.

Then a reflective electrode is formed on the organic layer (Step 1210). To be more concrete, a metallic material such as aluminum is evaporated onto the organic layer, thereby forming a reflective electrode.

In the next place, for the purpose of sealing the organic LED light-emitting element fabricated in the foregoing process, a process of making an opposed substrate for sealing use is explained. First, a glass substrate different from the substrate of the element is prepared. By processing this glass substrate, a desiccant housing portion for housing a desiccant is formed. More specifically, the desiccant housing portion is formed by coating the glass substrate with a resist, exposing the resist to light, rendering part of the substrate bare by development, and further thinning the bare part by etching.

Figure 22:
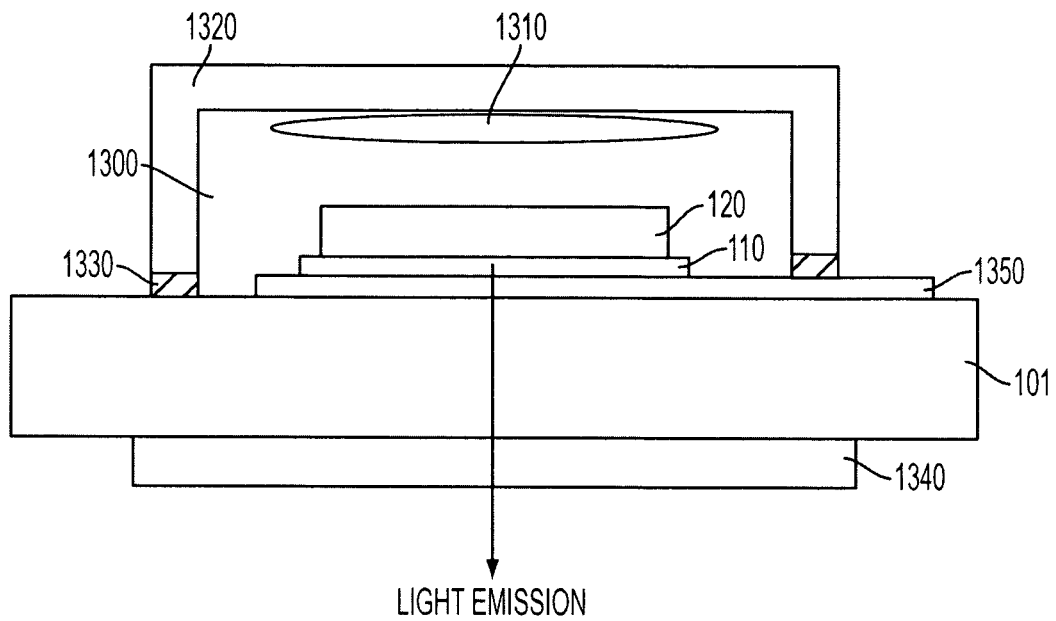
FIG. 22 is a schematic cross-sectional diagram showing a structure of an organic LED display unit.

As shown in FIG. 22, after a desiccant 1310 such as calcium oxide is placed in the desiccant housing portion 1300, the two substrates are superposed on each other and bonded together. Additionally, FIG. 22 is a cross-sectional diagram schematically showing the structure of an organic LED display unit. More specifically, a sealant 1330 is applied to the surface of the opposed substrate 1320 having the desiccant housing portion 1300 by the use of a dispenser. The sealant 1330 which can be used here is e.g. a UV-curable epoxy-based resin. Further, the sealant 1330 is applied to the whole periphery of the region facing the organic LED element. After these substrates are made to face each other and brought into proper alignment, the sealant is cured by irradiation with ultraviolet rays, thereby bonding them together. Thereafter, curing of the sealant is further promoted e.g. by one-hour heat treatment in an 80° C. clean oven. In a case where the scattering layer is not formed on a peripheral portion of the organic LED element substrate, the peripheral portion has a smoother surface. Therefore the sealing ability is further enhanced by not only an increase in close adherence owing to the smoothness but also a level difference with the stacked portion including the scattering layer in the element forming region on the inside. As a consequence, the inter-substrate space in which the organic LED element is present is isolated from the outside of the substrates by the sealant and the substrate pair. By placing the desiccant 1310, degradation of the organic LED element from water or the like remaining in or entering into the sealed space can be prevented.

The light emitted from the organic layer 110 exits in the direction of the arrow. An optical sheet 1340 is stuck to the surface of the glass substrate 101 which is opposite to the surface on which the organic LED element is formed, namely the exit surface. The optical sheet 1340 has a polarization plate and a quarter-wave plate, and functions as an antireflection film. The light from the organic thin layer is extracted to the surface side on which this optical sheet 1340 is provided.

An unnecessary portion in the vicinity of the periphery of the substrate is removed by cutting, a signal electrode drive is connected to an anode wiring 1350, and a scan electrode drive is connected to a cathode connection wiring. On the end portion of the substrate, a terminal area connected to each wiring is formed. To this terminal area, an anisotropic conductive film (ACF) is stuck, and thereto a TCP (Tape Carrier Package) provided with a drive circuit is connected. More specifically, ACF is provisionally pressure-bonded to the terminal area. Then, a drive circuit-contained TCP is fully pressure-bonded to the terminal area. Thereby the drive circuit is mounted. This organic LED display panel is installed in an enclosure, and thereby an organic LED display unit is completed. In the foregoing, the case of a dot matrix display device is illustrated. However, the case of character display is also OK and, depending on the device specification, the foregoing configuration need not apply. Additionally, in the case of this configuration also, by the first main surface being a surface which forms waviness made up of curved faces and the second main surface being flatter than the first main surface, even when a seal material is coated on the periphery of the element substrate, thereon the substrate for seal use is overlaid and the seal material is cured at the occasion of the mounting of the element, the substrate surface portion for adhesion of the seal material is flat and can ensure sufficient adhesiveness.

Additionally, the organic LED element according to the embodiment 1 of the invention is successful in having high moisture resistance and withstanding a long-term use because a glass layer is adopted as the scattering layer. Further, this element has a smooth surface and a desired refractive index, and therefore not only the light-extraction efficiency thereof but also the reliability thereof is high. Furthermore, as to the magnitude of waviness for prevention of reflection in the reflective electrode, the most suitable range thereof is specified by carrying out various experiments one after another and considering each of the experimental results, and thereby it becomes possible to produce the organic LED element having a high degree of reliability.

By contrast, Patent Document 1 has a description (paragraph 0040) that the translucent substance layer is formed by sticking paraffin or the like to a substrate with a resin binder. In other words, the light-scattering portion in Patent Document 1 includes a resin, and is likely to absorb moisture. Therefore the organic LED apparatus of Patent Document 1 has a problem of being incapable of withstanding long-term use. In addition, as mentioned above, the structure of forming a light-scattering portion by aggregately disposing glass particles on a substrate is placed on the back of the element forming side or has on the surface thereof an overcoat layer. In other words, when enhancement of scattering ability in the light-scattering portion used therein is intended by increasing the number of glass particles as scattering materials, unevenness resulting from the scattering materials is formed on the surface of the light-scattering portion, and thereby it becomes difficult to form an element directly on such a surface. On the other hand, when the light-scattering portion is formed on the surface opposite the surface on which the element is formed, there is a problem that the light-scattering portion cannot sufficiently exert its light-scatting effect because it lies at some distance from the light emission region.

Patent Document 2 provides a suggestion about waviness, but it is silent on unevenness on the scattering layer surface.

When there are unevenness on the surface, unevenness tends to appear on the surface of a first electrode provided as the upper layer. And when a layer having a light emission function or the like is formed on this electrode by use of vapor deposition method or the like, the degree of covering the unevenness with such an organic layer becomes low, whereby the organic layer suffers thickness variations. As a result, there occur variations in inter-electrode distance between the first electrode and the surface of the second electrode formed on the organic layer. Thus it turns out that, in a region of a small inter-electrode distance, a large amount of current flows locally into the organic layer, thereby causing a short circuit between the electrodes and inhibiting light emission. And moreover, in the case of making a display containing fine picture elements, such as a high-resolution display, it is required to form a pattern of fine picture elements, and therefore there may be cases where the surface unevenness not only becomes a cause of variations in the positions and sizes of picture elements but also gives rise to a short circuit between electrodes of an electronic device formed on such a scattering layer surface.

As stated above, the organic LED element according to this embodiment provides a solution to the foregoing problem.

Embodiment 2

Another Constitution Example of Organic LED Element

Figure 23:
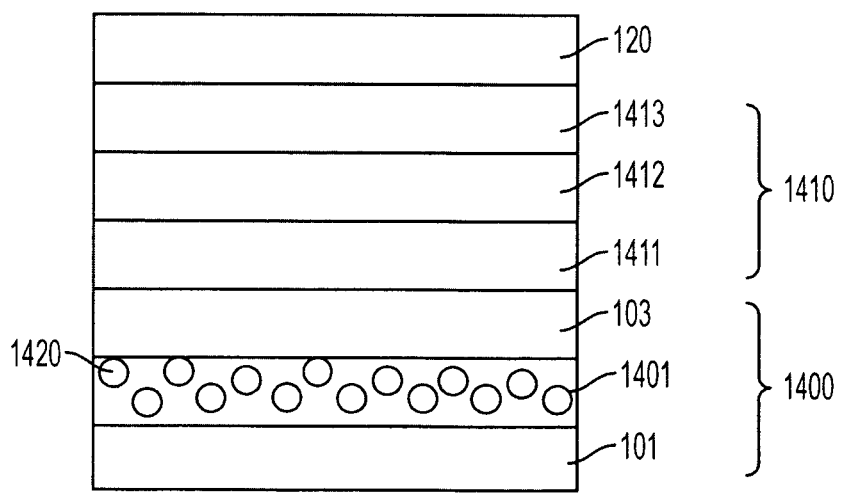
FIG. 23 is a cross-sectional diagram showing another structure of an organic LED element according to the invention.

Next a substrate for an electronic device and an organic LED element according to an embodiment 2 of the invention are illustrated below by use of a drawing. Additionally, in the drawing, the same numbers are assigned to the same components as in FIG. 1, and explanations thereof are omitted. FIG. 23 is a cross-sectional diagram showing another structure of the present translucent substrate for organic LED element use and that of the organic LED element formed by using this substrate. Another organic LED element according to the invention includes a translucent-electrode-attached translucent substrate 1400, an organic layer 1410 and a reflective electrode 120. The translucent-electrode-attached translucent substrate 14 The translucent-electrode-attached translucent substrate 1400 is made up of a translucent substrate 101, a scattering layer 1401 and a translucent electrode 103. The organic layer 1410 is made up of a hole injection-and-transport layer 1411, a light-emitting layer 1412 and an electron injection-and-transport layer 1413.

In FIG. 1, the light-emitting layer 113 of the organic LED element is formed of three layers. Any one of the three layers is designed to emit light of any one of three emission colors (red, green and blue). On the other hand, the light-emitting layer 1412 of the organic LED element shown in FIG. 23 can be designed to be one layer capable of emitting light of only blue color by choosing fluorescing materials (e.g. fillers) showing red fluorescence and green fluorescence as a plurality of scattering materials 1420 provided inside the scattering layer 1401. In other words, according to another structure of the present organic LED element, the light-emitting layer can be designed to be a layer capable of emitting light of only any one of three colors, blue, green and red, whereby an effect of downsizing an organic LED element can be produced.

As to the embodiment mentioned above, the structure having an organic layer sandwiched between a translucent electrode and a reflective electrode is explained. However, by making both the electrodes translucent, a double-sided emission type organic LED layer may be formed.

The present substrate for an electronic device is effective at enhancing efficiencies of light-emitting devices including not only an organic LED element but also an inorganic LED element and a liquid crystal device, or optical devices including a light quantity sensor and a light-receiving device such as a solar cell.

EXAMPLES

Example 1

Experimental Proof of Scattering Layer Effect

Experimental proof that a scattering layer is effective at enhancing light-extraction efficiency is illustrated below. Sample 1 is an example in which a scattering layer having waviness according to the invention is provided, while Sample 2 is a comparative example in which a scattering layer incorporating no scattering materials in its inside is provided. The calculation method used here is the same as the calculation method described above for evaluation of scattering layers. Conditions and results (front light-extraction efficiency) are shown in the following Table 2.

TABLE 2

|  | Sample 1 | Sample 2 |
|---|---|---|
| Electron injection-and-transport layer | | |
| Thickness (μm) | 1 | 1 |
| Refractive index | 1.9 | 1.9 |
| Light-emitting layer | | |
| Thickness (μm) | 1 | 1 |
| Refractive index | 1.9 | 1.9 |
| Hole injection-and-transport layer | | |
| Thickness (μm) | 1 | 1 |
| Refractive index | 1.9 | 1.9 |
| Scattering layer | | |
| Base material | | |
| Thickness (μm) | 30 | 30 |
| Refractive index | 1.9 | 1.9 |
| Transmittance (%) | 100 | 100 |
| Scattering materials | | |
| Size (μm) | 5 | — |
| Refractive index | 1 | — |
| Count (@ 1 mm$^2$) | 1527932.516 | — |
| Content (vol %) | 10 | — |
| Transmittance (%) | 100 | — |
| Glass substrate | | |
| Thickness (μm) | 100 | — |
| Refractive index | 1.54 | — |
| Ray bundle | | |
| Number of rays extracted from the front | 811.1/1000 | 210.4/1000 |
| Number of rays extracted from the side | 47.86/1000 | 125/1000 |
| Front light-extraction efficiency (%) | 81.11 | 21.04 |

Figure 24:
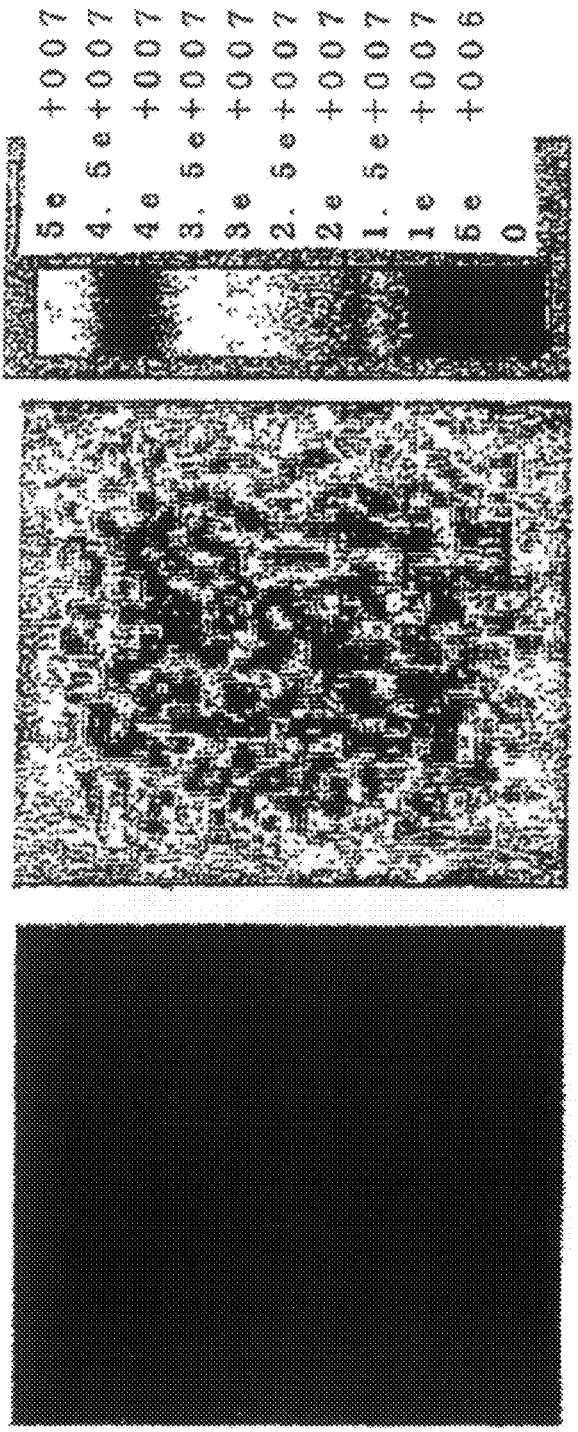
FIG. 24 shows results of observations from the front under conditions of Case 1 and Case 2.

A result of comparison between the front light-extraction efficiencies of the example and the comparative example is shown in FIG. 24. FIG. 24(a) and FIG. 25(b) are views showing results of observations from the front under the conditions of Sample 1 and Sample 2, respectively. As shown in FIG. 24, the combination of the present electrode-attached translucent substrate and the organic LED element allows high light-extraction efficiency increased to the order of 80%, as compared with about 20% of light-extraction efficiency in the case of taking no measure.

Details and results of evaluation tests made for the purpose of verifying that the present electrode-attached translucent substrate produces an improvement in efficiency of light extraction to the outside are illustrated by the use of drawings.

Figure 25:
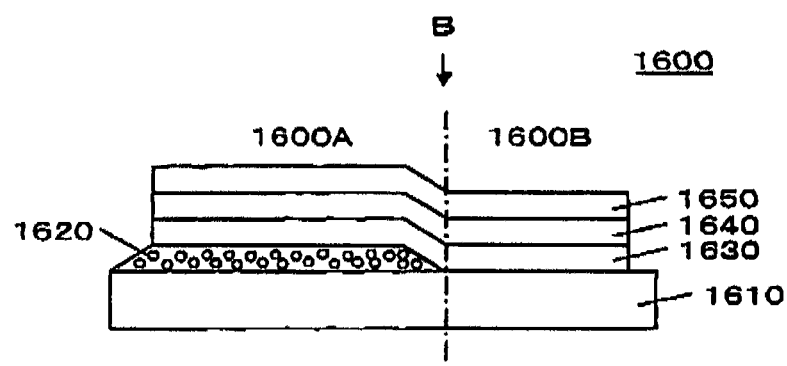
FIG. 25 is a cross-sectional diagram showing a structure of an evaluation element, which appears if the element is cut along the A-A line and viewed from the direction C as shown in FIG. 26.
Figure 26:
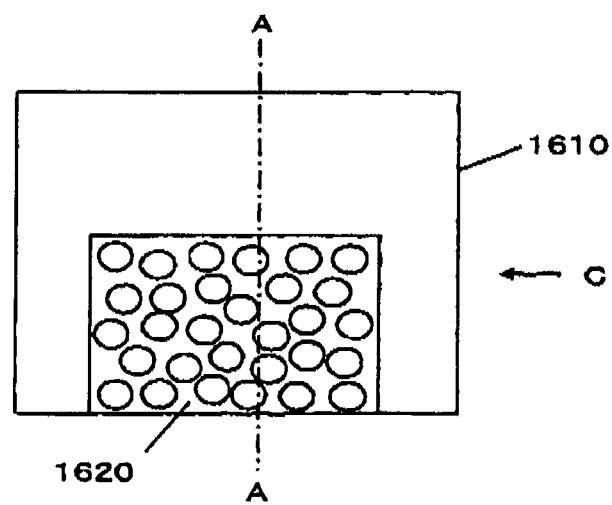
FIG. 26 is a top view of the evaluation element under observation from the direction B in FIG. 25.

An evaluation element as shown in FIG. 25 and FIG. 26 is prepared first. More specifically, FIG. 25 is a cross-section diagram showing a structure of the evaluation element, which appears if the element is cut along the A-A line and viewed from the direction C as shown in FIG. 26, and FIG. 26 is a top view of the evaluation element, which is observed from the direction B shown in FIG. 25. Additionally, FIG. 26 illustrates only a glass substrate 1610 and a scattering layer 1620 for the purpose of clarifying a positional relationship between the glass substrate 1610 and the scattering layer 1620.

The evaluation element has a glass substrate 1610, a scattering layer 1620, an ITO film 1630, an Alq$_3$ (tris(8-quinolinolato)aluminum complex) film 1640 and a Ag film 1650. For the purpose of making a comparison of light-extraction efficiencies in the cases differing in whether or not the scattering layer is present, the evaluation element is divided into a region 1600A in which the scattering layer is present and a region 1600B in which the scattering layer is absent. In the region 1600A of the evaluation element, the scattering layer 1620 is formed on the glass substrate 1610. In the region 1600B of the evaluation element, the ITO film 1630 is formed directly on the glass substrate 1610.

The glass substrate used here is a glass substrate manufactured by Asahi Glass Co., Ltd. [trade name: PD200, hereafter referred to as PD200]. This glass has a strain point of 570° C. and a thermal expansion coefficient of $83 \times 10^{-7}$ (1/° C.). The glass substrate having such a high strain point and a thermal expansion coefficient as mentioned above is suitable for use in forming a scattering layer by firing of glass frit paste.

The scattering layer 1620 is a layer of glass frit paste with a high refractive index. Glass having the composition shown in Table 3 is made here for the scattering layer 1620. This glass has a glass transition temperature of 483° C., a deformation point of 528° C. and a thermal expansion coefficient of $83 \times 10^{-7}$ (1/° C.). Further, this glass has a refractive index nF of 2.03558 in relation to F-ray (486.13 nm), a refractive index nd of 1.99810 in relation to d-ray (587.56 nm) and a refractive index nC of 1.98344 in relation to C-ray (656.27 nm). These refractive index values were measured with a refractometer (made by Kalnew Optical Industrial Co., Ltd., trade name: KRP-2). The glass transition temperature (Tg) and the deformation point (At) were measured with a thermal analysis equipment (made by Bruker, trade name: TD5000SA) at a temperature rising rate of 5° C./min according to a thermal expansion method.

TABLE 3

|  | Mass % | Mol % |
| --- | --- | --- |
| P$_2$O$_5$ | 16.4 | 23.1 |
| B$_2$O$_3$ | 1.9 | 5.5 |
| Li$_2$O | 1.7 | 11.6 |
| Na$_2$O | 1.2 | 4.0 |
| K$_2$O | 1.2 | 2.5 |
| Bi$_2$O$_3$ | 38.6 | 16.6 |
| TiO$_2$ | 3.5 | 8.7 |
| Nb$_2$O$_5$ | 23.3 | 17.6 |
| WO$_3$ | 12.1 | 10.4 |

The glass layer 1620 was formed by the following procedure. A powdery raw material was prepared so as to have the composition shown on a percentage basis in Table 3. The powdery raw material prepared was subjected to 12-hour dry grinding in a ball mill made of alumina, and thereby a glass powder having an average particle size (d50, particle size at an integrated value of 50%, unit: μm) of 1 to 3 μm was prepared. Then a 75 g portion of the glass powder obtained was kneaded with 25 g of an organic vehicle (prepared by dissolving about 10% by mass of ethyl cellulose in α-terpineol or the like), and thereby paste ink (glass paste) was made. This glass paste was uniformly printed on the glass substrate so as to have after-firing layer thicknesses of 15 μm, 30 μm, 60 μm and 120 μm, respectively, and then dried at 150° C. for 30 minutes. Thereafter, the temperature of each printed layer was once restored to room temperature, and then the temperature was increased to 450° C. over 45 minutes, and held at 450° C. for 10 hours. Thereafter, the temperature was further increased to 550° C. over 12 minutes, and kept at 550° C. for 30 minutes. Then, the temperature was lowered to room temperature over 3 hours. Thus, each glass layer was formed on the glass substrate. As to the scattering layer having a thickness of 120 μm, the surface thereof was polished until the layer thickness was reduced to 60 μm. In the glass layers thus formed, many pores were included. And scattering attributed to these pores occurred. On the other hand, the outermost surface of the scattering-layer glass had waviness, but local unevenness resulting from e.g. opening of pores and becoming a cause of an inter-electrode short circuit in the organic LED element was not observed.

Figure 27A:
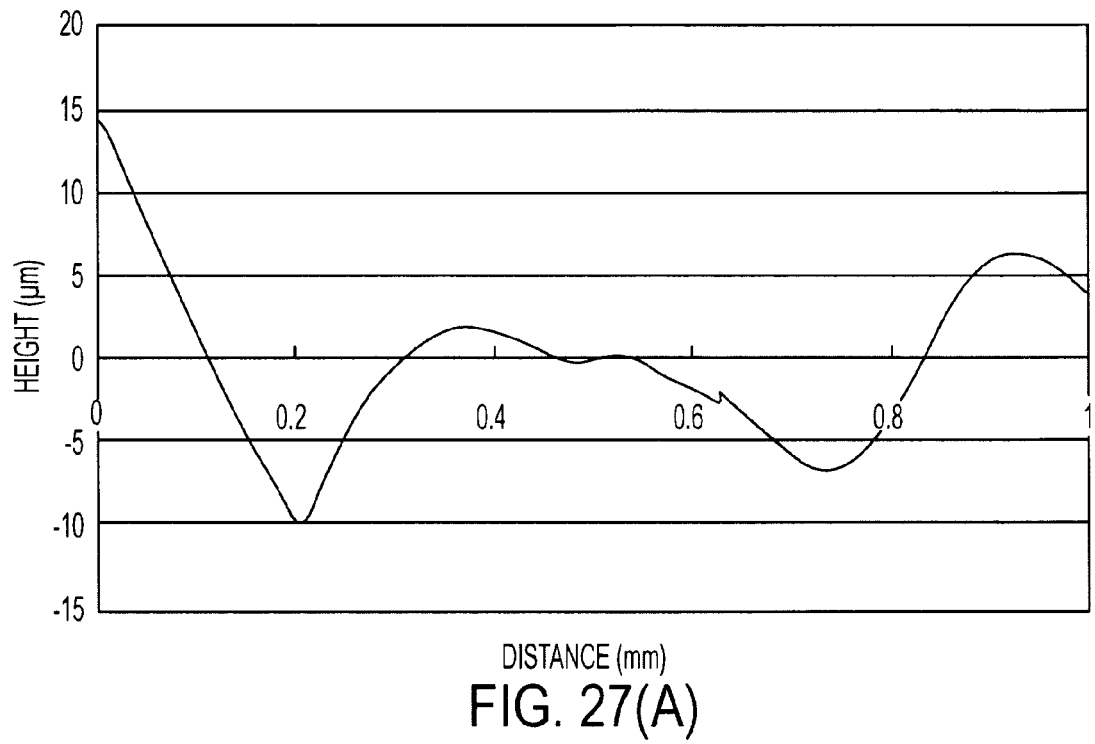
FIG. 27 are graphs showing waviness of scattering layer surfaces, in which (A) is a graph showing waviness of the surface of a 60 µm-thick scattering layer and (B) is a graph showing waviness of the surface of a 60 µm-thick scattering layer prepared by polishing the scattering layer having a thickness of 20 µm.
Figure 27B:
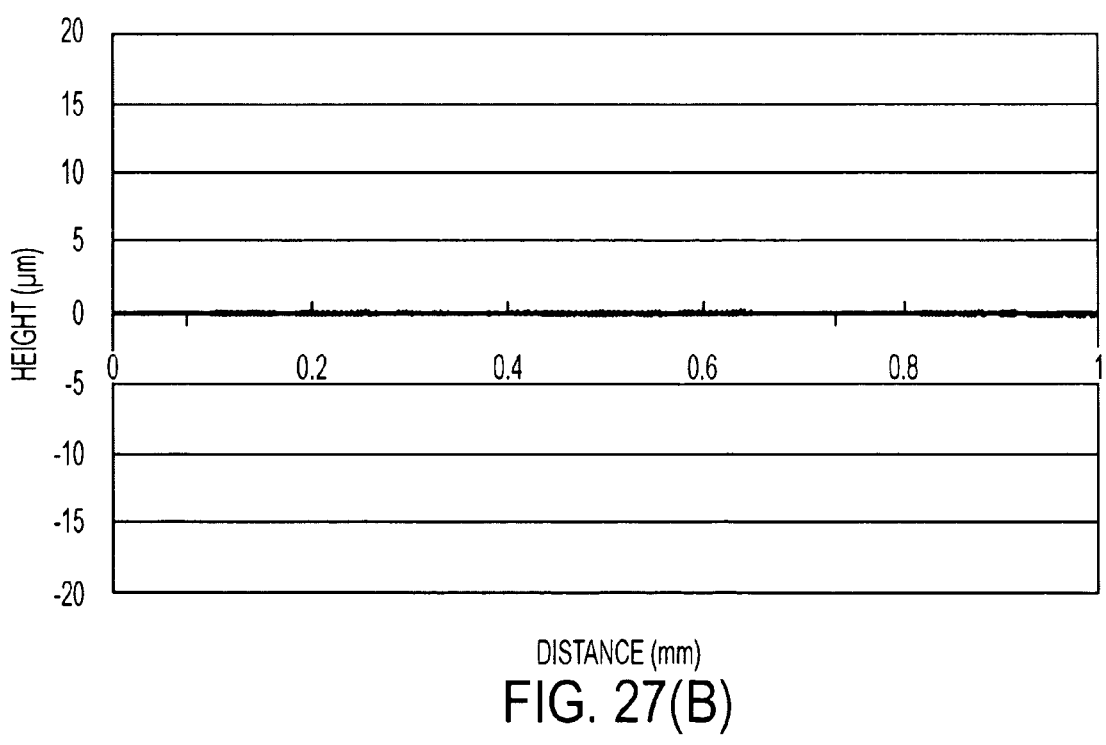
Figure 28:
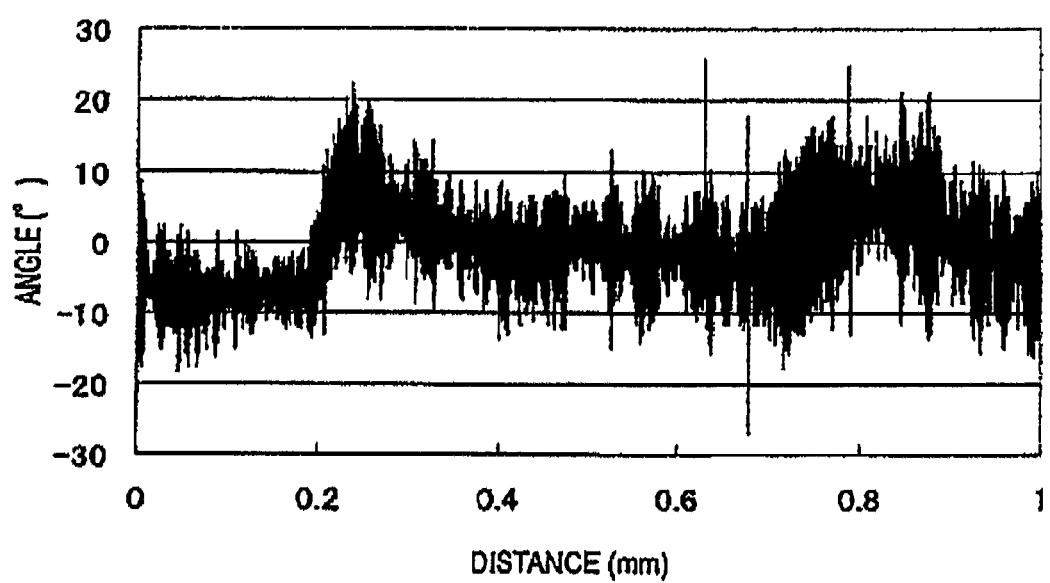
FIG. 28 is a graph showing the result of measuring the surface profile of a scattering layer by a surface roughness tester.
Figure 29A:
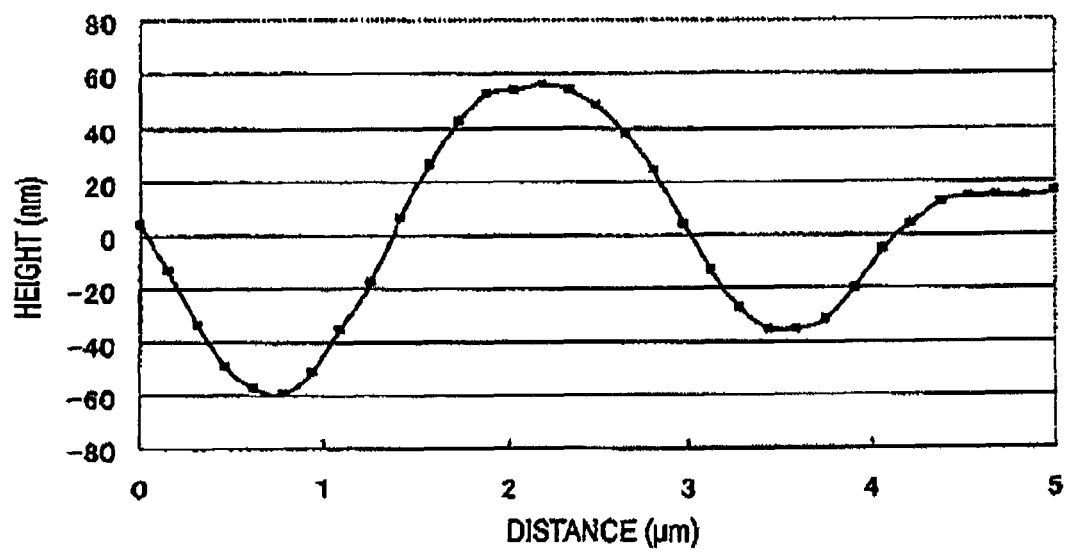
FIG. 29 are graphs showing results of measuring local roughness of scattering layer surfaces, in which (A) shows the measurement result of the unpolished scattering layer surface and (B) shows the measurement result of the polished scattering layer surface.
Figure 29B:
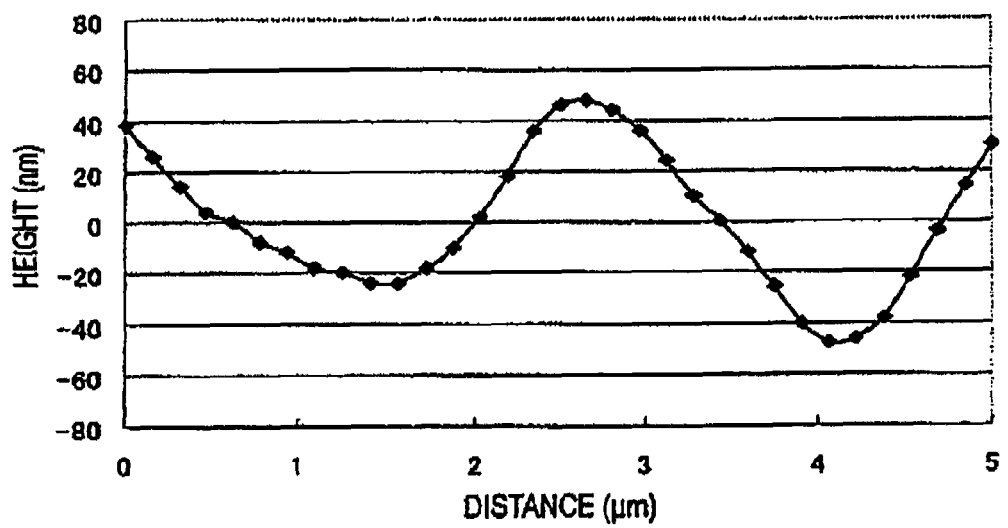

FIG. 27 include graphs showing waviness of the scattering layer surfaces. And FIG. 27(A) shows waviness of the surface of the scattering layer having the thickness of 60 μm, while FIG. 27(B) shows waviness of the surface obtained by polishing the scattering layer having the thickness of 120 μm until the thickness was reduced to 60 μm. FIG. 28 is a graph showing calculations of slope angles of the waviness shown in FIG. 27(A). The waviness shown in FIG. 27(A) and FIG. 27(B) were measured with a surface roughness meter (SURFCOM 1400D, made by TOKYO SEIMITSU CO., LTD.). The maximum slope angle of the waviness of the scattering layer is on the order of 27°, and this angle is smaller than a taper angle (40°-50°) of the edge portion of aperture insulation film used in a passive-type organic LED panel. Therefore, it is conceivable that such waviness does not interfere with coverage of organic film, metal film and the like. In addition, since no classification of glass particles was carried out in the making of frit and large particles were therefore mixed in the glass paste, it is thought that a cause of the waviness consists in large-particle portions remaining in the form of waviness at the time firing. Therefore, it is possible to adjust the degree of waviness to become small by making the sizes of particles small and uniform or become large by making the sizes of particles large, provided that the glass layers are formed under the same conditions except for the particle size. Additionally, examples of measurement results of local roughness are shown in FIG. 29. And FIG. 29(A) is a case of local roughness wherein polishing was not given to the scattering layer surface, while FIG. 29(B) is a case of local roughness wherein polishing was given to the scattering layer surface. The arithmetic average roughness Ra of the unpolished surface of the scattering layer was 31.0 nm, and the Ra of the polished surface of the scattering layer was 23.5 nm. As can be seen from FIG. 29, local projections are not observed on the scattering layer surface, and the measurement result of the unpolished surface of the scattering layer (FIG. 29(A)) and that of the mirror-polished surface of the scattering layer (FIG. 29(B)) are alike in uneven shape. This is because scattering matter is pores and pores are absent in the surface portion. In the case of mixing a scattering material in an organic material (e.g. using a resin as a base material and solid particles as a scattering material), the scattering material may be exposed at the surface, and it may be required to smoothen the asperity of the scattering material origin and thereby prevent a short circuit of an organic LED element.

As to the polished scattering layer, on the other hand, a smooth surface is formed.

The total light transmittance and haze value of each scattering-layer-provided substrate were measured. As a measurement instrument, a haze meter HGM-2, made by Suga Test Instruments Co., Ltd. was used. As a reference in the measurement, the glass substrate [PD200] was used as it was. Measurement results obtained are shown in Table 4.

TABLE 4

| Thickness of Scattering Layer (μm) | Total Light Transmittance (%) | Haze Value (%) |
|---|---|---|
| 15 | 97.9 | 66.3 |
| 30 | 85.1 | 72.5 |
| 60 | 83.1 | 76.1 |

As shown above, it is evident that the scattering ability increases with an increase in thickness of the scattering layer.

ITO film was formed by sputtering so as to have a thickness of 150 nm on both the scattering layer 1620 and a portion of the glass substrate 1610 on which the scattering layer was not formed. The sputtering was carried out at room temperature under conditions that Ar was 99.5 SCCM, $O_2$ was 0.5 SCCM, the pressure was 0.47 Pa and the input electric power was 2.35 W/cm$^2$. Thereafter, by use of vapor deposition apparatus, $Alq_3$ film 1640 was formed on the ITO film so as to have a thickness of 200 nm and Ag film 1650 was formed on the $Alq_3$ film so as to have a thickness of 70 nm. In this evaluation, the upper side of the Ag film 1650 was irradiated with ultraviolet light, and thereby excitation of the $Alq_3$ film 1640 was examined. When the thickness of Ag film 1650 is great, the film does not allow ultraviolet light to pass through it; while, when Ag film is too thin, the fluorescent light from the $Alq_3$ film 1640 is not reflected by the Ag film and passes through the Ag film. By adjusting the thickness of the Ag film 1650 to 70 nm, in the case of ultraviolet light with a wavelength of 320 nm, it became possible to allow about 25% of the light incident on the Ag film to pass through the film, and on the other hand, it became possible to control the proportion of the fluorescent light having passed through the Ag film to 1% or below. Although the $Alq_3$ film 1640 is excited by the ultraviolet light incident from the Ag film's side and thereby emit rays of light, the rays emitted toward the side of the glass substrate 1610 causes, on the side near the Ag film 1650, interference with the rays emitted to the side of the Ag film 1650, reflected by Ag and made to travel toward the side of the glass substrate, and thereby these rays are weakened each other. This is because, though the optical-path difference is small, the reflection by Ag causes a phase shift on the order of $\pi$. It became possible to solve this problem by adjusting the thickness of $Alq_3$ film 1640 to be 200 nm on the thick side and to raise a measurement value of emission-light luminance.

Figure 30:
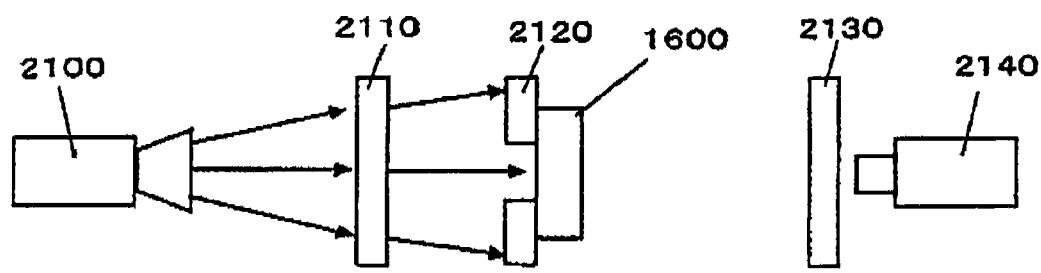
FIG. 30 is a block diagram showing a configuration of an evaluation system for evaluating light emission characteristics.

On the evaluation element made in the foregoing manner, emission light characteristics were evaluated at once. A method of measuring and evaluating the luminance of emission light is shown in FIG. 30. As a light source for excitation, a mercury xenon lamp made by ASAHI GLASS CO., LTD. (trade name: SUNCURE202-LS) was used. Light from the light source includes a visible portion, and this visible portion was removed by the use of a visible light filter 2110. Before the evaluation element 1600, an aperture (15 mm×10 mm) 2120 made of stainless steel was placed, and thereby shaping of ultraviolet beams was performed. Part of ultraviolet beams incident on the evaluation element 1600 passed through the Ag film 1650, excited the $Alq_3$ film 1640 and made the film 1640 give off fluorescence. Both the region in which the evaluation element 1600 had the scattering layer and the region in which the evaluation element 1600 had no scattering layer were irradiated with the ultraviolet beams, and the fluorescence luminance in each region was measured with a luminance meter 2140. The luminance meter used was a product of Konica Minolta Holdings, Inc. (trade name: LS-110), and an ultraviolet filter 2130 was introduced in front of the luminance meter.

Figure 31:
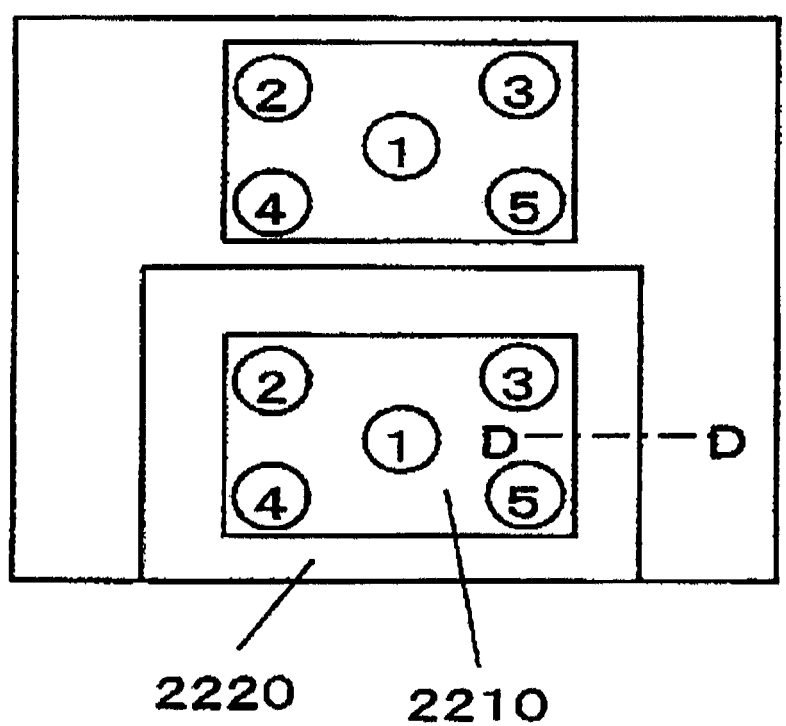
FIG. 31 is a block diagram showing measuring points.
Figure 32:
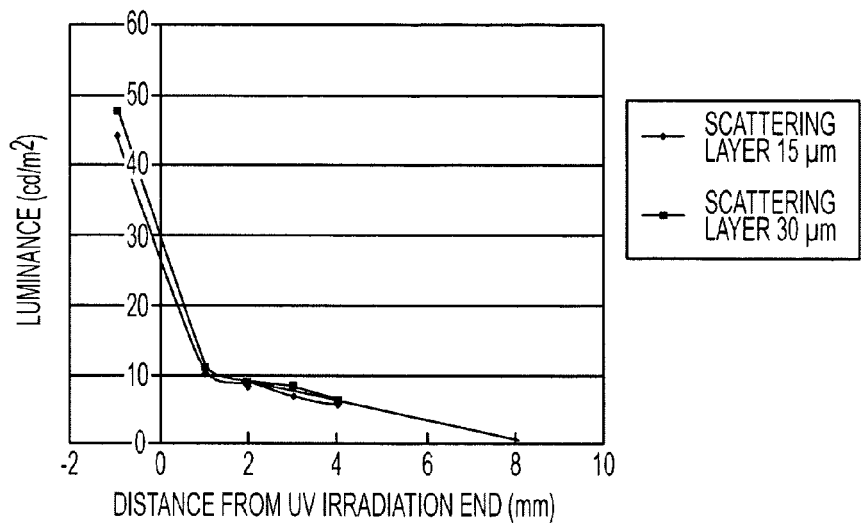
FIG. 32 is a graph showing distribution of luminance in a central light-emission range 2210 and a peripheral light-emission range 2220.

Measuring points are shown with a drawing. FIG. 31 is a drawing corresponding to FIG. 26. In each UV-irradiated area, as shown in FIG. 31, the measuring points are 5 points in total, namely points at the center and 4 corners. While the fluoresce emission range is the same as the UV-irradiated area in the portion without the scattering layer 1620, the fluorescence emission range in the portion with the scattering layer 1620 is divided into two ranges, namely a central intense-emission range 2210 which corresponds to the UV-irradiated area and a peripheral emission range 2220 situated on the outside thereof, wherein the fluorescence emission decreases in intensity as the periphery approaches. Examples of luminance distributions in the central emission range 2210 and the peripheral emission range 2220, respectively, are shown in FIG. 32. Luminance measurements in here were carried out along the D-D line. In the case where the scattering layer is present, as can be seen from FIG. 32, light can be extracted from not only the fluorescence emission range (central emission range 2210) but also the peripheral range thereof. Thus, it can be said that, when used for lighting, the present organic LED element produces high-luminance effect, as compared with organic LED element currently in use.

Figure 33:
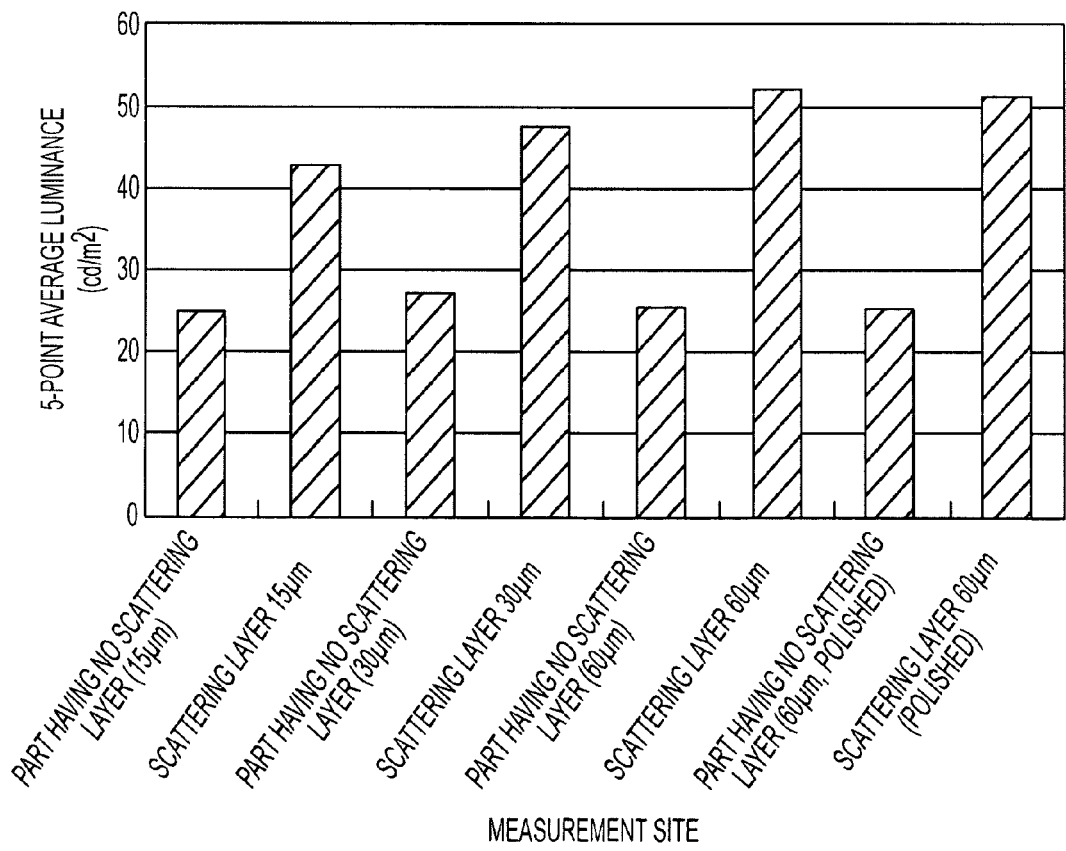
FIG. 33 is a graph showing the average of frontal luminance values at 5 measuring points in each of individual cases where the scattering layers are different in thickness.

FIG. 33 shows an average frontal luminance at 5 measuring points in each of the cases where the scattering layers had different thicknesses (15 μm, 30 μm, 60 μm and 60 μm after polishing), respectively. As can be seen from the graph, the frontal luminance increased with an increase in thickness of the scattering layer. In addition, the luminance in the case of having the polished scattering layer 60 μm in thickness was almost equivalent to the luminance in the case of having the unpolished one. From these experimental results, it is thought that these increases in luminance are not attributable to the surface waviness, but are mainly attributable to scattering caused by the present pores-containing high-refractive-index glass layer.

Figure 34:
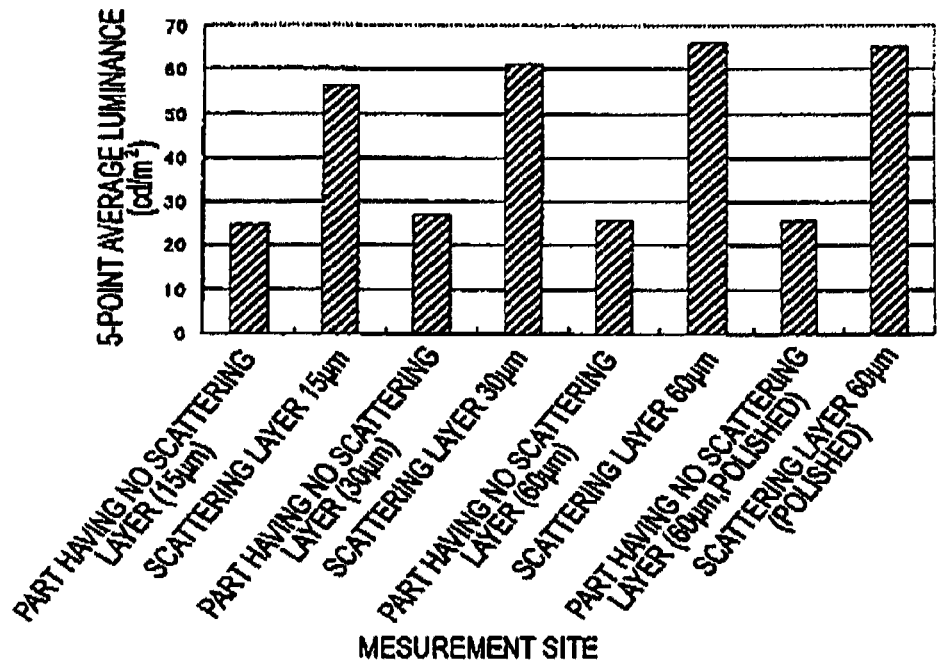
FIG. 34 is a graph showing luminance after correcting each 5-point average value for the quantity of light measured in the peripheral light-emission range in each of individual cases where the scattering layers are different in thickness.

In actuality, there was the peripheral emission range 2220 as mentioned above. The luminance of light extracted from the peripheral range, as shown in FIG. 32, decreases with increasing distance from the central emission range and reaches to almost zero at the distance of about 8 mm from the end of the central emission range. When we think of a product to which the invention is applied, we can therefore say with safety that the light extracted from the peripheral emission range is also regarded as an extractable ray bundle as long as the product is sufficiently larger than the value of 8 mm in size of its emission range. FIG. 34 shows 5-point average luminance values corrected for light quantities measured in individual peripheral emission ranges of the scattering layers various in their thicknesses (15 μm, 30 μm, 60 μm and 60 μm after polishing). More specifically, the correction was carried out by measuring luminance distribution in each peripheral emission range, calculating the quantity of the total ray bundle, dividing the value thus calculated by the area of the central emission range, and adding the divided value to the luminance in the central emission range. In the region provided with no scattering layer, there was no peripheral emission range. Thus it is understood that the frontal luminance ratio between regions with and without a scattering layer became larger.

Figure 35:
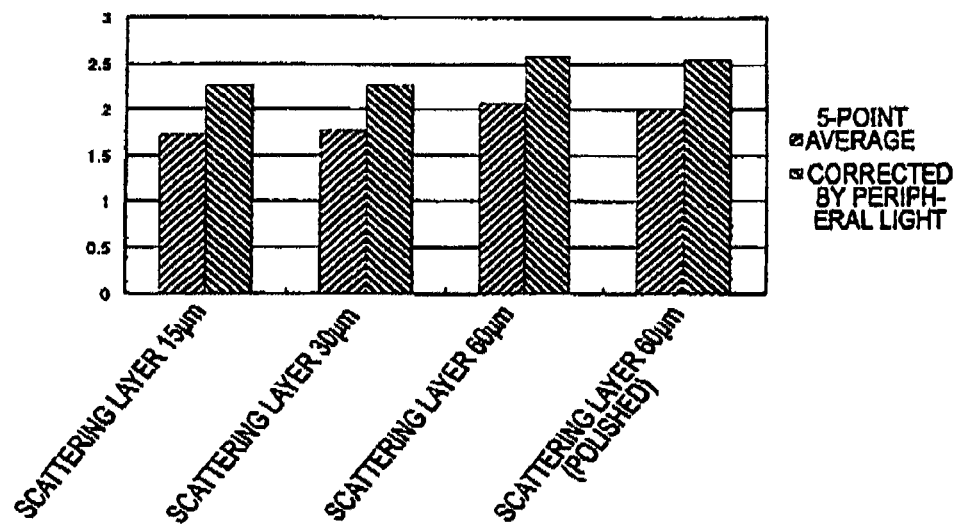
FIG. 35 is a graph showing a ratio between frontal luminance in the part having no scattering layer and that in the part having a scattering layer of each evaluation element.

FIG. 35 shows the frontal luminance ratio between the regions without and with the scattering layer in each evaluation element. In this way, the insertion of the present scattering layers each allows a frontal luminance 1.7 to 2.0 times as high as the frontal luminance obtained in the case of inserting no scattering layer even when the UV-irradiated area alone was taken into account, and it can be estimated that the frontal luminance reaches to 2.2 to 2.5 times when the peripheral emission range also was taken into account.

Figure 36:
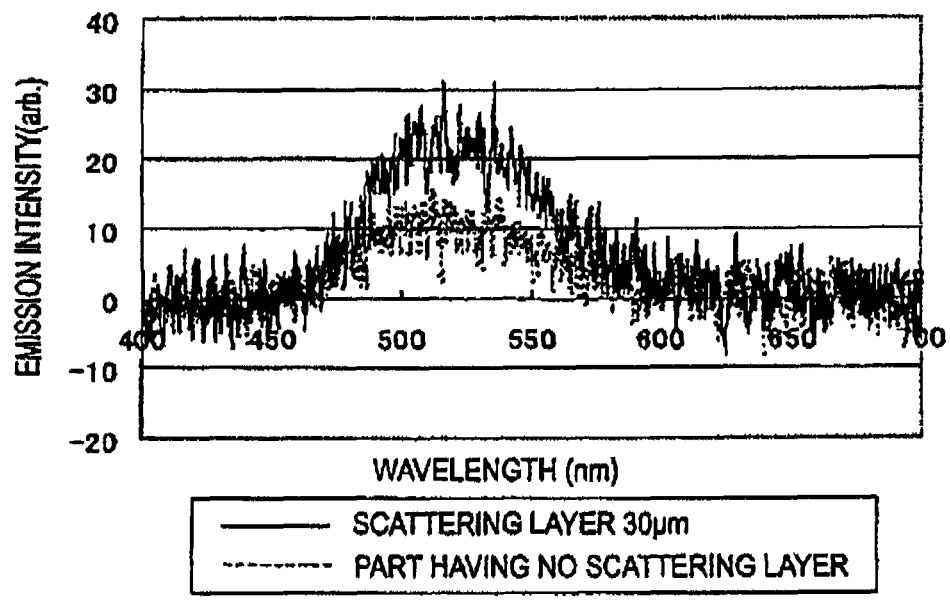
FIG. 36 is a graph showing results of measuring fluorescence spectra in the part having a scattering layer and in the part having no scattering layer.
Figure 37:
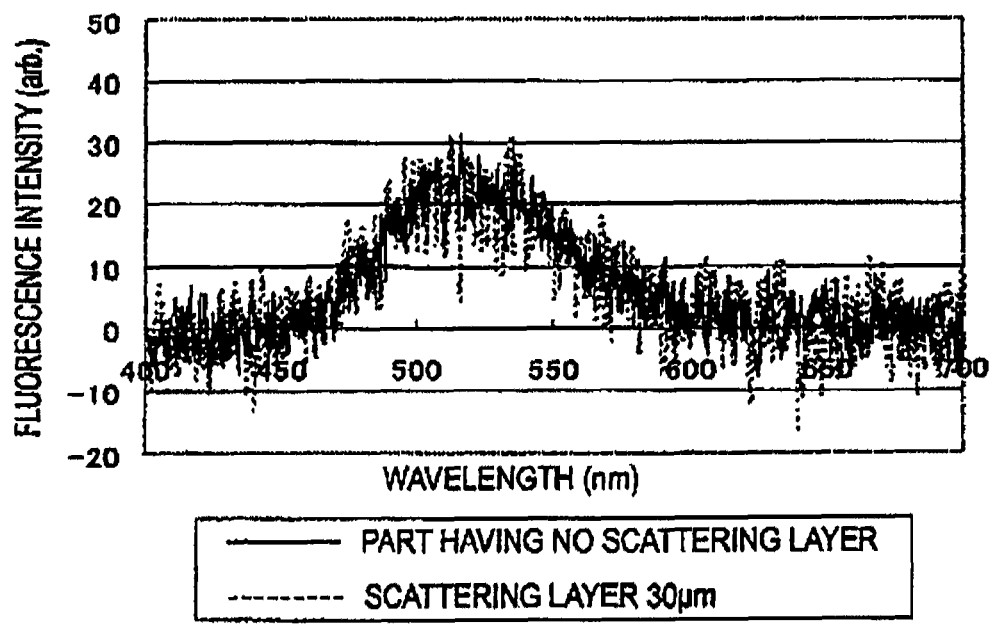
FIG. 37 is a graph obtained by doubling the intensity of the fluorescence spectrum in the part having no scattering layer and overwriting the fluorescence spectrum in the part having a scattering layer with the spectrum doubled in intensity.

Next, fluorescence spectra in the regions with and without the scattering layer (thickness: 30 μm) were taken with a fluorometer made by Hitachi High-Technology Corporation (trade name: F4500). The measurement results are shown in FIG. 36. And a graph obtained by doubling the intensity of the fluorescence spectrum in the region without the scattering layer and overwriting the spectrum doubled in intensity with the fluorescence spectrum in the region with the scattering layer is shown in FIG. 37. As is evident from FIG. 36 and FIG. 37, the spectral shapes in the region with the scattering layer and in the region without the scattering layer are almost the same, and the emission intensity in the region with the scattering layer is almost twice the emission intensity in the region without the scattering layer. As a result, though there are cases where a change in emission spectrum is caused by interference arising inside an organic LED element to result in a luminance change, it can be said that here is no influence of such interference.

Figure 38:
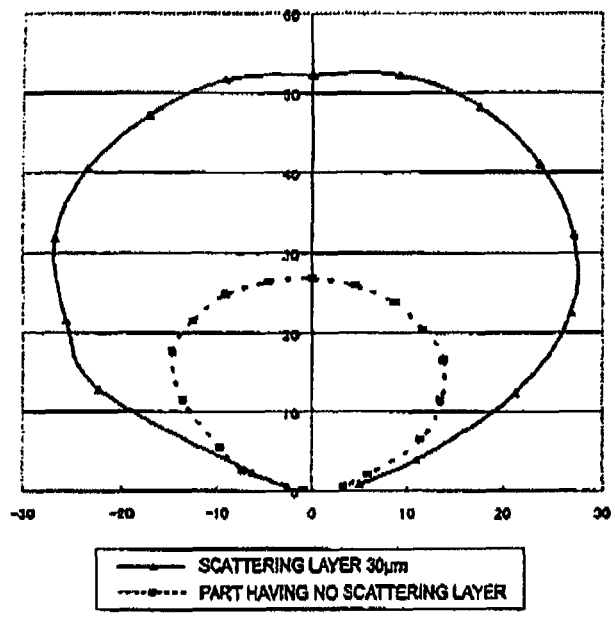
FIG. 38 is a graph showing results of measuring direction dependency of luminous intensity.
Figure 39:
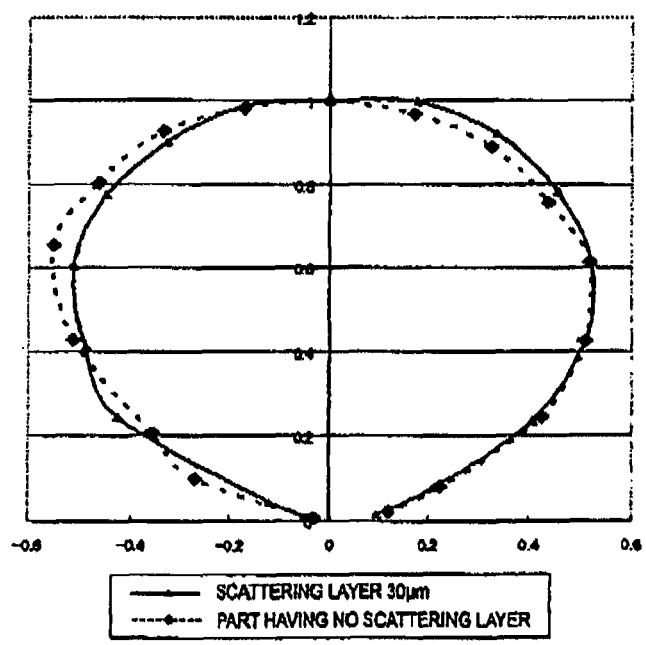
FIG. 39 is a graph obtained by normalizing the data shown in FIG. 38 with the front luminous intensity.

Then, directional dependence of luminous intensity was measured. The measurement method used here is the same method as FIG. 30 shows, and luminance measurements were carried out as the position of the luminance meter was altered, and from the readings obtained the luminous intensities were calculated. The measurement results are shown in FIG. 28. FIG. 39 is a graph obtained by normalizing the data shown in FIG. 38 by the frontal luminous intensity. As shown in FIG. 39, the directional dependence of luminous intensity didn't vary depending on whether the scattering layer was present or absent, and thereby it was verified that the fluorescence emission was highly non-directional. By these data, it was possible to ascertain that the light-extraction efficiency improvement in the invention, which was found out in the frontal luminance, was achieved similarly in all the ray bundles also.

Further, the particle size distribution of pores in the scattering layer formed this time was determined. When the scattering layer has a thickness of 15 μm at the most, all pores in the scattering layer are distinguishable under a microscope. The pores present within a field of view of 90.5 μm×68.1 μm were distinguished and counted. Measurement results at 3 arbitrary points of the scattering layer are shown in Table 5.

TABLE 5

| Observation Point | Number of pores | Average Particle Size of pores (μm) | Number of pores per mm² |
|---|---|---|---|
| #1 | 598 | 1.3 | $1.07 \times 10^5$ |
| #2 | 934 | 1.33 | $1.51 \times 10^5$ |
| #3 | 1371 | 1.4 | $2.22 \times 10^5$ |

Figure 40:
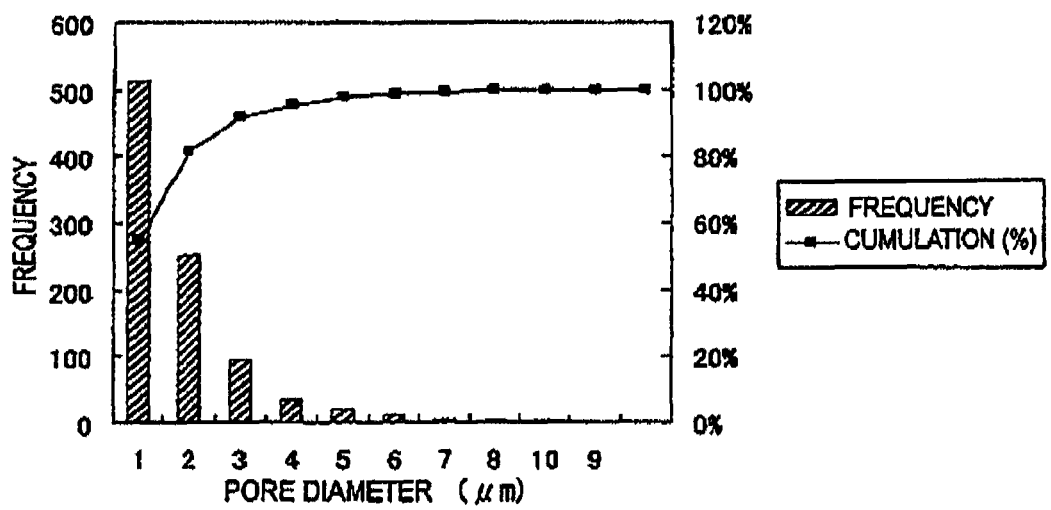
FIG. 40 is a graph showing a diameter distribution of pores.

In addition, the diameter distribution of pores at the measurement point #2 is shown in FIG. 40. As is evident from Table 5 and FIG. 40, pores measuring 2 μm or below in diameter were present in large numbers, and an average diameter, or an average particle size of pores, was 1.3-1.4 μm. And the number of pores per mm² of the scattering layer was from $1.1 \times 10^5$ to $2.2 \times 10^5$. According to calculations on a proportional basis from the foregoing measurement result (in the case of the scattering layer having a thickness of 15 μm), the number of pores in the case of the 30 μm-thick scattering layer is estimated to be from $2.2 \times 10^5$ to $4.4 \times 10^5$ and the number of pores in the case of the 60 μm-thick scattering layer is estimated to be from $4.4 \times 10^5$ to $8.8 \times 10^5$.

Figure 41:
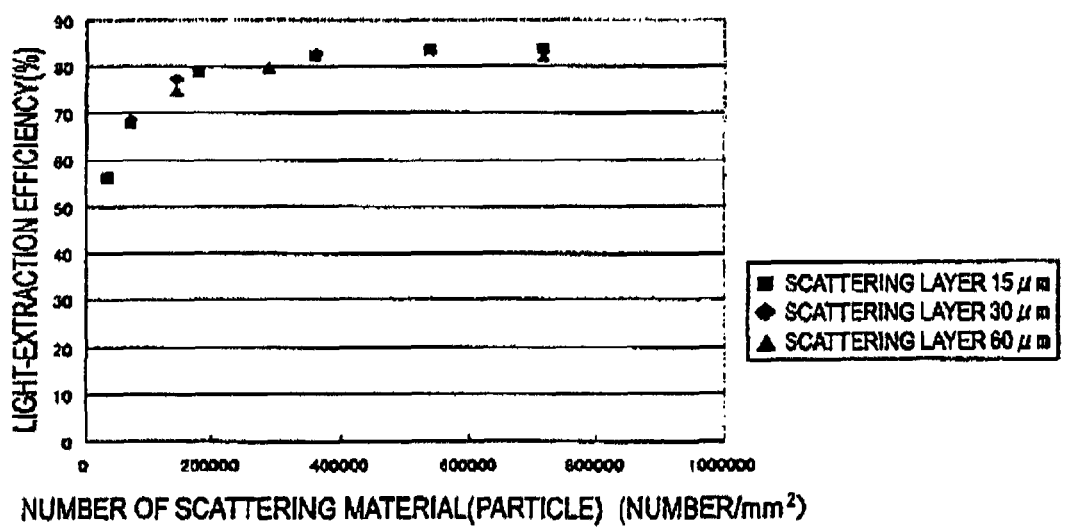
FIG. 41 is a graph illustrating comparison of the measurement result obtained this time with the relationship of light-extraction efficiency to the number of pores (scattering materials) per $mm^2$ in a case where the pore diameter is 2 μm.

FIG. 41 shows a comparison between the measurement results obtained this time and the relationship between light-extraction coefficient and number of pores per mm² in the case where the pore diameter is 2 μm. By putting the measurement results shown in FIG. 41 in contrast with the simulation results shown in FIG. 14, it was revealed that the results brought about by the evaluation elements were similar to the simulation results. To be concrete, when the scattering layer thickness is 15 μm, the number of pores is not enough and the light-extraction efficiency is insufficient. When the scattering layer thickness is 60 μm, the light-extraction efficiency is in the saturation region.

Figure 42:
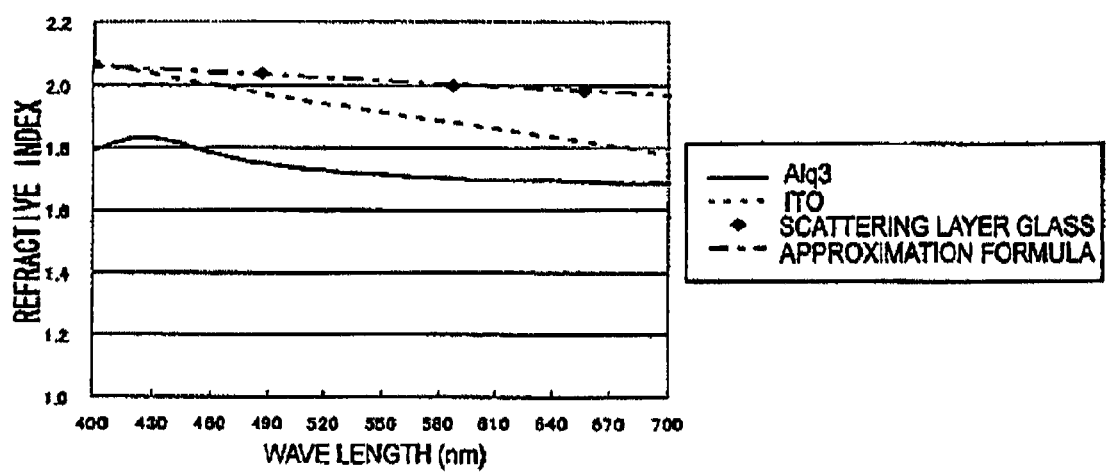
FIG. 42 is a graph showing refractive indexes of glass, ITO film and $Alq_3$ film used for the scattering layers in evaluation experiments.

FIG. 42 shows refractive indexes of the glass for the scattering layer, the ITO film and the $Alq_3$ film used in this example. As the refractive indexes of the ITO film in here, data of like one formed at room temperature were adopted. The wavelengths of light emitted from the $Alq_3$ film are on the order of 430 nm to 670 nm. Over the full range of these wavelengths, the magnitude relations among refractive indexes of those constituents are as follows: glass for scattering layer>ITO film>$Alq_3$ film. Therefore it is considered that losses of light due to propagation into the insides of the $Alq_3$ film and the ITO film are not caused. In addition, as causes of losses of light-extraction efficiency, the reflectivity of the Ag film and absorption of light by the $Alq_3$ film, the ITO film, the scattering layer glass and the substrate glass are conceivable. When the refractive index and damping coefficient of Ag and those of $Alq_3$ at 520 nm which is the peak wavelength of light emission from $Alq_3$ are taken as (n1, k1) and (n2, k2), respectively, the vertical reflectivity at the interface between Ag and $Alq_3$ is expressed as $((n1-n2)^2+(k1-k2)^2)/((n1+n2)^2+(k1+k2)^2)$. With the values n1=0.129, k1=3.25, n2=1.728, k2=0.0016 being assigned, the reflectivity becomes on the order of 93%. The light-extraction efficiency at this time is estimated to be of the order of 60% from the graph in the case where scattering materials are present of FIG. 16, provided that there are no other losses. However, in the case where the thickness of the scattering layer formed this time was 60 μm, the total light transmittance was a low 83%, and therefore a loss caused by the scattering layer is estimated to be on an unignorable level. With the assumption that the optical path in the scattering layer, though remains uncertain in reality, is of the order of 1 mm, the loss due to 17% absorption can be estimated to be on the order of 12% from the foregoing simulation result. By multiplying the reflection loss of the Ag film and the loss caused by the scattering layer glass together, the light-extraction efficiency becomes 60%×(100−12)%=53%. Assuming that the light-extraction efficiency in the scattering-layer-free case is 20%, the light-extraction efficiency of 53% is 2.65 times that in the untreated case, and this value is in close agreement with 2.5 times comparable to the case where the peripheral diffusion light is also taken into account. For the purpose of improving the light-extraction efficiency lowered by the reflection loss of the Ag film and the losses in the scattering layer glass, it is thought to be effective that not only the reflectivity of the reflective electrode and the transmittance of the scattering glass layer are enhanced but also the reflectivity at the interface between the glass substrate and the air is lowered. As a concrete example thereof, formation of an antireflective coating on the outermost surface of the glass substrate is given. By applying the invention in this manner, light propagating into the insides of the organic layer and the translucent electrode becomes possible to extract to the outside.

Example 2

Experimental Proof of Smoothness of Main Surface of Scattering Layer

The following is an explanation of experimental proof that it is effective for a scattering layer to have not only waviness on the main surface but also smoothness (surface roughness Ra (arithmetic average roughness) of 30 nm or below) in enhancing light-extraction efficiency.

First a glass substrate PD200 manufactured by Asahi Glass Co., Ltd. was prepared for the glass substrate. The scattering layer was made in the following manner. A powdery raw material was prepared so as to have the composition shown in Table 6, melted in a 1,100° C. electric furnace, and cast to a roll. Thereby glass flakes were obtained. This glass has a glass transition temperature of 499° C., a deformation point of 545° C. and a thermal expansion coefficient of $74 \times 10^{-7}$ (1/° C.) (average value in a temperature range of 100° C. to 300° C.). Further, this glass has a refractive index nF of 2.0448 in relation to F-ray (486.13 nm), a refractive index nd of 2.0065 in relation to d-ray (587.56 nm) and a refractive index nC of 1.9918 in relation to C-ray (656.27 nm). Methods used for measuring the refractive index, the glass transition temperature and the glass deformation point were the same ones as described hereinbefore.

TABLE 6

|  | Mass % | Mol % |
| --- | --- | --- |
| $P_2O_5$ | 16.4 | 23.1 |
| $B_2O_3$ | 4.2 | 12 |
| $Li_2O$ | 1.7 | 11.6 |
| $Na_2O$ | 0 | 0 |
| $K_2O$ | 0 | 0 |
| $Bi_2O_3$ | 38.7 | 16.6 |
| $TiO_2$ | 3.5 | 8.7 |
| $Nb_2O_5$ | 23.4 | 17.6 |
| $WO_3$ | 12.1 | 10.4 |

Further, the flakes thus obtained were ground for 2 hours with a planetary mill made from zirconia, and shifted through a sieve, thereby preparing glass powder. In the particle size distribution of this glass powder, $D_{50}$ was 0.905 μm, $D_{10}$ was 0.398 μm and $D_{90}$ was 3.024 μm. Then, a 20 g portion of the glass powder obtained was kneaded with 7.6 g of an organic vehicle, thereby preparing glass paste. This glass paste was printed uniformly on the glass substrate so as to form a circle having a diameter of 10 mm and an after-firing thickness of 15 μm, and then dried at 150° C. for 30 minutes. Thereafter, the temperature of the printed layer was once restored to room temperature, and then the temperature was increased to 450° C. over 45 minutes, and kept and fired at 450° C. for 30 minutes. Thereafter, the temperature was further increased to 550° C. over 12 minutes, and kept at 550° C. for 30 minutes. Then, the temperature was lowered to room temperature over 3 hours. Thus, a scattering layer was formed on the glass substrate. In addition, other scattering layers were made under the same temperature profile, except that the keeping-and-firing temperatures were adjusted to 570° C. and 580° C., respectively.

Figure 43:
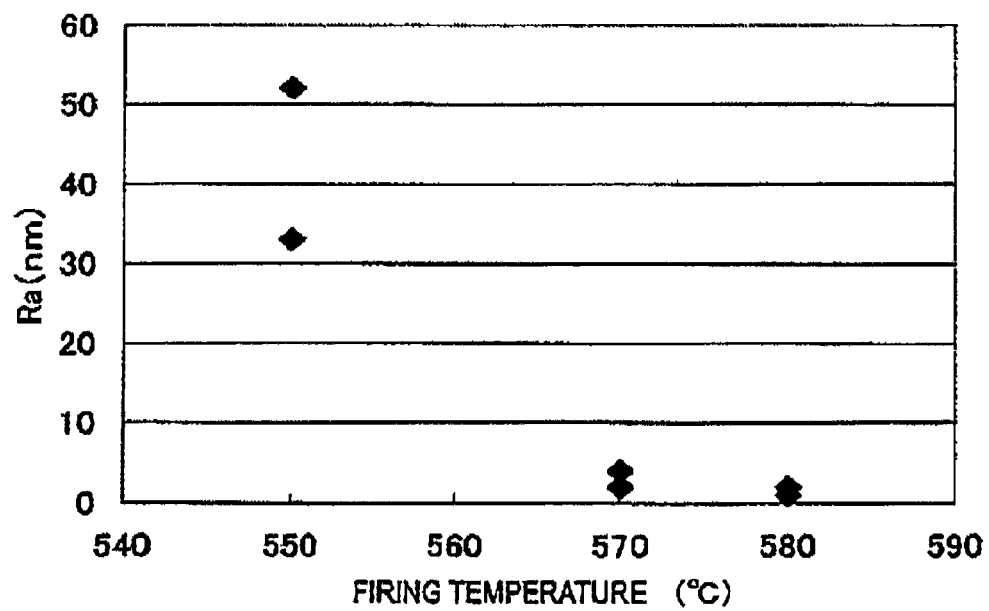
FIG. 43 is a diagram showing results of determining the relationship of surface roughness to firing temperature of the scattering layer of the translucent substrate in Example 2 of the invention.

Next, surface roughness of each of these scattering layers was measured. For surface roughness measurements, a non-contact three-dimensional surface profile measuring system Micromap made by Ryoka Systems Inc. was used. Measurements were made at two points situated near the center of each circular scattering layer, and the measuring region was within a square having a side length of 30 μm. And the cut-off wavelength of waviness was taken as 10 μm. As long as the unevenness has a period of 10 μm or longer, it is thought that films formed by the use of sputtering, vapor deposition, spin coating, spray coating and like techniques, respectively, which have been applied to the formation of organic LED elements, can sufficiently follow the unevenness. As to the unevenness having a period smaller than 10 μm, it is considered that there are cases where sufficient coverage cannot be attained by vapor deposition or the like. FIG. 43 shows arithmetic-average surface roughness (Ra) values of the scattering layers fired at different temperatures. The scattering layer fired at 550° C. is insufficient in firing, and it occurs that the shape of pores in the scattering layer is not spherical or the scattering layer surface gets rough. Therefore, troubles including a short circuit between electrodes tend to occur when an element is formed on such a scattering layer. In contrast to this, pores in the scattering layers fired at 570° C. and 580° C., respectively, are spherical in shape, and besides, the surfaces of these layers are smooth.

The total light transmittance and haze value of each of the thus made scattering-layer-provided glass substrates were found to be 77.8 and 85.2, respectively. The device used for these measurements was a haze computer made by Suga Test Instruments Co., Ltd. (trade name: HZ-2), and an untreated plate of the glass substrate PD200 was used as reference.

Figure 44:
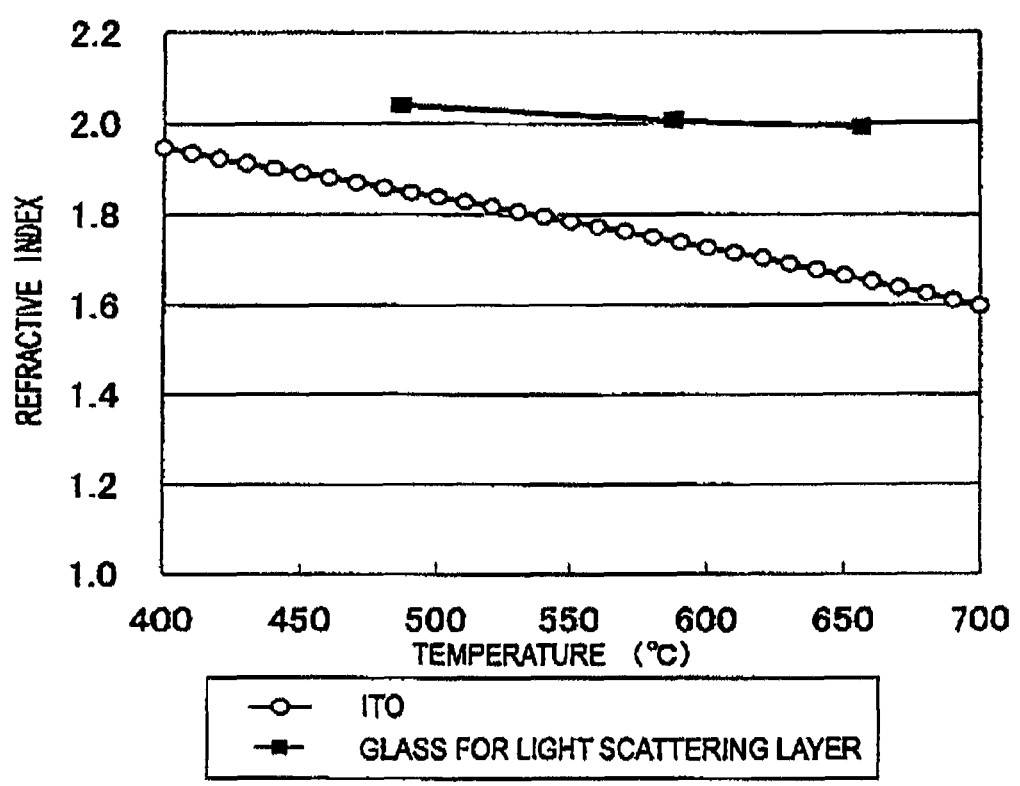
FIG. 44 is a diagram showing results of determining the relationship of refractive index to firing temperature of the scattering layer of the translucent substrate made in Example 2 of the invention.

The glass substrates provided with the scattering layers in the foregoing manners and the glass substrate PD200 provided with no scattering layer were prepared, and by the use of them organic LED elements were fabricated. To begin with, a translucent electrode was made by forming ITO into a mask film having a thickness of 150 nm by means of a DC magnetron sputter. Refractive indexes of the glass used for the scattering layers and ITO are shown in FIG. 44. Then the ITO mask film was subjected to ultrasonic cleaning with purified water, and subsequently to ultraviolet irradiation by means of an excimer UV generation device, thereby performing surface cleaning. Subsequently thereto, by the use of a vacuum evaporator, α-NPD (N,N'-diphenyl-N,N'-bis(1-naphthyl)-1,1'-biphenyl-4,4"-diamine) was vapor-deposited to a thickness of 100 nm, $Alq_3$ (tris(8-hydroquinoline)aluminum) to a thickness of 60 nm, LiF to a thickness of 0.5 nm, and Al to a thickness of 80 nm. At this time, each of the α-NPD layer and the $Alq_a$ layer was shaped into a circular pattern 12 mm in diameter by use of a mask, while LiF and Al layers were each shaped into a pattern by use of a mask having a region of 2 mm square on the ITO pattern via the organic layers. In this way, fabrication of elements was completed.

Thereafter, PD200 having a hollow formed by sand blasting and a coating of photosensitive epoxy resin for use in peripheral sealing on a bank around the hollow was prepared as an opposed substrate. Next the element-mounted substrate and the opposed substrate were placed in a glove box, a CaO-containing desiccant was stuck to the hollow of the opposed substrate, and then the element-mounted substrate and the opposed substrate were bonded together, and further the resin for peripheral sealing use was cured by irradiation with ultraviolet rays. The condition of inter-electrode short circuit occurrence in each element is shown in Table 7. The term "self-healing" as used here means that, when an overcurrent of 10 mA is passed through the element, regions short-circuited heal up by themselves under the joule heat generated by passage of the overcurrent.

TABLE 7

| Firing Temperature | Condition of Inter-electrode Short Circuit | Remarks |
| --- | --- | --- |
| 550° C. | Δ to x | When Ra was 52 nm, a short circuit occurred, and self-healing was impossible. When Ra was 33 nm, a short circuit occurred, but self-healing was possible. |
| 570° C. | ○ | No short circuit occurred. |
| 580° C. | ○ | No short circuit occurred. |

Figure 45:
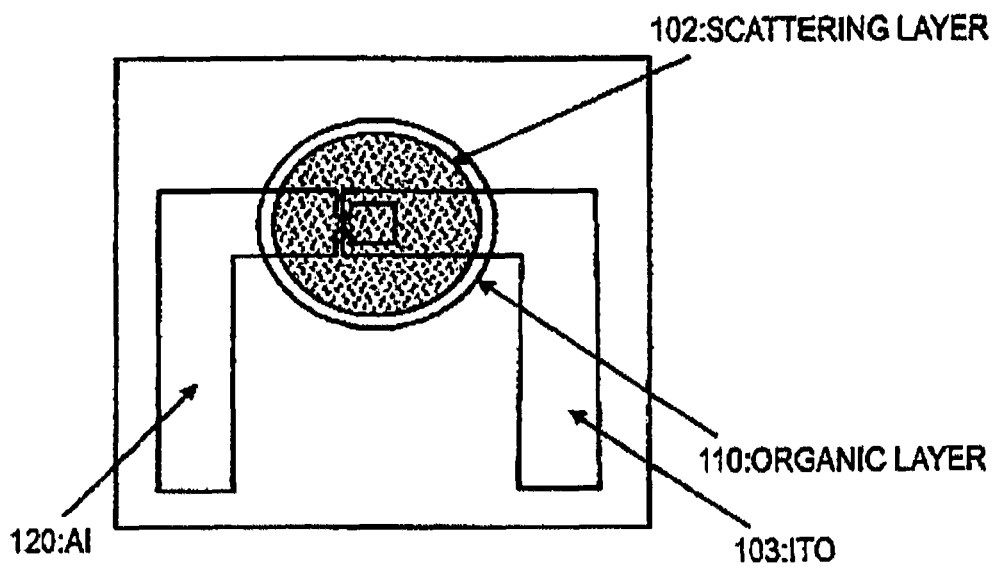
FIG. 45 is a diagram showing the state of light emission from the organic LED element formed using the translucent substrate made in Example 2 of the invention.
Figure 46:
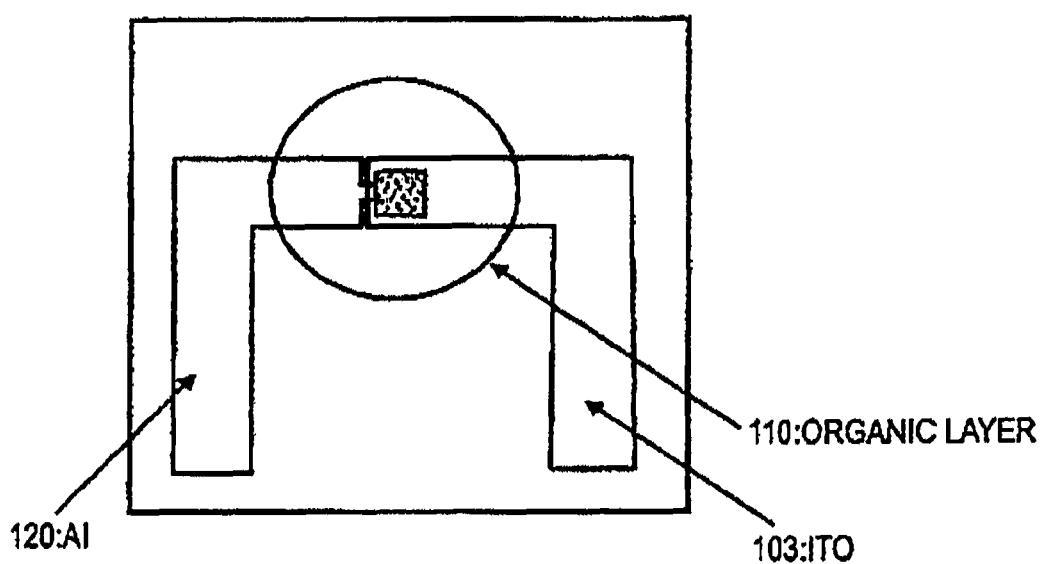
FIG. 46 is a diagram showing the state of light emission from the organic LED element formed using the translucent substrate made in Comparative Example.

Appearances of light emission from elements are shown in FIG. 45 and FIG. 46. More specifically, an element provided with each scattering layer is shown in FIG. 45, and an element provided with no scattering layer is shown in FIG. 46. As to the element provided with no scattering layer, it is ascertained that light is emitted only from a region of about 2 mm square in which the ITO pattern and the Al pattern intersect with each other. As to the element mounted on each scattering layer, it is detected that light is being extracted to the air from not only the about the region of 2 mm square but also its peripheral scattering-layer-formed portion.

Figure 47:
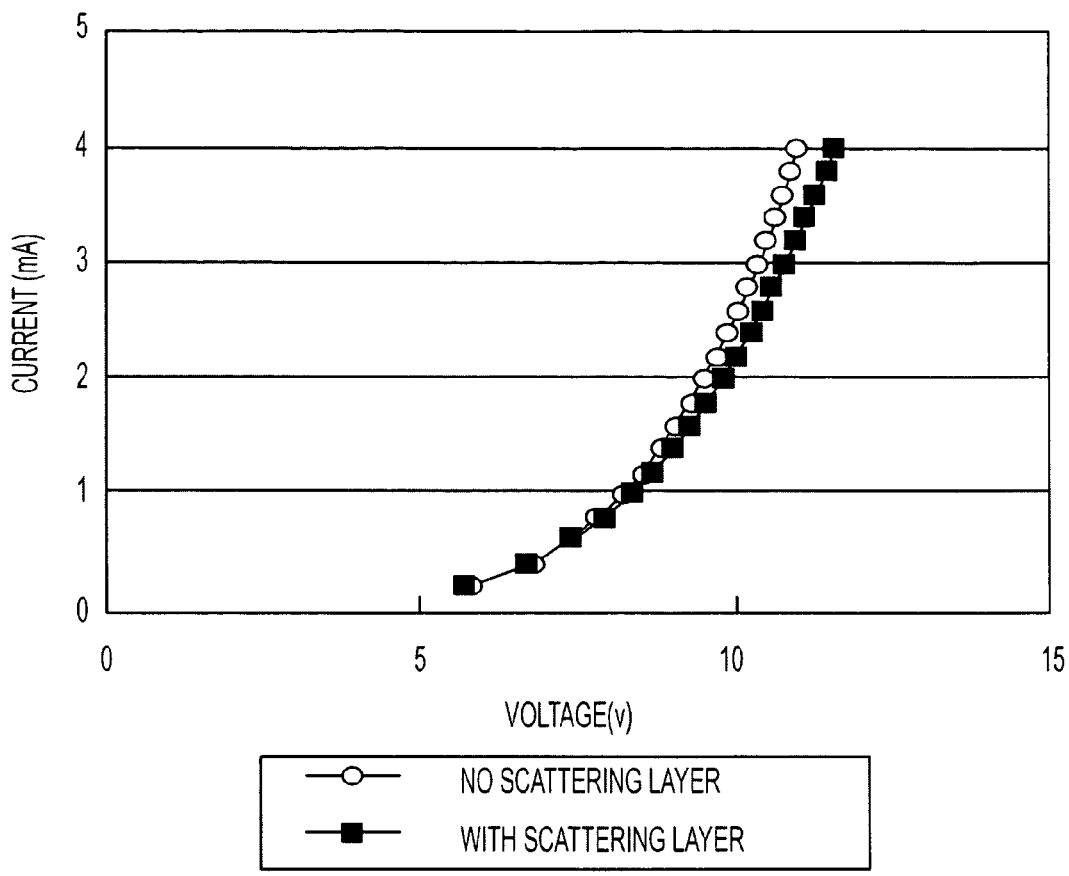
FIG. 47 is a diagram showing voltage-current characteristics of the organic LED elements in Example 2 of the invention and Comparative Example.
Figure 48:
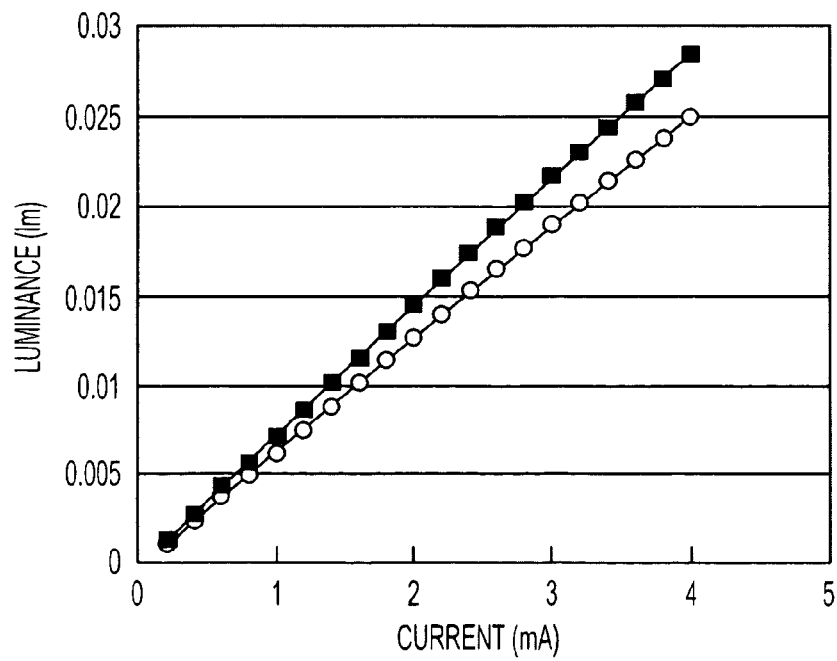
FIG. 48 is a diagram showing current-luminance characteristics of the organic LED elements in Example 2 of the invention and Comparative Example.

Thereafter, characteristic evaluations were performed on the element provided with the scattering layer fired at 570° C. Measurements of all the ray bundles were made by an EL characteristics measuring instrument C9920-12 made by Hamamatsu Photonics K.K. Current-voltage characteristics of the elements with and without the scattering layer are shown in FIG. 47. As shown in FIG. 47, these elements have characteristics on almost the same level, and it is evident that a large leakage current is absent even in the element formed on the scattering layer. Next, current-luminance characteristics are shown in FIG. 48. As shown in FIG. 48, the quantity of ray bundles is proportional to the amount of current irrespective of the presence or absence of the scattering layer, and the quantity of ray bundles in the case where the scattering layer is present increases by 15% as compared with that in the case where the scattering layer is absent. Such an increase indicates that, because the refractive index of the scattering layer is higher than the refractive index of ITO as the translucent electrode in the wavelength range of light emission from $Alq_3$ (from 450 μm to 700 μm) as shown in FIG. 44, EL light emitted from $Alq_3$ is inhibited from undergoing total internal reflection at the interface between the ITO and the scattering layer, and extracted to the air with efficiency.

Figure 49:
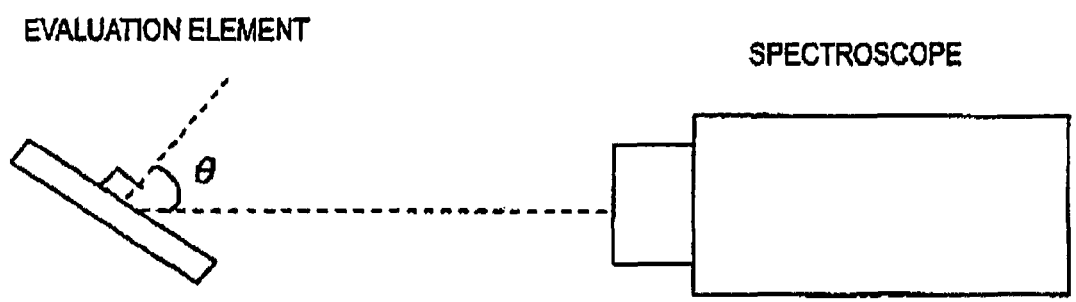
FIG. 49 is a diagram showing a measuring apparatus used for measuring angular dependences of luminance and color of emission light in Example 3 of the invention.

Next, angular dependence of color was evaluated. In optical measurements, a multichannel spectroscope (trade name: C10027) made by Hamamatsu Photonics K.K. was used. And the measurements were carried out as the element was rotated to the spectrometer, and thereby angular dependence of luminance and color of emission light was determined. As to the definition of "angle", the angle which the direction of the normal of the element forms with the direction extending from the element to the spectrometer is defined as the measuring angle θ[°] (FIG. 49). In other words, the measuring angle in a state that the spectrometer is placed so as to point toward the front of the element is taken as 0°.

Figure 50:
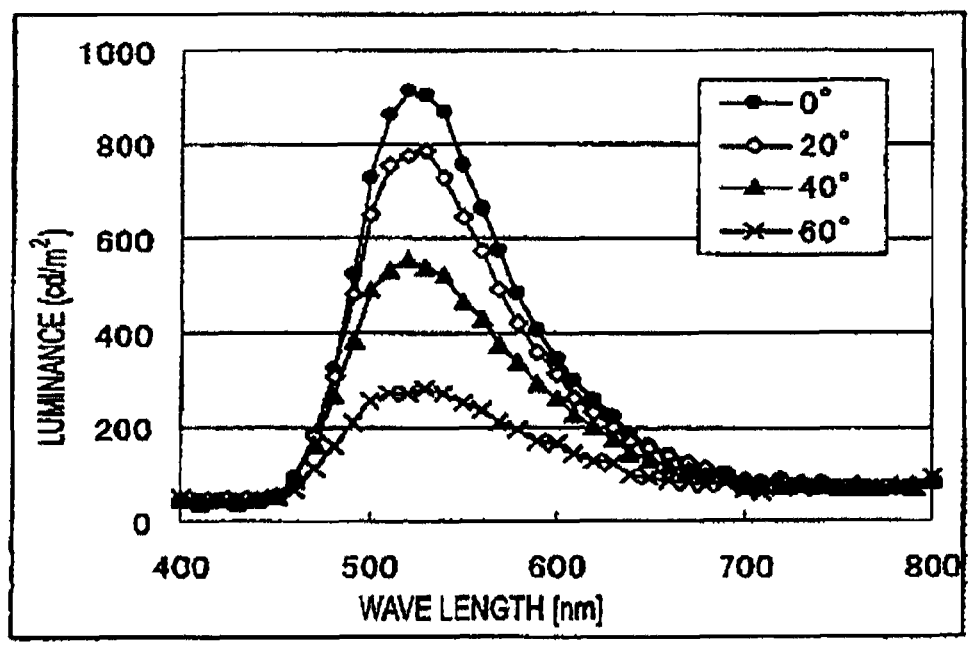
FIG. 50 is a diagram showing spectral data on angular dependences of luminance and color of emission light from the organic LED element in Comparative Example.
Figure 51:
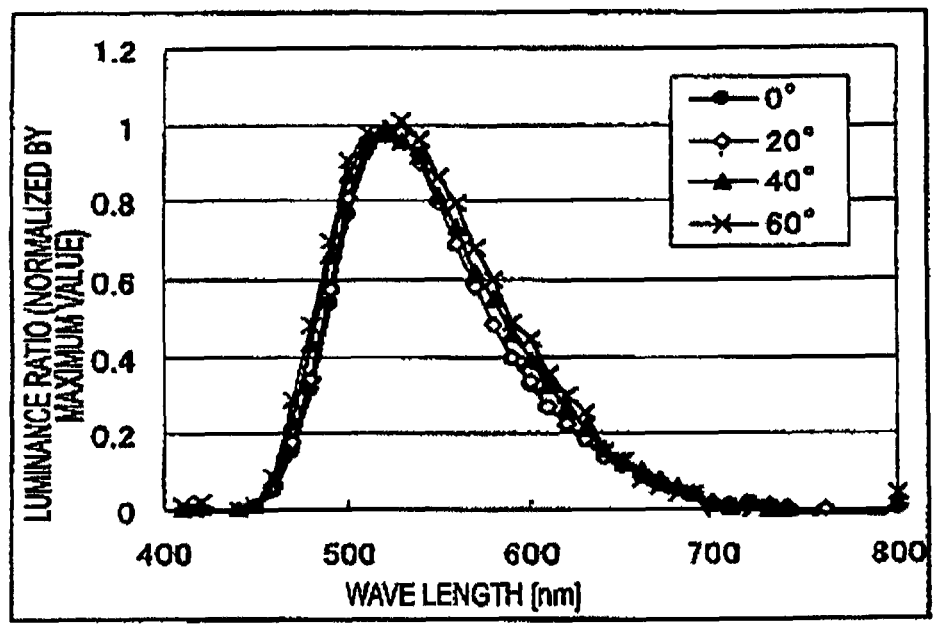
FIG. 51 is another diagram showing spectral data on the angular dependences of luminance and color of emission light from the organic LED element in Comparative Example.

Spectral data obtained are shown in FIGS. 50, 51, 52 and 53. FIG. 50 shows measurement results of the organic LED element without the scattering layer, and FIG. 51 shows the spectral data obtained by further normalizing the measurement results, with the luminance at the wavelength where the maximum luminance is attained at each of the measuring angles being taken as 1. As can be seen from FIG. 51, deviations are caused among the spectra depending on the measuring angle.

Figure 52:
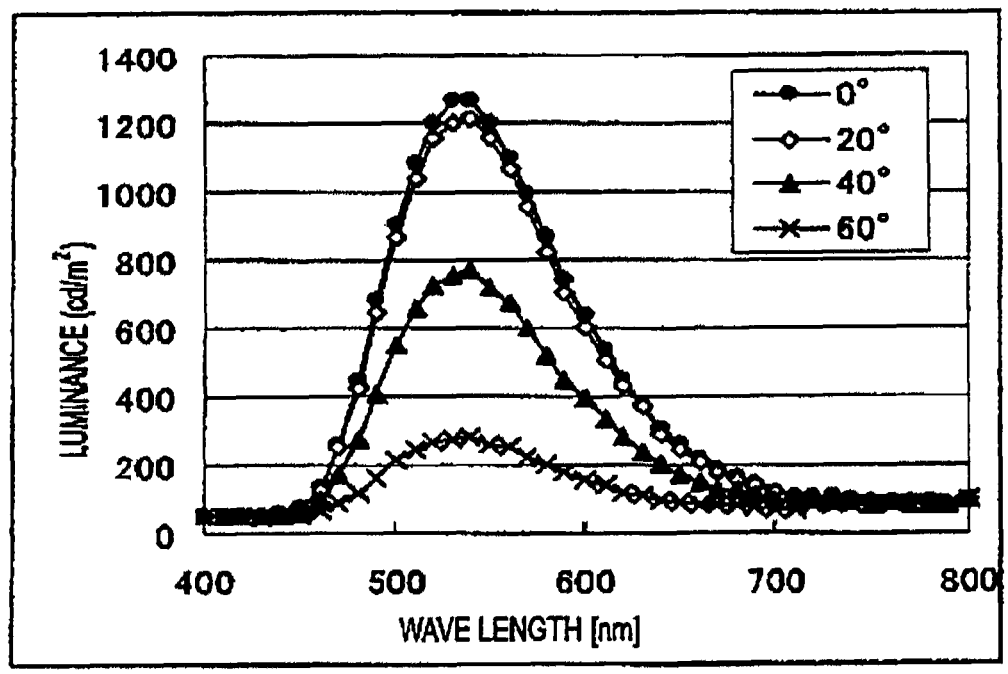
FIG. 52 is a diagram showing spectral data on angular dependences of luminance and color of emission light from one of the organic LED elements in Example 3 of the invention.
Figure 53:
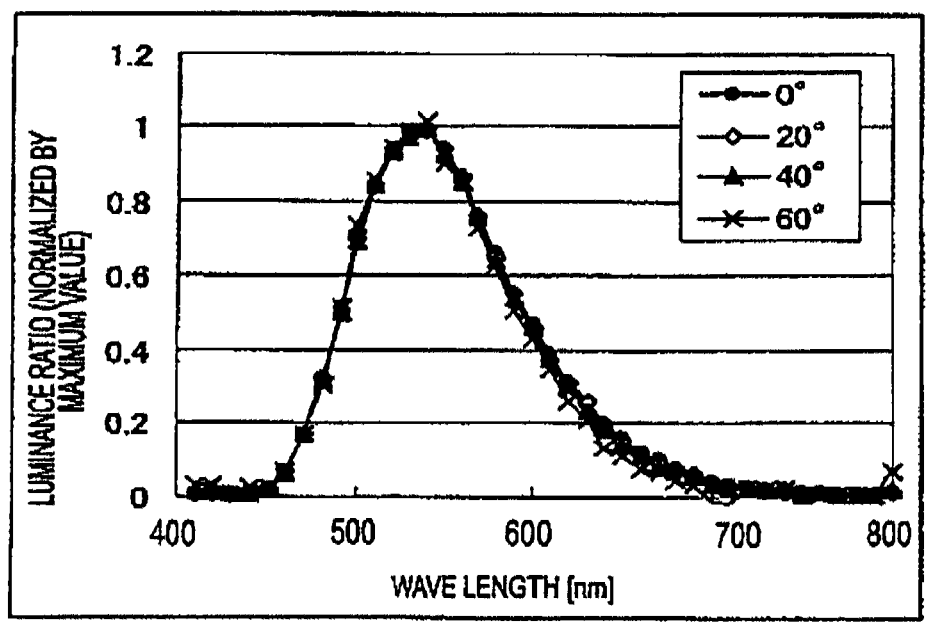
FIG. 53 is another diagram showing spectral data on the angular dependences of luminance and color of emission light from the organic LED element in Example 3 of the invention.
Figure 54:
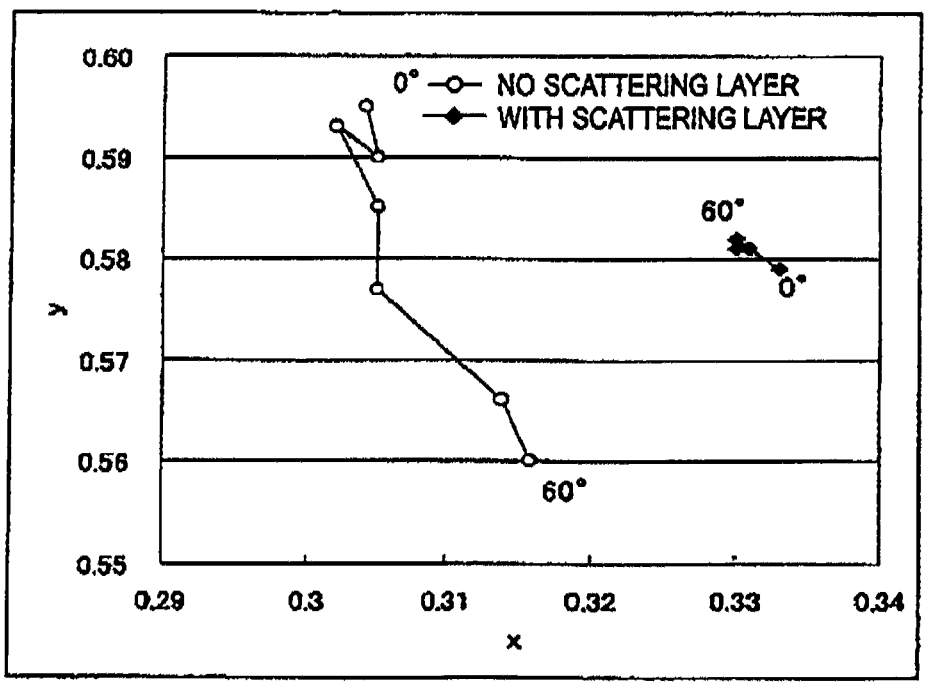
FIG. 54 is a diagram showing the chromatic coordinates of angular dependences of luminance and color of emission light from the organic LED element in Example 3 of the invention.

Further, FIG. 52 shows measurement results of the element with the scattering layer, and FIG. 53 shows the spectral data obtained by further normalizing the measurement results, with the luminance at the wavelength where the maximum luminance is attained at each of the measuring angles being taken as 1. As can be seen from FIG. 53, almost no deviation is caused among the spectra even when the measuring angle is changed. Further, results obtained by converting the spectra to chromaticity coordinates are shown in Table 8 and FIG. 54.

TABLE 8

|  | Without Scattering Layer | | With Scattering Layer | |
| --- | --- | --- | --- | --- |
| Measuring Angle θ | x | y | x | Y |
| 0° (front) | 0.304 | 0.595 | 0.333 | 0.579 |
| 10° | 0.305 | 0.59 | 0.333 | 0.579 |
| 20° | 0.302 | 0.593 | 0.333 | 0.579 |
| 30° | 0.305 | 0.585 | 0.333 | 0.579 |
| 40° | 0.305 | 0.577 | 0.331 | 0.581 |
| 50° | 0.314 | 0.566 | 0.33 | 0.582 |
| 60° | 0.316 | 0.56 | 0.33 | 0.582 |

As can be clearly seen from these data, in contrast to the element without the scattering layer, whose chromaticity varied greatly with measuring angle, the element with the scattering layer underwent a slight variation in chromaticity. Thus it is found that provision of a scattering layer for an element makes it possible not only to achieve the effect of improving light-extraction efficiency, which is a primary object of the invention, but also to produce the effect of lessening angular variations of color. Such a slight angular variation of color becomes a great advantage of light-emitting elements because they are not restricted in viewing angles.

The evaluation experiments described above prove that the simulations in the invention are right.

Of the scattering layers used here, those fired at 570° C. and 580° C. were subjected to cross-section polishing, and SEM photographs of the polished cross sections were taken at 10,000× magnification. From the photographs, the relationship between the number of pores and the distance of pores from the surface of each scattering glass layer was determined. The lateral length of each SEM photograph was 12.5 μm. Lines were drawn on each SEM photograph at intervals of 0.25 μm from the surface of each scattering glass layer, and the number of pores findable in each frame measuring 0.25 μm by 12.5 μm was counted. At the occasion of counting pores present across frame boundaries, they were regarded as to be present in the lower frames. Results obtained are shown in FIG. 55. The X coordinate in this figure indicates the distance from the surface of each scattering glass layer. The number of pores corresponding to a point of, say, 0.5 μm on the X coordinate refers to the number of pores found in the frame whose upper and lower lines are 0.25 μm apart and 0.5 μm apart, respectively, from the surface of each scattering glass layer. And one which X=0 corresponds to is the number of cavities present in the surface of each scattering glass layer as shown in FIG. 7 or FIG. 8. Thus we can ascertain that the number of pores is decreased as the frame for counting become near to the surface from the depth of 0.5 μm in the case where the firing temperature was 570° C. as shown by the curve a, while from the depth of 1.25 μm in the case where the firing temperature was 580° C. as shown by the curve b. And no cavity was found in either of the surfaces in those cases.

Further, it is also evident from FIG. 55 that the density $\rho_3$ of scattering materials at the distance x (x≤0.2 μm) from the surface of each scattering layer made from glass and the density $\rho_4$ of the scattering materials at the distance x=2 μm satisfy $\rho_4 > \rho_3$. Although the observation results in the cases where the firing temperatures were 570° C. and 580° C. are shown in FIG. 55, it was possible to obtain results similar thereto even when the firing temperature was somewhat changed.

Furthermore, it is also evident from FIG. 55 that the density $\rho_3$ of scattering materials at the distance x (x≤50.2 μm) from the surface of each scattering layer made from glass and the density $\rho_5$ of the scattering materials at the distance x=5 μm satisfy $\rho_5 > \rho_3$.

Although the number of pores in the 580° C.-fired product tends to be larger than that in the 570° C.-fired product, causes thereof cannot be determined yet. However, it is possible to think up the following two causes.

(1) The pores in the 580° C.-fired product expand the more since the firing temperature was higher, and therefore the counting thereof becomes easier.

(2) Decomposition of organic residues adhering to glass powder progresses more quickly at 580° C., and thereby pores increase in number.

Next, whether or not crystals have separated out was examined. When crystals have separated out on the surface of a scattering glass layer, they are visually recognized with ease under an optical microscope. This is because the scattering layer surface is extremely smooth when no crystals have separated out, and therefore peculiar spots are conspicuous. The distinction between crystals and foreign substances can be easily determined from the symmetry of their shapes and so on. In addition, crystals having separated out in the interior of the scattering glass layer can also be distinguished with ease from pores and foreign substances by their shapes. Results obtained are shown in Table 9. By choosing appropriate firing conditions, e.g. 570° C. firing, it becomes possible to make crystals separate out only in the interior of the scattering layer and to inhibit crystals from separating out at the surface.

TABLE 9

| Firing Temperature | Interior of Scattering Glass Layer | Surface of Scattering Glass Layer |
|---|---|---|
| 570° C. | Observed | Not observed |
| 580° C. | Observed | Observed |

Additionally, pores and crystals develop through different mechanisms, and therefore it is possible to generate only pores or only crystals by controlling the composition of glass, the particle size of glass powder, the surface condition, the firing conditions (atmosphere, pressure) and so on. For instance, separation of crystals can be controlled by increasing a network former content in glass or by heightening a proportion of alkali oxides capable of inhibiting separation of crystals, while generation of pores can be controlled by performing the firing under reduced pressure.

Example 3

About Waviness

Example 3 of the invention is illustrated below.

Samples for measurements were prepared first by forming scattering layers on PD200 substrates and further thereon forming Al thin film having a thickness of about 80 nm by use of a vapor deposition method. The scattering layers formed were 7 varieties shown in Table 10. The glass compositions A and B, the glass composition C and the glass composition D used for these samples are shown in Table 11, Table 12 and Table 13, respectively.

TABLE 10

| | Glass Material | Firing Temperature | Layer Thickness |
|---|---|---|---|
| 1 | A | 550° C. | 15 μm |
| 2 | | 560° C. | 15 μm |
| 3 | | 570° C. | 15 μm |
| 4 | | 580° C. | 15 μm |
| 5 | B | 550° C. | 60 μm |
| 6 | C | 550° C. | 30 μm |
| 7 | D | 530° C. | 30 μm |

TABLE 11

| | A | B |
|---|---|---|
| $P_2O_5$ | 23.1 | 23.1 |
| $B_2O_3$ | 12 | 5.5 |
| $Li_2O$ | 11.6 | 11.6 |
| $Na_2O$ | 0 | 4 |
| $K_2O$ | 0 | 2.5 |
| $Bi_2O_3$ | 16.6 | 16.6 |
| $TiO_2$ | 8.7 | 8.7 |
| $Nb_2O_5$ | 17.6 | 17.6 |
| $WO_3$ | 10.4 | 10.4 |

Unit: mol %

TABLE 12

| | C |
|---|---|
| $SiO_2$ | 5.1 |
| $B_2O_3$ | 24.24 |
| $Pb_3O_4$ | 52.37 |
| BaO | 7.81 |
| $Al_2O_3$ | 6.06 |
| $TiO_2$ | 2.71 |
| $CeO_2$ | 0.41 |
| $Co_3O_4$ | 0.48 |
| MnO2 | 0.56 |
| CuO | 0.26 |

Unit: wt %

TABLE 13

| | D |
|---|---|
| $P_2O5$ | 15.6 |
| $B_2O_3$ | 3.8 |
| $WO_3$ | 41.8 |
| $Li_2O$ | 13.5 |
| $Na_2O$ | 8.6 |
| $K_2O$ | 2.3 |
| BaO | 14.4 |

Unit: wt %

Thereafter, waviness measurements were performed on these samples. The measuring device used here was SURF- COM (trade name: 1400D-12) made by TOKYO SEIMITSU Co., Ltd. And roughness measurements was carried out under conditions that the measuring length was taken as 5.0 mm, the short-wavelength cut-off value $\lambda s$ as 25.0 µm and the long-wavelength cut-off value $\lambda c$ as 2.5 mm, and the measuring speed was set at 0.15 mm/s. Calculations of the arithmetic average roughness Ra and the arithmetic average wavelength $\lambda a$ from these measurement data on the basis of the JIS2001 standard (the standard translated from ISO97) were performed inside the measuring device. In addition, surface-area calculations were made from the data on waviness, and differences between the cases with surface having waviness and those with flat surfaces were compared. Subsequently thereto, diffuse reflection ratio measurements were performed. In the measuring system used, parallel light was launched into one opening of the integrating sphere, a sample was placed on another opening diametrically opposite to the one opening, and a detector for detecting outgoing light was placed on the other opening. The detector used was a spectrophotometer Lambda 950 made by PerkinElmer Inc.

To begin with, spectral measurements on total internal reflection were conducted in a situation that the other openings were blocked, and reflectivity values were calculated from these measurement data. Reflectivity calculations were made by multiplying the measured spectral data by the spectral distribution of a light source used and a color-matching function $y(\lambda)$. As the light source data, those of the D65 standard light source were used. And the data on a field of view of 2° were used for the color-matching function.

In the next place, spectral measurements were carried out in another situation that the opening of the integrating sphere which was placed at the position from which light regularly reflected by each sample was exiting was opened, and reflectivity in this situation was calculated. Hereafter the reflectivity in this situation is referred to as diffuse reflectivity. On each sample, the diffuse reflection ratio was calculated by dividing the diffuse reflectivity by the total internal reflectivity.

When scattering materials are present in a scattering glass layer, the surface of a metal electrode does not look like a specular surface. However, if the scattering ability is made low, cases may occur wherein the metal electrode surface looks like a specular surface and presents an undesirable appearance. This time the Al film was formed on each scattering layer and observed from the Al electrode side, and therefore the appearance of the metal electrode can be evaluated without affected by the influence of each scattering layer. From the measurement results, it was ascertained that the diffuse reflection ratios were increased by waviness. In all the case, seeming specular properties were controlled.

The diffuse reflection ratio in the case of forming the Al film directly on the glass substrate was 40% and a little greater than that of 38% in the case of using the material C. However, to the eye, the specular visibility in the case where the scattering layer was formed with the material C was apparently reduced to a greater extent Additionally, in the case of the material C ($Ra/R\lambda a=0.0234 \times 10^{-2}$), the outline of an object reflected in the Al film appeared blurred, and the specular property was controlled. But the diffuse reflection ratios greater than or equal to that in the case of using the material A and firing at 580° C. ($Ra/R\lambda a=0.556 \times 10^{-2}$) are preferable. In such cases, the outline of an object reflected in the Al film is not visually recognized at all.

Example 4

Total Transmittance (Haze Value) of Scattering Layer

Results of total transmittance measurements made on scattering layers are illustrated below.

Figure 56:
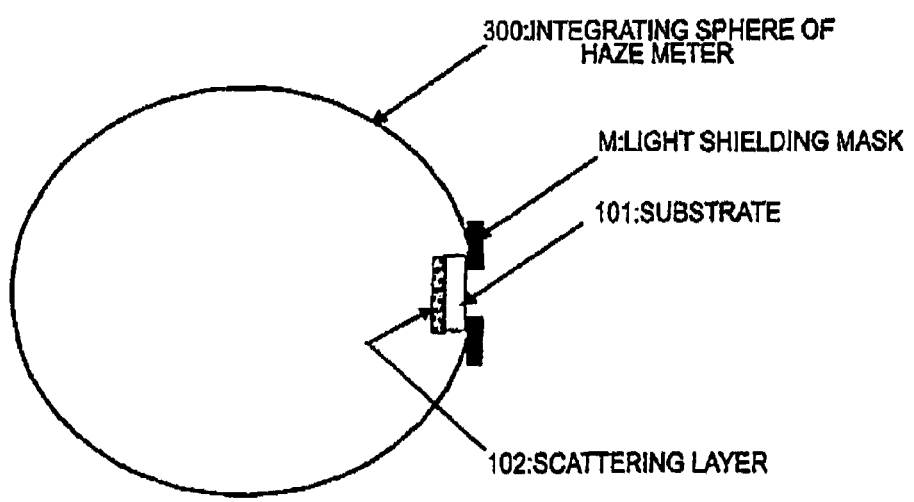
FIG. 56 is a diagram illustrating a method for measuring the transmittance of each scattering layer in Example 4 of the invention.
Figure 57:
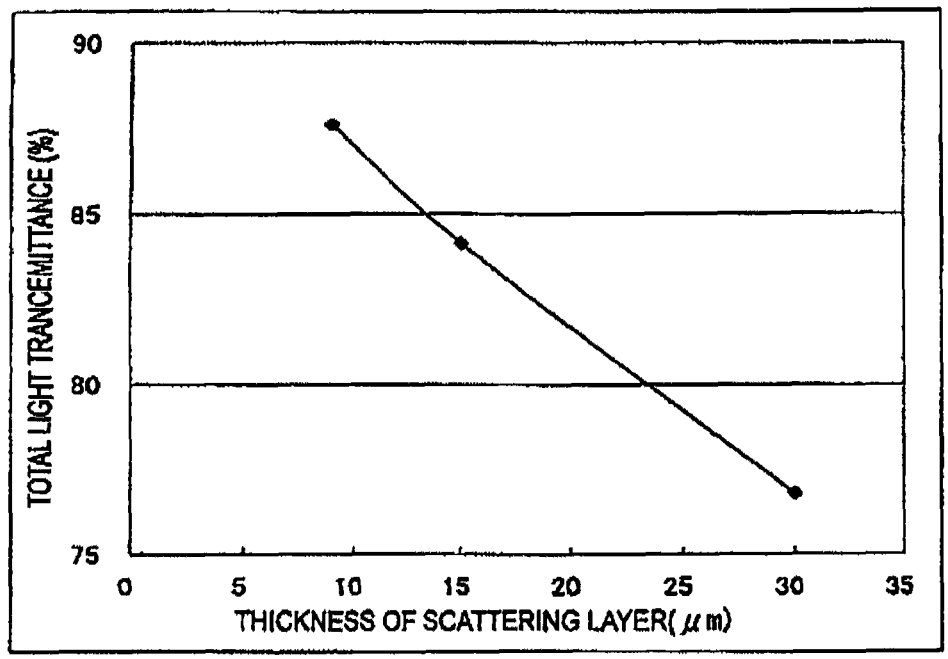
FIG. 57 is a diagram showing the result of determining the relationship between total light transmittance to thickness of each scattering layer in Example 4 of the invention.
Figure 58:
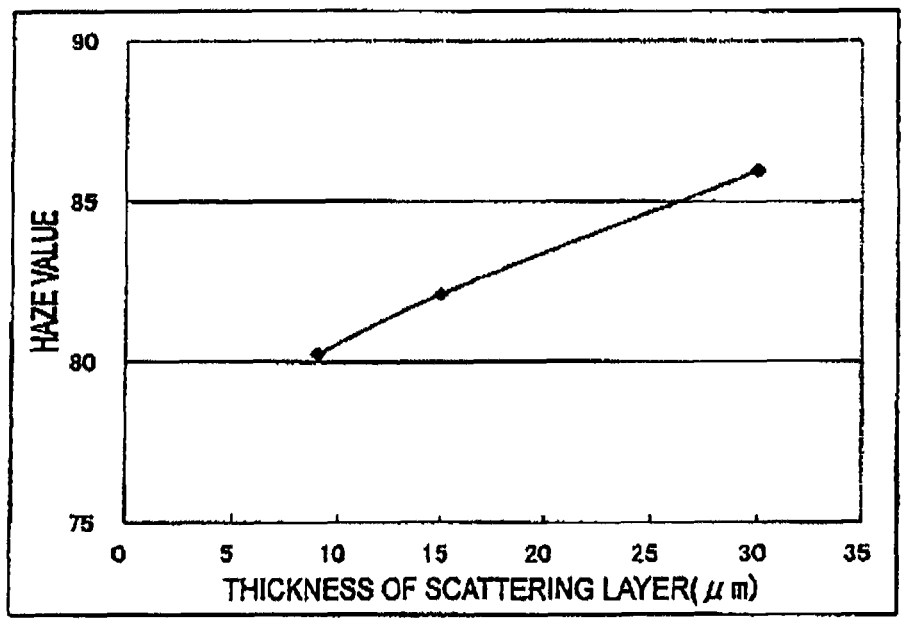
FIG. 58 is a diagram showing a relationship of Haze value to thickness of each scattering layer in Example 4 of the invention.

By the use of glass having the composition shown in Table 1, scattering layers different in thickness were formed on glass substrates, respectively. These scattering layers were 9 µm, 15 µm and 30 µm in thickness, respectively. On each of the scattering layers, the organic LED element was fabricated in the same manner as described above, and thereon evaluations were made. Further, the light-extraction efficiency ratios of these elements with respect to the case without scattering layer were also evaluated. Total transmission and Haze value measurements using the foregoing haze meter were carried out as follows. As shown in FIG. 56, the measurements were carried out setting each sample inside the integrating sphere 300 and applying waveguide technique to the glass substrate 101 in order to avoid the loss of light progressing in a lateral direction. The relationship of total light transmittance to thickness of the scattering layer 102 is shown in FIG. 57, and the relationship of Haze value to thickness of the scattering layer 102 is shown in FIG. 58.

Figure 59:
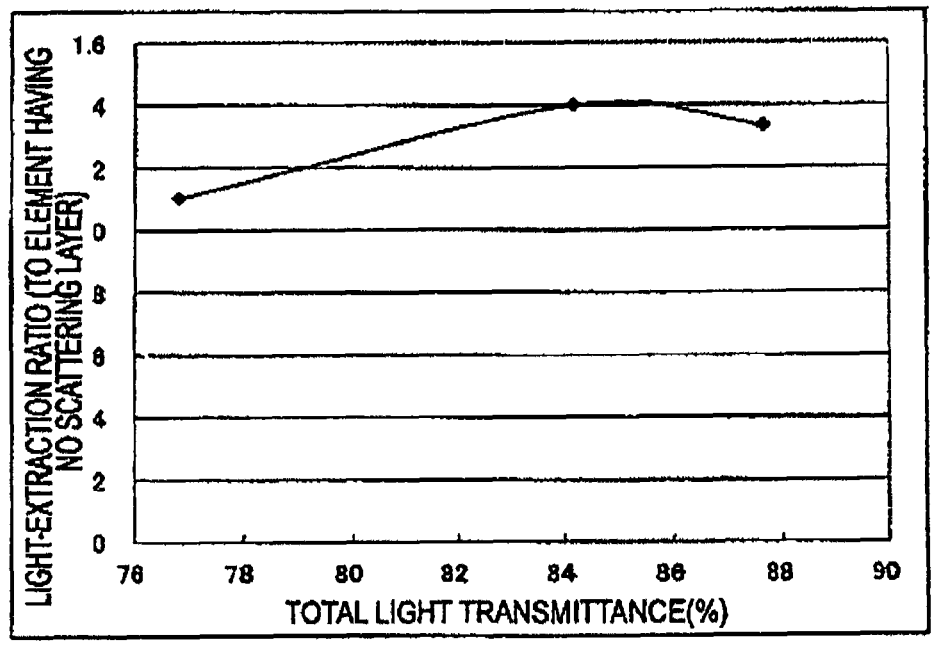
FIG. 59 is a diagram showing the relationship between total light transmittance in Example 4 of the invention and ratio of light-extraction efficiency in Example 4 of the invention to that in the case of forming no scattering layer (light-extraction magnification).
Figure 60:
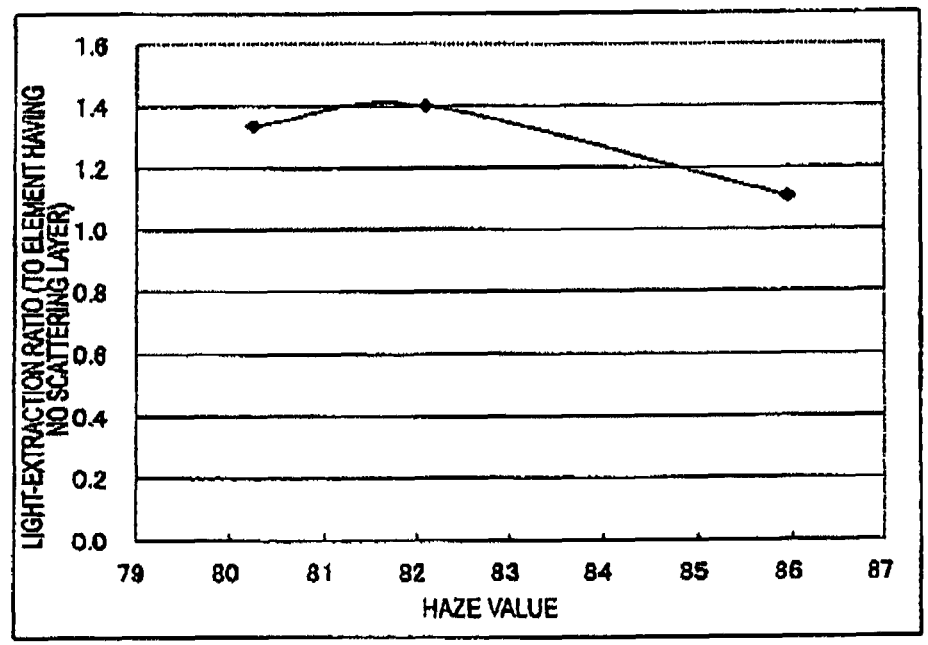
FIG. 60 is a diagram showing the relationship between Haze value in Example 4 of the invention and ratio of light-extraction efficiency in Example 4 of the invention to that in the case of forming no scattering layer (light-extraction magnification).

From the figures, it is ascertained that as the thickness of the scattering layer 102 is increased, the total light transmittance decreases and the Haze value increases. Then, the relationship between the total light transmittance and the light-extraction efficiency ratio (light-extraction magnification) with respect to the case without the scattering layer 102 is shown in FIG. 59, and the relationship between the Haze value and the light-extraction efficiency ratio (light-extraction magnification) with respect to the case without the scattering layer is shown in FIG. 60.

Since a glass material has some measure of absorption, the length of an optical path passing though a scattering layer becomes long when the degree of scattering becomes high, and thereby the light-extraction magnification is lowered. On the contrary, when the degree of scattering is low, the direction of light cannot be changed; as a result, total internal reflection cannot be reduced to result in lowering of the extraction efficiency. Therefore there are the suitable total light transmittance and Haze value for maximization of the light-extraction efficiency.

From the experimental results described above, it is preferable that the total light transmittance is 75% or higher. And the translucent substrate preferably has its Haze value in a range of 80 to 87.

In the foregoing embodiments, organic LED elements are illustrated, and thereto both a top emission structure and a bottom emission structure are effectively applied. However, their structures are not always limited to these structures. Other examples of layers stackable on the present translucent electrode include not only an inorganic LED element and a solar cell, but also various kinds of layers having photoelectric conversion functions such as a light-emitting layer, a light-detecting layer and an electric power-generating layer. Thus the present substrate provided with a translucent electrode can be used for optical devices including a light-emitting device, a light-detecting device and an electric power-generating device. In addition, applications to electronic devices, such as DRAM, or electronic-optical complex devices are also effective.

The invention has been illustrated in detail and with reference to specific embodiments thereof, but it will be apparent to one skilled in the art that various changes and modifications can be made without departing from the spirit and scope of the invention.

The present application is based on Japanese Patent Application No. 2009-014794 filed on Jan. 26, 2009, and the description thereof is incorporated herein by reference, as it fully set forth herein.

As illustrated above, the present substrate for an electronic device allows not only control in visibility of a reflective electrode by having waviness, but also enhancement of light-extraction efficiency or light-admission efficiency by being provided with a stable scattering layer having good light-scattering ability and high reliability, and therefore the present substrate can be applied to electronic devices in general, including light-emitting devices and light-receiving devices.

DESCRIPTION OF THE REFERENCE NUMERALS AND SIGNS

100 Electrode-attached translucent substrate (substrate for electronic devices)
101 Glass substrate
102 Scattering layer
103 Translucent electrode
104 Scattering material
110 Organic layer
120 Reflective electrode

The invention claimed is:

1. A substrate for an electronic device, comprising:
a translucent glass substrate having a first main surface and a second main surface, the first and second main surfaces facing each other, the translucent glass substrate comprising a glass layer formed on the first main surface of the translucent glass substrate; and
an electrode pattern formed on the first main surface of the translucent glass substrate,
wherein the first main surface is a surface which forms waviness made up of curved faces,
the waviness of the surface has a wavelength R$\lambda$a of greater than 50 μm,
a ratio Ra/R$\lambda$a of waviness roughness Ra of the surface which forms a waviness to the wavelength R$\lambda$a of the waviness is from $1.0 \times 10^{-4}$ to $3.0 \times 10^{-2}$,
the glass layer having a second surface abutting on a side of the first main surface of the translucent glass substrate and a first surface, opposite to the second surface, which forms waviness made up of curved faces,
the translucent glass substrate further comprising a scattering layer formed on the first main surface of the translucent glass substrate and made from a glass comprising a base material which has a first refractive index for at least one of wavelengths of transmitted light and a plurality of scattering materials being dispersed in the base material and having a second refractive index different from the first refractive index of the base material, and
distribution of the scattering materials in the scattering layer diminishes from the inside of the scattering layer toward a translucent electrode formed as a first electrode on the first surface, wherein a density $\rho_3$ of the scattering materials at a distance x (x≤0.2 μm) from a surface of the scattering layer on a translucent electrode side and a density $\rho_4$ of the scattering materials at a distance x of 2 μm satisfy $\rho_4 > \rho_3$.

2. The substrate for an electronic device according to claim 1, wherein an organic LED element is formed on the first main surface.

3. The substrate for an electronic device according to claim 1, wherein the second main surface is flatter than the first main surface.

4. The substrate for an electronic device according to claim 1, wherein the surface which forms waviness has a surface roughness Ra of 30 nm or below.

5. An electronic device comprising a translucent glass substrate;
the translucent glass substrate having a first main surface and a second main surface, the first and second main surfaces facing each other, and the translucent glass substrate comprising a glass layer formed on the first main surface of the translucent glass substrate; and
an electrode pattern formed on the first main surface of the translucent glass substrate,
wherein the first main surface is a surface which forms waviness made up of curved faces,
the waviness of the surface has a wavelength R$\lambda$a of greater than 50 μm,
a ratio Ra/R$\lambda$a of waviness roughness Ra of the surface which forms a waviness to the wavelength R$\lambda$a of the waviness is from $1.0 \times 10^{-4}$ to $3.0 \times 10^{-2}$,
the glass layer having a second surface abutting on a side of the first main surface of the translucent glass substrate and a first surface, opposite to the second surface, which forms waviness made up of curved faces,
the electronic device further comprising a scattering layer formed on the first main surface of the translucent glass substrate and made from a glass comprising a base material which has a first refractive index for at least one of wavelengths of transmitted light and a plurality of scattering materials being dispersed in the base material and having a second refractive index different from the first refractive index of the base material, and
distribution of the scattering materials in the scattering layer diminishes from the inside of the scattering layer toward a translucent electrode formed as a first electrode on the first surface, wherein a density $\rho_3$ of the scattering materials at a distance x (x≤00.2 μm) from a surface of the scattering layer on a translucent electrode side and a density $\rho_4$ of the scattering materials at a distance x of 2 μm satisfy $\rho_4 > \rho_3$.

* * * * *